(12) United States Patent  
Matsumura

(10) Patent No.: US 11,708,479 B2
(45) Date of Patent: Jul. 25, 2023

(54) RESIN COMPOSITION, FILM, NEAR INFRARED CUT FILTER, INFRARED TRANSMITTING FILTER, SOLID IMAGE PICKUP ELEMENT, IMAGE DISPLAY DEVICE, INFRARED SENSOR, AND CAMERA MODULE

(71) Applicant: FUJIFILM Corporation, Tokyo (JP)

(72) Inventor: Tokihiko Matsumura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 736 days.

(21) Appl. No.: 16/732,621

(22) Filed: Jan. 2, 2020

(65) Prior Publication Data

US 2020/0131337 A1    Apr. 30, 2020

Related U.S. Application Data

(63) Continuation of application No. PCT/JP2018/030343, filed on Aug. 15, 2018.

(30) Foreign Application Priority Data

Aug. 31, 2017  (JP) .................. 2017-167382

(51) Int. Cl.
*C08K 5/3417* (2006.01)
*C08K 5/00* (2006.01)
(Continued)

(52) U.S. Cl.
CPC .......... *C08K 5/3417* (2013.01); *C08K 5/005* (2013.01); *C08K 5/0041* (2013.01); *C08K 5/11* (2013.01);
(Continued)

(58) Field of Classification Search
CPC ...... G02B 5/22; C08K 5/3417; C08K 5/0041; C08K 5/005; C08K 5/11; C08L 101/02; C08L 101/00
See application file for complete search history.

(56) References Cited

U.S. PATENT DOCUMENTS

| 6,388,116 B1* | 5/2002 | Hasegawa ............... C03C 17/28 |
| | | 556/24 |
| 2003/0087172 A1* | 5/2003 | Zhu .................... G03G 5/14769 |
| | | 430/119.6 |

(Continued)

FOREIGN PATENT DOCUMENTS

| JP | 60-169453 A | 9/1985 |
| JP | 2012-8532 A | 1/2012 |

(Continued)

OTHER PUBLICATIONS

English language translation of JP 60-169453A, pp. 1-8, Aug. 8, 2022.*

(Continued)

*Primary Examiner* — Alexander C Kollias
(74) *Attorney, Agent, or Firm* — Birch, Stewart, Kolasch & Birch, LLP

(57) ABSTRACT

A resin composition includes: a compound represented by Formula (1); and a resin, in the formula, A and B each independently represent an aromatic hydrocarbon ring or an aromatic heterocycle, Ra and Rb each independently represent a substituent, m1 represents an integer of 0 to mA, m2 represents an integer of 0 to mB, $Y^1$ and $Y^2$ each independently represent an alkyl group, an aryl group, a group represented by Formula (Y-1), or a group represented by Formula (Y-2), and at least one of $Y^1$ or $Y^2$ represents a group represented by Formula (Y-1) or a group represented by Formula (Y-2).

(Continued)

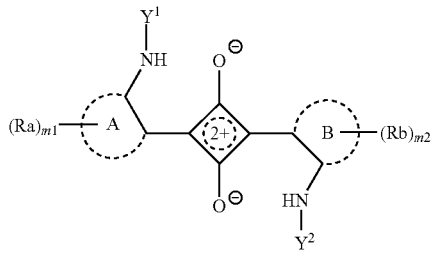

19 Claims, 1 Drawing Sheet

(51) Int. Cl.
  C08K 5/11      (2006.01)
  G02B 5/20      (2006.01)
  H01L 27/146    (2006.01)
  H01L 31/0216   (2014.01)
  G03B 11/00     (2021.01)
  H04N 5/33      (2023.01)
  G03B 19/00     (2021.01)
  G02B 5/22      (2006.01)
  C08L 101/00    (2006.01)
  C08L 101/02    (2006.01)
  H10K 59/38     (2023.01)

(52) U.S. Cl.
  CPC ........... *C08L 101/00* (2013.01); *C08L 101/02* (2013.01); *G02B 5/208* (2013.01); *G02B 5/22* (2013.01); *G03B 11/00* (2013.01); *G03B 19/00* (2013.01); *H01L 27/1462* (2013.01); *H01L 31/02162* (2013.01); *H04N 5/33* (2013.01); *H10K 59/38* (2023.02)

(56) References Cited

U.S. PATENT DOCUMENTS

| | | |
|---|---|---|
| 2015/0146057 A1 | 5/2015 | Konishi et al. |
| 2018/0118865 A1 | 5/2018 | Arayama et al. |
| 2018/0120485 A1 | 5/2018 | Oota et al. |

FOREIGN PATENT DOCUMENTS

| | | |
|---|---|---|
| JP | 2014-59550 A | 4/2014 |
| JP | 2015-176046 A | 10/2015 |
| TW | 201641610 A | 12/2016 |
| WO | WO 2014/030628 A1 | 2/2014 |
| WO | WO 2016/186050 A1 | 11/2016 |
| WO | WO 2016/194527 A1 | 12/2016 |

OTHER PUBLICATIONS

Taiwanese Office Action and Search Report for Taiwanese Application No. 107129368, dated Dec. 13, 2021, with an English translation.

International Preliminary Report on Patentability, dated Mar. 12, 2020 and Written Opinion of the International Searching Authority, dated Oct. 30, 2018 (forms PCT/IB/373, PCT/ISA/237 and PCT/IB/326), for International Application No. PCT/JP2018/030343, with a Written Opinion translation.

International Search Report (form PCT/ISA/210), dated Oct. 30, 2018, for International Application No. PCT/JP2018/030343, with an English translation.

Japanese Office Action for Japanese Application No. 2019-539342, dated Feb. 9, 2021, with English translation.

\* cited by examiner

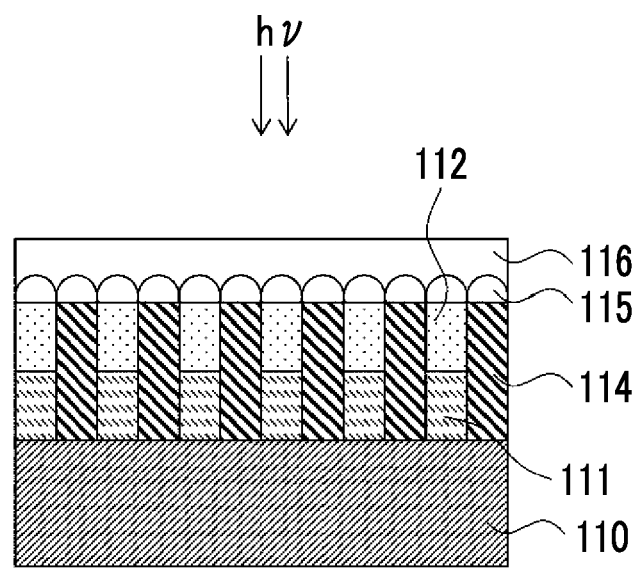

RESIN COMPOSITION, FILM, NEAR INFRARED CUT FILTER, INFRARED TRANSMITTING FILTER, SOLID IMAGE PICKUP ELEMENT, IMAGE DISPLAY DEVICE, INFRARED SENSOR, AND CAMERA MODULE

CROSS-REFERENCE TO RELATED APPLICATIONS

This application is a Continuation of PCT International Application No. PCT/JP2018/030343 filed on Aug. 15, 2018, which claims priority under 35 U.S.C § 119(a) to Japanese Patent Application No. 2017-167382 filed on Aug. 31, 2017. Each of the above application(s) is hereby expressly incorporated by reference, in its entirety, into the present application.

BACKGROUND OF THE INVENTION

1. Field of the Invention

The present invention relates to a resin composition, a film, a near infrared cut filter, an infrared transmitting filter, a solid image pickup element, an image display device, an infrared sensor, and a camera module.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, it is necessary to correct visibility, and a near infrared cut filter is used in many cases.

As a near infrared absorber used for a near infrared cut filter, for example, a squarylium compound is known. For example, JP2012-008532A, JP2014-059550A, and WO2014/030628A describe that a near infrared cut filter or the like is manufactured using a resin composition including a specific squarylium compound.

SUMMARY OF THE INVENTION

A compound used as a near infrared absorber is desired to have excellent near infrared shielding properties. In addition, according to an investigation by the present inventors, it was found that, in the resin composition including the squarylium compound described in JP2012-008532A, JP2014-059550A, and WO2014/030628A, light fastness of the obtained film and adhesiveness thereof with a support are poor.

Accordingly, an object of the present invention is to provide a resin composition with which a film having excellent near infrared shielding properties, light fastness, and adhesiveness can be formed. In addition, another object of the present invention is to provide a film, a near infrared cut filter, an infrared transmitting filter, a solid image pickup element, an image display device, an infrared sensor, and a camera module.

As a result of various investigations, the present inventors found that the objects can be achieved by using a resin composition including a compound represented by Formula (1) described below, thereby completing the present invention. The present invention provides the following.

<1> A resin composition comprising:
a compound represented by Formula (1); and
a resin,

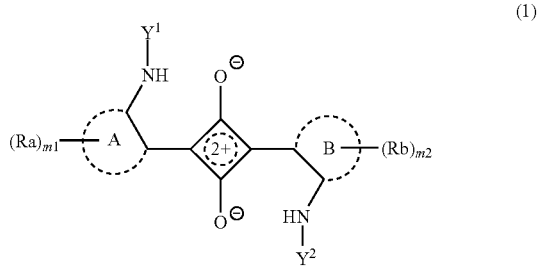

in Formula (1), A and B each independently represent an aromatic hydrocarbon ring or an aromatic heterocycle,
Ra and Rb each independently represent a substituent, m1 represents an integer of 0 to mA, mA represents an integer representing a maximum number of Ra's which may be substituted in A, m2 represents an integer of 0 to mB, and mB represents an integer representing a maximum number of Rb's which may be substituted in B,
Ra and A may be bonded to each other to form a ring, Rb and B may be bonded to each other to form a ring, in a case where m1 represents 2 or more, two Ra's among m1 Ra's may be bonded to each other to form a ring, and in a case where m2 represents 2 or more, two Rb's among m2 Rb's may be bonded to each other to form a ring,
$Y^1$ and $Y^2$ each independently represent an alkyl group, an aryl group, a group represented by Formula (Y-1), or a group represented by Formula (Y-2), and at least one of $Y^1$ or $Y^2$ represents a group represented by Formula (Y-1) or a group represented by Formula (Y-2), $$-X^1-L^1-Z^1-R^1 \qquad \text{Formula (Y-1),}$$

in Formula (Y-1), $X^1$ represents —CO—, —CS—, —SO$_2$—, —CONH—, —CSNH—, or —COO—,
$L^1$ represents an alkylene group or an arylene group,
$Z^1$ represents —CONR$^{Z1}$—, —CSNR$^{Z1}$—, —OCONR$^{Z1}$—, —NR$^{Z1}$CONR$^{Z2}$—, —NR$^{Z1}$CSNR$^{Z2}$—, —OCOO—, or, —NR$^{Z1}$SO$_2$—,
$R^{Z1}$ and $R^{Z2}$ each independently represent a hydrogen atom, an alkyl group, or an aryl group,
$R^1$ represents an alkyl group or an aryl group, $$-X^{11}-L^{11}-X^{12}-L^{12}-Z^{11} \qquad \text{Formula (Y-2),}$$

in Formula (Y-2), $X^{11}$ represents —CO—, —CS—, —SO$_2$—, —CONH—, —CSNH—, or —COO—,
$L^{11}$ represents a single bond, an alkylene group, or an arylene group,
$X^{12}$ represents a single bond, —CONR$^{X1}$—, —CSNR$^{X1}$—, —OCONR$^{X1}$—, —NR$^{X1}$CONR$^{X2}$—, —NR$^{X1}$CSNR$^{X2}$—, —OCOO—, —O—, —CO—, —COO—, —SO$_2$—, or —SO—,
$R^{X1}$ and $R^{X2}$ each independently represent a hydrogen atom, an alkyl group, or an aryl group,
$L^{12}$ represents a single bond, an alkylene group, or an arylene group,
$Z^{11}$ represents a group represented by any one of Formulae (Z-1) to (Z-6), and
in a case where $Z^{11}$ represents a group represented by Formula (Z-1) or a group represented by Formula (Z-4), $L^{11}$ represents an alkylene group or an arylene group,

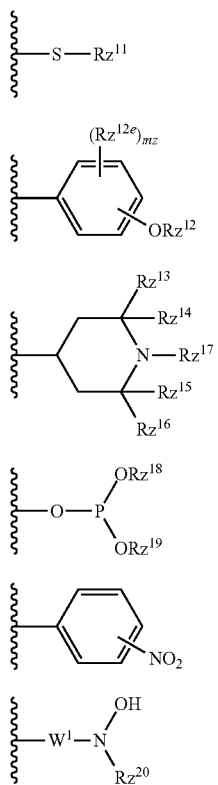

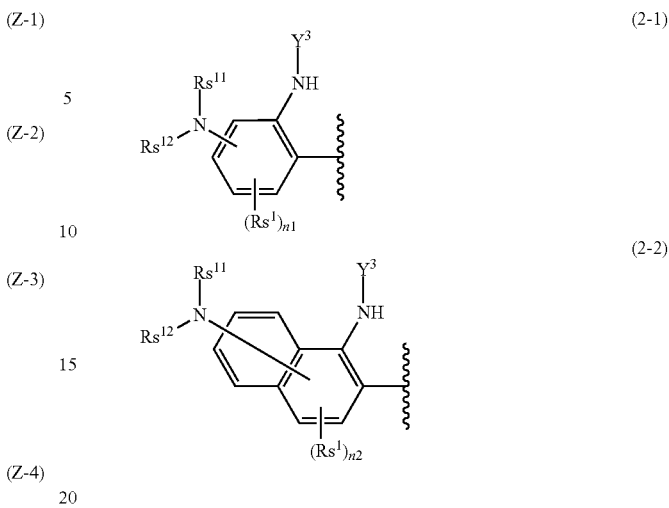

in Formulae (Z-1) to (Z-6), a wave line represents a binding site in Formula (Y-2), in Formula (Z-1), $Rz^{11}$ represents an alkyl group or an aryl group, in Formula (Z-2), $Rz^{12}$ represents a hydrogen atom, —$COR^{100}$, or —$COOR^{100}$, $R^{100}$ represents a hydrogen atom, an alkyl group, or an aryl group, $Rz^{12a}$ represents an alkyl group, and mz represents an integer of 0 to 4, in Formula (Z-3), $Rz^{13}$ to $R^{16}$ each independently represent an alkyl group and $Rz^{17}$ represents a hydrogen atom, an alkyl group, or an oxygen radical, in Formula (Z-4), $Rz^{18}$ and $Rz^{19}$ each independently represent an alkyl group or an aryl group, and in Formula (Z-6), $W^1$ represents a single bond or —CO—, $Rz^{20}$ represents a hydrogen atom, an alkyl group, an aryl group, or —$COR^{101}$, and $R^{101}$ represents an alkyl group or an aryl group.

<2> The resin composition according to <1>, in which in Formula (1), at least one of A or B represents a benzene ring, a thiophene ring, a furan ring, a pyrrole ring, a pyridine ring, an azulene ring, or a fused ring including a benzene ring, a thiophene ring, a furan ring, a pyrrole ring, a pyridine ring, or an azulene ring.

<3> The resin composition according to <1>, in which in Formula (1), at least one of A or B represents a benzene ring or a naphthalene ring.

<4> The resin composition according to any one of <1> to <3>, in which the compound represented by Formula (1) has a structure represented by the following Formula (2-1) or Formula (2-2), in Formula (2-1) and Formula (2-2), a wave line represents a binding site to a squaric acid site in Formula (1), $Y^3$ represents the group represented by Formula (Y-1) or the group represented by Formula (Y-2), $Rs^1$ represents a substituent, n1 represents an integer of 0 to 3 and n2 represents an integer of 0 to 5, $Rs^{11}$ and $Rs^{12}$ each independently represent an alkyl group, an aryl group, or a heteroaryl group, and $Rs^{11}$ and $Rs^{12}$, $Rs^{11}$ and $Rs^1$, and $Rs^{12}$ and $Rs^1$ may be bonded to each other to form a ring.

<5> The resin composition according to any one of <1> to <3>, in which the compound represented by Formula (1) has a structure represented by the following Formula (2-1a), Formula (2-1b), Formula (2-1c), or Formula (2-1d),

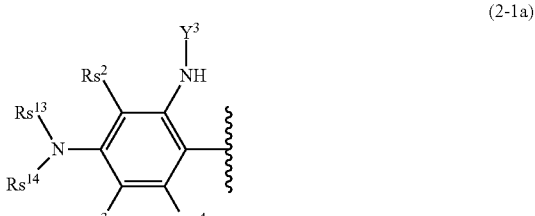

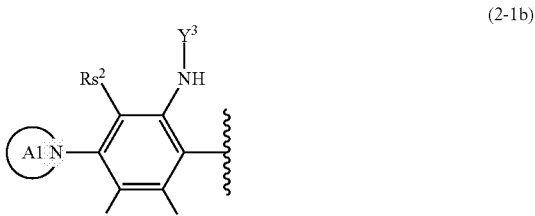

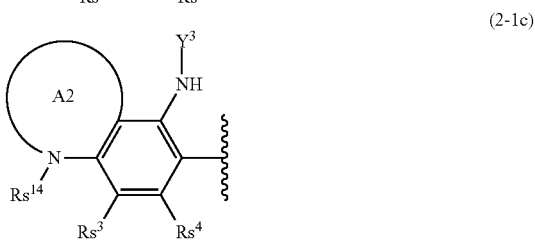

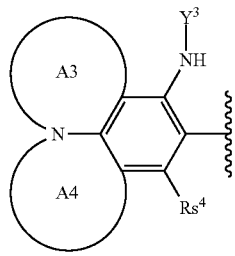

(2-1d)

in Formula (2-1a), Formula (2-1b), Formula (2-1c), and Formula (2-1d), a wave line represents a binding site to a squaric acid site in Formula (1), $Y^3$ represents the group represented by Formula (Y-1) or the group represented by Formula (Y-2), $Rs^2$ to $Rs^4$ each independently represent a hydrogen atom or a substituent, $Rs^{13}$ and $Rs^{14}$ each independently represent an alkyl group, an aryl group, or a heteroaryl group, and A1 to A4 each independently represent a ring including a nitrogen atom.

<6> The resin composition according to any one of <1> to <5>, in which the compound represented by Formula (1) is a compound represented by the following Formula (1a),

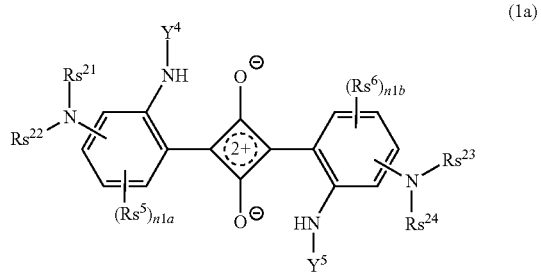

(1a)

in Formula (1a), $Y^4$ and $Y^5$ each independently represent an alkyl group, an aryl group, the group represented by Formula (Y-1), or the group represented by Formula (Y-2), and at least one of $Y^4$ or $Y^5$ represents the group represented by Formula (Y-1) or the group represented by Formula (Y-2), $Rs^5$ and $Rs^6$ each independently represent a substituent, n1a and n1b each independently represent an integer of 0 to 3, $Rs^{21}$ to $Rs^{24}$ each independently represent an alkyl group, an aryl group, or a heteroaryl group, and $Rs^{21}$ and $Rs^{22}$, $Rs^{23}$ and $Rs^{24}$, $Rs^{21}$ and $Rs^5$, $Rs^{22}$ and $Rs^5$, $Rs^{23}$ and $Rs^6$, and $Rs^{24}$ and $Rs^6$ may be bonded to each other to form a ring.

<7> The resin composition according to any one of <1> to <6>, further comprising:
a crosslinking compound.

<8> The resin composition according to claim 7, further comprising:
a photopolymerization initiator,
in which the crosslinking compound is a polymerizable compound.

<9> The resin composition according to any one of <1> to <8>,
in which the resin includes a resin having an acid group.

<10> The resin composition according to any one of <1> to <9>, further comprising:
a near infrared absorbing colorant other than the compound represented by Formula (1).

<11> A film which is formed of the resin composition according to any one of <1> to <10>.

<12> A near infrared cut filter comprising:
the film according to <11>.

<13> An infrared transmitting filter comprising:
the film according to <11>.

<14> A solid image pickup element comprising:
the film according to <11>.

<15> An image display device comprising:
the film according to <11>.

<16> An infrared sensor comprising:
the film according to <11>.

<17> A camera module comprising:
a solid image pickup element; and
the near infrared cut filter according to <12>.

According to the present invention, it is possible to provide a resin composition with which a film having excellent near infrared shielding properties, light fastness, and adhesiveness can be formed. In addition, it is also possible to provide a film having the above-described characteristics, a near infrared cut filter, an infrared transmitting filter, a solid image pickup element, an image display device, an infrared sensor, and a camera module.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC).

In this specification, the weight-average molecular weight (Mw) and the number-average molecular weight (Mn) can be obtained, for example, by using HLC-8220GPC (manufactured by Tosoh Corporation), using a column in which TOSOH TSK gel Super HZM-H, TOSOH TSK gel Super HZ4000, and TOSOH TSK gel Super HZ2000 are linked to each other, and using tetrahydrofuran as a developing solvent.

In this specification, in a chemical formula, Me represents a methyl group, Et represents an ethyl group, Bu represents a butyl group, and Ph represents a phenyl group.

In this specification, "near infrared light" denotes light (electromagnetic wave) having a wavelength in a range of 700 to 2500 nm.

In this specification, "total solid content" denotes the total mass of all the components of the composition excluding a solvent.

In this specification, the term "step" denotes not only an individual step but also a step which is not clearly distinguishable from another step as long as an effect expected from the step can be achieved.

<Resin Composition>

A resin composition according to an embodiment of the present invention comprises: a compound represented by Formula (1); and a resin.

In the compound represented by Formula (1) described below (hereinafter, also referred to as "squarylium compound (1)"), a group represented by —NH—$Y^1$ and a group represented by —NH—$Y^2$ are each independently provided at an ortho position of an aromatic hydrocarbon ring or an aromatic heterocycle represented by A and B. By using the squarylium compound (1) having the above-described structure, a film having excellent near infrared shielding properties, light fastness, and adhesiveness can be formed. The reason why this effect is obtained is presumed to be as follows.

That is, in the squarylium compound (1), a group represented by —NH—$Y^1$ and a group represented by —NH—$Y^2$ are each independently provided at an ortho position of an aromatic hydrocarbon ring or an aromatic heterocycle represented by A and B. The "—NH—" site in the group represented by —NH—$Y^1$ and the group represented by —NH—$Y^2$ improves donating properties of an aromatic hydrocarbon ring or an aromatic heterocycle such that the absorption maximum of the squarylium compound (1) can be shifted to a longer wavelength side. As a result, a film having excellent near infrared shielding properties can be formed.

In the squarylium compound (1), at least one of $Y^1$ or $Y^2$ represents a group represented by Formula (Y-1) or a group represented by Formula (Y-2) such that light fastness of the obtained film and adhesiveness thereof with as support can be improved.

In a case where at least one of $Y^1$ or $Y^2$ represents a group represented by Formula (Y-1), it is presumed that the "$Z^1$" site in Formula (Y-1) interacts with an OH group or the like of a support surface. As a result, it is presumed that the adhesiveness of the obtained film can be improved. In addition, it is presumed that the "$Z^1$" sites in Formula (Y-1) interact with each other between molecules of the squarylium compound (1) such that the squarylium compounds (1) in the film interact with each other. As a result, the light fastness of the obtained film can be improved.

In addition, it is presumed that, in a case where at least one of $Y^1$ or $Y^2$ represents a group represented by Formula (Y-2), the site "$Z^{11}$" in Formula (Y-2) interacts with a metal component or the like of a support surface. As a result, adhesiveness of the obtained film can be improved. In addition, it is presumed that, in a case where the "$Z^{11}$" site represents a group represented by Formula (Z-2), a group represented by Formula (Z-3), a group represented by Formula (Z-5), or a group represented by Formula (Z-6), a radical generated in the film by light irradiation can be trapped at the "$Z^{11}$" site in Formula (Y-2). As a result, the light fastness of the obtained film can be improved. In addition, it is presumed that, in a case where the "$Z^{11}$" site represents a group represented by Formula (Z-1) or a group represented by Formula (Z-4), a peroxide produced in the film by light irradiation can be decomposed at the "$Z^{11}$" site in Formula (Y-2). As a result, the light fastness of the obtained film can be improved.

Hereinafter, each component of the resin composition according to the embodiment of the present invention will be described.

<<Compound Represented by Formula (1) (Squarylium Compound (1))>>

The resin composition according to the embodiment of the present invention includes the compound represented by Formula (1) (squarylium compound (1)). The squarylium compound (1) has an absorption maximum preferably in a wavelength range of 600 to 1200 nm and more preferably in a wavelength range of 700 to 1000 nm. By adjusting the absorption maximum to be in the above-described range, a film having excellent near infrared shielding properties and visible transparency is likely to be formed. The squarylium compound (1) may be a pigment or a dye.

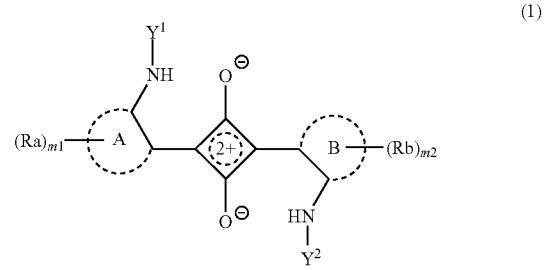

(1)

In the formula, A and B each independently represent an aromatic hydrocarbon ring or an aromatic heterocycle.

Ra and Rb each independently represent a substituent, m1 represents an integer of 0 to mA, mA represents an integer representing a maximum number of Ra's which may be substituted in A, m2 represents an integer of 0 to mB, and mB represents an integer representing a maximum number of Rb's which may be substituted in B.

Ra and A may be bonded to each other to form a ring, Rb and B may be bonded to each other to form a ring, in a case where m1 represents 2 or more, two Ra's among m1 Ra's may be bonded to each other to form a ring, and in a case where m2 represents 2 or more, two Rb's among m2 Rb's may be bonded to each other to form a ring.

$Y^1$ and $Y^2$ each independently represent an alkyl group, an aryl group, a group represented by Formula (Y-1), or a group represented by Formula (Y-2), and at least one of $Y^1$ or $Y^2$ represents a group represented by Formula (Y-1) or a group represented by Formula (Y-2).

In Formula (1), A and B each independently represent an aromatic hydrocarbon ring or an aromatic heterocycle.

The number of carbon atoms constituting the aromatic hydrocarbon ring is preferably 6 to 48, more preferably 6 to 22, and still more preferably 6 to 12. The aromatic hydrocarbon ring is preferably a monocycle or a fused ring, more preferably a monocycle or a fused ring composed of 2 to 8 rings, still more preferably a monocycle or a fused ring composed of 2 to 4 rings, still more preferably a monocycle or a fused ring composed of 2 or 3 rings, and most preferably a monocycle or a fused ring composed of 2 rings.

It is preferable that the aromatic heterocycle is a 5- or 6-membered ring. In addition, the aromatic heterocycle is preferably a monocycle or a fused ring, more preferably a monocycle or a fused ring composed of 2 to 8 rings, still more preferably a monocycle or a fused ring composed of 2 to 4 rings, still more preferably a monocycle or a fused ring composed of 2 or 3 rings, and most preferably a monocycle or a fused ring composed of 2 rings. Examples of a heteroatom included in the aromatic heterocycle include a nitrogen atom, an oxygen atom, and a sulfur atom. Among these, a nitrogen atom or a sulfur atom is preferable. The number of heteroatoms constituting the aromatic heterocycle is preferably 1 to 3 and more preferably 1 or 2.

It is preferable that, in Formula (1), at least one of A or B (preferably both A and B) represents a benzene ring, a thiophene ring, a furan ring, a pyrrole ring, a pyridine ring, an azulene ring, or a fused ring including a benzene ring, a thiophene ring, a furan ring, a pyrrole ring, a pyridine ring, or an azulene ring. Examples of the fused ring include a naphthalene ring, a benzothiophene ring, a benzofuran ring, an isobenzofuran ring, a benzimidazole ring, an indole ring, an isoindole ring, a quinoline ring, an isoquinoline ring, a thienopyrrole ring, and a pyrrolothiazole ring. In the present invention, from the viewpoints of visible transparency and near infrared shielding properties, at least one A or B (preferably both A and B) represents preferably a benzene ring or a naphthalene ring and more preferably a benzene ring.

In Formula (1), Ra and Rb each independently represent a substituent. Examples of the substituent include a halogen atom, a cyano group, a nitro group, an alkyl group, an alkenyl group, an alkynyl group, an aryl group, a heteroaryl group, $-OR_t^1$, $-COR_t^1$, $-COOR_t^1$, $-OCOR_t^1$, $-NR_t^1R_t^2$, $-NHCOR_t^1$, $-CONR_t^1R_t^2$, $-NHCONR_t^1R_t^2$, $-NHCOOR_t^1$, $-SR_t^1$, $-SO_2R_t^1$, $-SO_2OR_t^1$, $-NHSO_2R_t^1$, and $-SO_2NR_t^1R_t^2$. $R_t^1$ to $R_t^2$ each independently represent a hydrogen atom, an alkyl group, an alkenyl group, an alkynyl group, an aryl group, or a heteroaryl group. $R_t^1$ and $R_t^2$ may be bonded to each other to form a ring, $R_t^1$ and/or $R_t^2$ and A may be bonded to each other to form a ring, and $R_t^1$ and/or $R_t^2$ and B may be bonded to each other to form a ring. In a case where $R_t^1$ in $-COOR_t^1$ represents a hydrogen atom, the hydrogen atom may be dissociable or may be in the form of a salt. In a case where $R_t^1$ in $-SO_2OR_t^1$ represents a hydrogen atom, the hydrogen may be dissociable or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12.

The alkyl group, the alkenyl group, the alkynyl group, the aryl group, and the heteroaryl group may have a substituent or may be unsubstituted. Examples of the substituent include the substituents described above regarding Ra and Rb.

In Formula (1), Ra and A may be bonded to each other to form a ring, Rb and B may be bonded to each other to form a ring, in a case where m1 represents 2 or more, two Ra's among m1 Ra's may be bonded to each other to form a ring, and in a case where m2 represents 2 or more, two Rb's among m2 Rb's may be bonded to each other to form a ring. It is preferable that a linking group for forming the ring is a divalent linking group selected from the group consisting of $-CO-$, $-O-$, $-NH-$, an alkylene group having 1 to 10 carbon atoms, and a combination thereof. The alkylene group as the linking group may be unsubstituted or may have the above-described substituent.

In Formula (1), m1 represents an integer of 0 to mA, mA represents an integer representing a maximum number of Ra's which may be substituted in A, m2 represents an integer of 0 to mB, and mB represents an integer representing a maximum number of Rb's which may be substituted in B. For example, in a case where A represents a benzene ring, mA represents 4. In addition, in a case where A represents a naphthalene ring, mA represents 6. m1 and m2 each independently represent preferably an integer of 0 to 4, more preferably 0 to 3, still more preferably 1 to 3, and still more preferably 1 or 2.

In the present invention, it is preferable that Ra and Rb each independently represent $-NR_t^1R_t^2$.

$R_t^1$ and $R_t^2$ each independently represent preferably an alkyl group, an aryl group, or a heteroaryl group and, from the viewpoint of light fastness, more preferably an aryl group.

In addition, from the viewpoint of light fastness, an aspect where $R_t^1$ and $R_t^2$ may be bonded to each other to form a ring is also preferable. The ring that is formed by $R_t^1$ and $R_t^2$ being bonded to each other is preferably a 5- or 6-membered ring. In a case where $R_t^1$ and $R_t^2$ are bonded to each other to form a ring through a linking group, the linking group is preferably a divalent linking group selected from the group consisting of $-CO-$, $-O-$, $-NH-$, an alkylene group having 1 to 10 carbon atoms, and a combination thereof and more preferably an alkylene group having 1 to 10 carbon atoms. The alkylene group as the linking group may be unsubstituted or may have the above-described substituent.

In addition, from the viewpoint of light fastness, it is preferable that $R_t^1$ and/or $R_t^2$ and A (or B) are bonded to each other to form a ring. The formed ring is preferably a 5- or 6-membered ring. In a case where $R_t^1$ and/or $R_t^2$ and A (or B) are bonded to each other to form a ring through a linking group, the linking group is preferably a divalent linking group selected from the group consisting of $-CO-$, $-O-$, $-NH-$, an alkylene group having 1 to 10 carbon atoms, or a combination thereof and more preferably an alkylene group having 1 to 10 carbon atoms. The alkylene group as the linking group may be unsubstituted or may have the above-described substituent.

In Formula (1), $Y^1$ and $Y^2$ each independently represent an alkyl group, an aryl group, a group represented by Formula (Y-1), or a group represented by Formula (Y-2), and at least one of $Y^1$ or $Y^2$ represents a group represented by Formula (Y-1) or a group represented by Formula (Y-2). It is preferable that both $Y^1$ and $Y^2$ each independently represent a group represented by Formula (Y-1) or a group represented by Formula (Y-2). In addition, in a case where both $Y^1$ and $Y^2$ each independently represent a group represented by Formula (Y-1) or a group represented by Formula (Y-2), $Y^1$ and $Y^2$ may represent groups having the same structure or groups having different structures. In a case where $Y^1$ and $Y^2$ represent groups having the same structure, the number of synthesis steps can be reduced, and thus formation can be easily performed. In a case where $Y^1$ and $Y^2$ represent groups having different structures, an effect of improving the storage stability of the resin composition such that coating surface roughening is not likely to occur can be obtained.

In addition, it is also preferable that one of $Y^1$ or $Y^2$ represents a group represented by Formula (Y-1) and another one of $Y^1$ or $Y^2$ a group represented by Formula (Y-2). According to this aspect, an effect of improving adhesiveness and light fastness can be further obtained.

The number of carbon atoms in the alkyl group represented by $Y^1$ and $Y^2$ is preferably 1 to 20, more preferably 1 to 15, and still more preferably 1 to 8. The alkyl group may be linear, branched, or cyclic. The number of carbon atoms in the aryl group is preferably 6 to 30, more preferably 6 to 20, and still more preferably 6 to 12. In addition, the alkyl group and the aryl group may be unsubstituted or may have a substituent. Examples of the substituent include the above-described substituents.

Next, Formula (Y-1) will be described.

$$-X^1-L^1-Z^1-R^1 \qquad \text{Formula (Y-1)}$$

In Formula (Y-1), $X^1$ represents —CO—, —CS—, —SO$_2$—, —CONH—, —CSNH—, or —COO—. From the viewpoint of light fastness, $X^1$ represents preferably —CO—, —CS—, —SO$_2$—, —CONH—, or —CSNH— and more preferably —CO— or —CONH—.

$L^1$ in Formula (Y-1) represents an alkylene group or an arylene group and, from the viewpoint of solubility, preferably an alkylene group. The number of carbon atoms in the alkylene group is preferably 1 to 20, more preferably 1 to 15, and still more preferably 1 to 8. The alkylene group may be linear, branched, or cyclic. The number of carbon atoms in the arylene group is preferably 6 to 30, more preferably 6 to 20, and still more preferably 6 to 12. In addition, the alkylene group and the arylene group may be unsubstituted or may have a substituent. Examples of the substituent include the above-described substituents.

In Formula (Y-1), $Z^1$ represents —CONR$^{Z1}$—, —CSNR$^{Z1}$—, —OCONR$^{Z1}$—, —NR$^{Z1}$CONR$^{Z2}$—, —NR$^{Z1}$CSNR$^{Z2}$—, —OCOO—, or, —NR$^{Z1}$SO$_2$—, and R$^{Z1}$ and R$^{Z2}$ each independently represent a hydrogen atom, an alkyl group, or an aryl group.

From the viewpoint that an interaction with a support is likely to occur and higher adhesiveness can be easily obtained, $Z^1$ represents —CONR$^{Z1}$—, —CSNR$^{Z1}$—, —OCONR$^{Z1}$—, —NR$^{Z1}$CONR$^{Z2}$—, —NR$^{Z1}$CSNR$^{Z2}$—, or, —NR$^{Z1}$SO$_2$—, and more preferably —CONR$^{Z1}$—, —NR$^{Z1}$CONR$^{Z2}$—, —NR$^{Z1}$CSNR$^{Z2}$—, or —NR$^{Z1}$SO$_2$—.

In addition, from the viewpoint that the squarylium compounds (1) are likely to interact and higher light fastness can be easily obtained, $Z^1$ represents preferably —CONR$^{Z1}$—, —CSNR$^{Z1}$—, —NR$^{Z1}$CONR$^{Z2}$—, —NR$^{Z1}$CSNR$^{Z2}$—, or, —NR$^{Z1}$SO$_2$—, and more preferably —CONR$^{Z1}$— or —NR$^{Z1}$CONR$^{Z2}$—.

In addition, from the viewpoints of light fastness and adhesiveness, R$^{Z1}$ and R$^{Z2}$ each independently represent preferably a hydrogen atom or an alkyl group and more preferably a hydrogen atom.

The number of carbon atoms in the alkyl group represented by R$^{Z1}$ and R$^{Z2}$ is preferably 1 to 20, more preferably 1 to 15, and still more preferably 1 to 8. The alkyl group may be linear, branched, or cyclic. In addition, the alkyl group may be unsubstituted or may have a substituent. Examples of the substituent include the above-described substituents. The number of carbon atoms in the aryl group represented by R$^{Z1}$ and R$^{Z2}$ is preferably 6 to 30, more preferably 6 to 20, and still more preferably 6 to 12. In addition, the aryl group may be unsubstituted or may have a substituent. Examples of the substituent include the above-described substituents.

In Formula (Y-1), $R^1$ represents an alkyl group or an aryl group. From the viewpoint of solubility, it is preferable that $R^1$ represents an alkyl group. The number of carbon atoms in the alkyl group is preferably 1 to 20, more preferably 1 to 15, and still more preferably 1 to 8. The alkyl group may be linear, branched, or cyclic. The number of carbon atoms in the aryl group is preferably 6 to 30, more preferably 6 to 20, and still more preferably 6 to 12. In addition, the alkyl group and the aryl group may be unsubstituted or may have a substituent. Examples of the substituent include the above-described substituents.

Next, Formula (Y-2) will be described.

$$-X^{11}-L^{11}-X^{12}-L^{12}-Z^{11} \qquad \text{Formula (Y-2)}$$

In Formula (Y-2), $X^{11}$ represents —CO—, —CS—, —SO$_2$—, —CONH—, —CSNH—, or —COO—. From the viewpoint that the squarylium compounds (1) are likely to interact and higher light fastness can be easily obtained, $X^{11}$ represents preferably —CO—, —CS—, —SO$_2$—, —CONH—, or —CSNH— and more preferably —CO— or —CONH—.

In Formula (Y-2), $L^{11}$ represents a single bond, an alkylene group, or an arylene group, and preferably a single bond or an alkylene group. The number of carbon atoms in the alkylene group is preferably 1 to 20, more preferably 1 to 15, and still more preferably 1 to 8. The alkylene group may be linear, branched, or cyclic. The number of carbon atoms in the arylene group is preferably 6 to 30, more preferably 6 to 20, and still more preferably 6 to 12. In addition, the alkylene group and the arylene group may be unsubstituted or may have a substituent. Examples of the substituent include the above-described substituents. In a case where $Z^{11}$ in Formula (Y-2) represents a group represented by Formula (Z-1) or a group represented by Formula (Z-4), $L^{11}$ represents an alkylene group or an arylene group.

In Formula (Y-2), $X^{12}$ represents a single bond, —CONR$^{X1}$—, —CSNR$^{X1}$—, —OCONR$^{X1}$—, —NR$^{X1}$CONR$^{X2}$—, —NR$^{X1}$CSNR$^{X2}$—, —OCOO—, —O—, —CO—, —COO—, —SO$_2$—, or —SO—, and R$^{X1}$ and R$^{X2}$ each independently represent a hydrogen atom, an alkyl group, or an aryl group.

The number of carbon atoms in the alkyl group represented by R$^{X1}$ and R$^{X2}$ is preferably 1 to 20, more preferably 1 to 15, and still more preferably 1 to 8. The alkyl group may be linear, branched, or cyclic. In addition, the alkyl group may be unsubstituted or may have a substituent. Examples of the substituent include the above-described substituents.

The number of carbon atoms in the aryl group represented by $R^{X1}$ and $R^{X2}$ is preferably 6 to 30, more preferably 6 to 20, and still more preferably 6 to 12. In addition, the aryl group may be unsubstituted or may have a substituent. Examples of the substituent include the above-described substituents.

In Formula (Y-2), $X^{12}$ represents preferably a single bond, —$CONR^{X1}$—, —$OCONR^{X1}$—, —O—, or —COO—, and more preferably a single bond or —O—.

In Formula (Y-2), $L^{12}$ represents a single bond, an alkylene group, or an arylene group, and preferably a single bond or an alkylene group. The number of carbon atoms in the alkylene group is preferably 1 to 20, more preferably 1 to 15, and still more preferably 1 to 8. The alkylene group may be linear, branched, or cyclic. The number of carbon atoms in the arylene group is preferably 6 to 30, more preferably 6 to 20, and still more preferably 6 to 12. In addition, the alkylene group and the arylene group may be unsubstituted or may have a substituent. Examples of the substituent include the above-described substituents.

In Formula (Y-2), $Z^{11}$ represents a group represented by any one of Formulae (Z-1) to (Z-6).

From the viewpoint that higher light fastness can be easily obtained, $Z^{11}$ represents preferably a group represented by Formula (Z-1), a group represented by Formula (Z-2), a group represented by Formula (Z-3), or a group represented by Formula (Z-5), more preferably a group represented by Formula (Z-1), a group represented by Formula (Z-2), or a group represented by Formula (Z-3), and still more preferably a group represented by Formula (Z-1) or a group represented by Formula (Z-2).

From the viewpoint that higher adhesiveness can be easily obtained, $Z^{11}$ represents preferably a group represented by Formula (Z-1), a group represented by Formula (Z-2), a group represented by Formula (Z-3), a group represented by Formula (Z-4), or a group represented by Formula (Z-6), more preferably a group represented by Formula (Z-1), a group represented by Formula (Z-2), or a group represented by Formula (Z-3), and still more preferably a group represented by Formula (Z-1) or a group represented by Formula (Z-3).

(Z-1) $\{-S-Rz^{11}$ (Z-2) [phenyl ring with $(Rz^{12a})_{m2}$ and $ORz^{12}$]

(Z-3) [cyclohexane ring with $Rz^{13}$, $Rz^{14}$, $N-Rz^{17}$, $Rz^{15}$, $Rz^{16}$]

(Z-4) $\{-O-P(ORz^{18})(ORz^{19})$ (Z-5) [phenyl ring with $NO_2$]

(Z-6) $\{-W^1-N(OH)(Rz^{20})$

In Formulae (Z-1) to (Z-6), a wave line represents a binding site in Formula (Y-2).

In Formula (Z-1), $Rz^{11}$ represents an alkyl group or an aryl group and preferably an alkyl group. The number of carbon atoms in the alkyl group is preferably 1 to 20, more preferably 1 to 15, and still more preferably 1 to 8. The alkyl group may be linear, branched, or cyclic. In addition, the alkyl group may be unsubstituted or may have a substituent. Examples of the substituent include the above-described substituents. The number of carbon atoms in the aryl group is preferably 6 to 30, more preferably 6 to 20, and still more preferably 6 to 12. In addition, the aryl group may be unsubstituted or may have a substituent. Examples of the substituent include the above-described substituents.

In Formula (Z-2), $Rz^{12}$ represents a hydrogen atom, —$COR^{100}$, or —$COOR^{100}$, $R^{100}$ represents a hydrogen atom, an alkyl group, or an aryl group, and $Rz^{12a}$ represents an alkyl group and mz represents an integer of 0 to 4. From the viewpoints of light fastness and adhesiveness, it is preferable that $Rz^{12}$ represents a hydrogen atom. In a case where a plurality of $Rz^{12a}$'s are present, $Rz^{12a}$'s may be the same as or different from each other.

The alkyl group and the aryl group represented by $R^{100}$ have the same range as that described above regarding $Rz^{11}$.

mz represents an integer of 0 to 4, preferably an integer of 0 to 2, and more preferably 1 or 2.

The number of carbon atoms in the alkyl group represented by $Rz^{12a}$ is preferably 1 to 10 and more preferably 1 to 5. The alkyl group may be linear, branched, or cyclic and is preferably linear or branched and more preferably branched.

In Formula (Z-3), $Rz^{13}$ to $Rz^{16}$ each independently represent an alkyl group and $Rz^{17}$ represents a hydrogen atom, an alkyl group, or an oxygen radical (—O·). The number of carbon atoms in the alkyl group represented by $Rz^{13}$ to $Rz^{17}$ is preferably 1 to 10 and more preferably 1 to 5. The alkyl group may be linear, branched, or cyclic and is preferably linear or branched.

In Formula (Z-4), $Rz^{18}$ and $Rz^{19}$ each independently represent an alkyl group or an aryl group, and preferably an aryl group. The alkyl group and the aryl group represented by $Rz^{18}$ and $Rz^{19}$ have the same range as that described above regarding $Rz^{11}$.

In Formula (Z-6), $W^1$ represents a single bond or —CO—, $Rz^{20}$ represents a hydrogen atom, an alkyl group, an aryl group, or —$COR^{101}$, and $R^{101}$ represents an alkyl group or an aryl group. It is preferable that $W^1$ represents —CO—. $Rz^{20}$ represents preferably a hydrogen atom, an alkyl group, or —$COR^{101}$, and more preferably a hydrogen atom. The alkyl group and the aryl group represented by $R^{101}$ have the same range as that described above regarding $Rz^{11}$.

As shown below, cations in Formula (1) are present without localized.

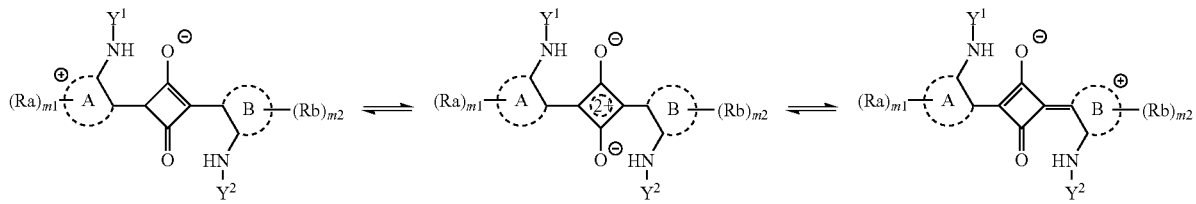

It is preferable that the squarylium compound (1) has a structure represented by the following Formula (2-1) or Formula (2-2), and it is more preferable that the squarylium compound (1) has a structure represented by the following Formula (2-1).

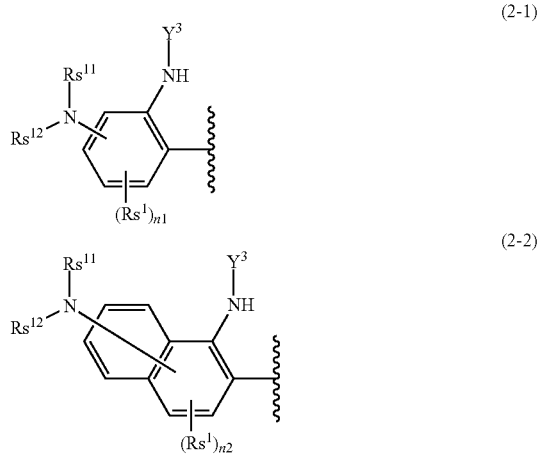

In the formula, a wave line represents a binding site to a squaric acid site in Formula (1).

$Y^3$ represents the group represented by Formula (Y-1) or the group represented by Formula (Y-2).

$Rs^1$ represents a substituent.

n1 represents an integer of 0 to 3 and n2 represents an integer of 0 to 5.

$Rs^{11}$ and $Rs^{12}$ each independently represent an alkyl group, an aryl group, or a heteroaryl group.

$Rs^{11}$ and $Rs^{12}$, $Rs^{11}$ and $Rs^1$, and $Rs^{12}$ and $Rs^1$ may be bonded to each other to form a ring.

Preferable ranges of the group represented by Formula (Y-1) and the group represented by Formula (Y-2) represented by $Y^3$ are the same as the above-described range.

Examples of the substituent represented by $Rs^1$ include the above-described substituents.

$Rs^{11}$ and $Rs^{12}$ each independently represent an alkyl group, an aryl group, or a heteroaryl group, preferably an alkyl group or an aryl group, and more preferably an aryl group. The number of carbon atoms in the alkyl group is preferably 1 to 20, more preferably 1 to 15, and still more preferably 1 to 8. The alkyl group may be linear, branched, or cyclic. In addition, the alkyl group may be unsubstituted or may have a substituent. Examples of the substituent include the above-described substituents. The number of carbon atoms in the aryl group is preferably 6 to 30, more preferably 6 to 20, and still more preferably 6 to 12. In addition, the aryl group may be unsubstituted or may have a substituent. Examples of the substituent include the above-described substituents. The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12. In addition, the heteroaryl group may be unsubstituted or may have a substituent. Examples of the substituent include the above-described substituents.

n1 represents an integer of 0 to 3 and n2 represents an integer of 0 to 5. n1 represents preferably an integer of 0 to 2. n2 represents preferably an integer of 0 to 4 and more preferably an integer of 0 to 3. n2 represents still more preferably an integer of 0 to 2.

In the formula, $Rs^{11}$ and $Rs^{12}$, $Rs^{11}$ and $Rs^1$, and $Rs^{12}$ and $Rs^1$ may be bonded to each other to form a ring. The ring that is formed by these groups being bonded to each other is preferably a 5- or 6-membered ring. In a case where the groups are bonded to each other to form a ring through a linking group, the linking group is preferably a divalent linking group selected from the group consisting of —CO—, —O—, —NH—, an alkylene group having 1 to 10 carbon atoms, and a combination thereof and more preferably an alkylene group having 1 to 10 carbon atoms. The alkylene group as the linking group may be unsubstituted or may have the above-described substituent.

The binding site to the squaric acid site in Formula (1) refers to a binding site to the following structure in Formula (1). A wave line represents a binding site to a structure represented by Formula (2-1) or Formula (2-2).

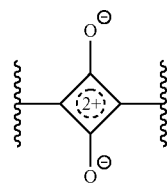

It is preferable that the squarylium compound (1) has a structure represented by the following Formula (2-1a), Formula (2-1b), Formula (2-1c), or Formula (2-1d), It is more preferable that the squarylium compound (1) has a structure represented by the following Formula (2-1a), Formula (2-1c), or Formula (2-1d), and from the viewpoint that higher near infrared shielding properties can be easily obtained, it is still more preferable that the squarylium compound (1) has a structure represented by Formula (2-1c) or Formula (2-1d).

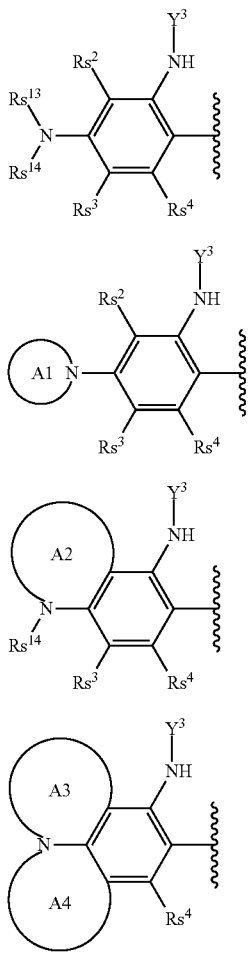

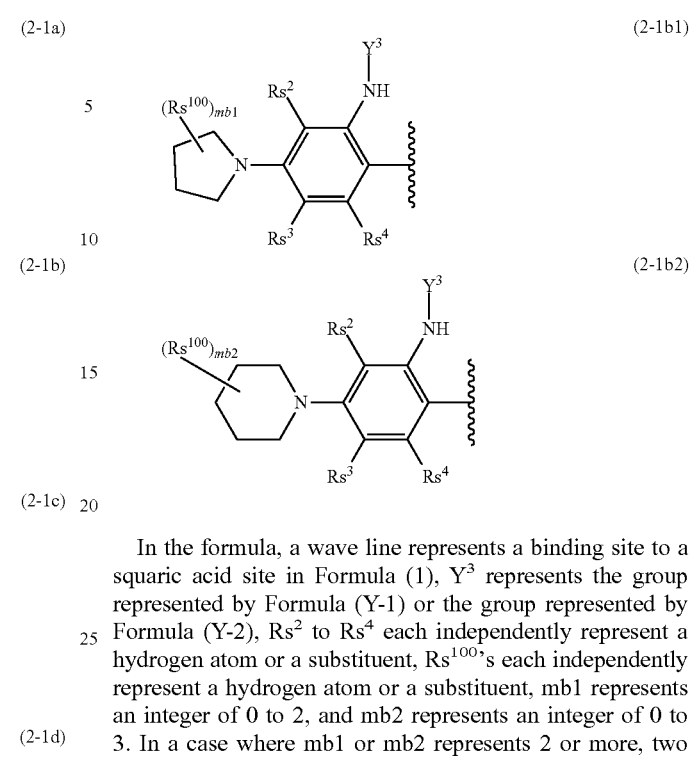

In the formula, a wave line represents a binding site to a squaric acid site in Formula (1).

$Y^3$ represents the group represented by Formula (Y-1) or the group represented by Formula (Y-2).

$Rs^2$ to $Rs^4$ each independently represent a hydrogen atom or a substituent.

$Rs^{13}$ and $Rs^{14}$ each independently represent an alkyl group, an aryl group, or a heteroaryl group.

A1 to A4 each independently represent a ring including a nitrogen atom.

$Rs^2$ to $Rs^4$ each independently represent a hydrogen atom or a substituent. Examples of the substituent include the above-described substituents.

$Rs^{13}$ and $Rs^{14}$ each independently represent an alkyl group, an aryl group, or a heteroaryl group. The details of the alkyl group, the aryl group, and the heteroaryl group represented by $Rs^{13}$ and $Rs^{14}$ are the same as those of the range described above regarding $Rs^{11}$ and $Rs^{12}$.

From the viewpoint of light fastness, it is preferable that $Rs^{13}$ and $Rs^{14}$ in Formula (2-1a) each independently represent an aryl group.

In Formula (2-1b), A1 represents a ring including a nitrogen atom. The ring represented by A1 is preferably a 5- or 6-membered ring. Specific examples of the structure represented by Formula (2-1b) include a structure represented by Formula (2-1b1) and a structure represented by Formula (2-1b2).

In the formula, a wave line represents a binding site to a squaric acid site in Formula (1), $Y^3$ represents the group represented by Formula (Y-1) or the group represented by Formula (Y-2), $Rs^2$ to $Rs^4$ each independently represent a hydrogen atom or a substituent, $Rs^{100}$'s each independently represent a hydrogen atom or a substituent, mb1 represents an integer of 0 to 2, and mb2 represents an integer of 0 to 3. In a case where mb1 or mb2 represents 2 or more, two $Rs^{100}$'s may be bonded to each other to form a ring. Examples of the substituent represented by $Rs^{100}$ include the above-described substituents.

In Formula (2-1c), A2 represents a ring including a nitrogen atom. The ring represented by A2 is preferably a 5- or 6-membered ring. Examples of the ring represented by A2 include a structure represented by Formula (2-1c1) and a structure represented by Formula (2-1c2).

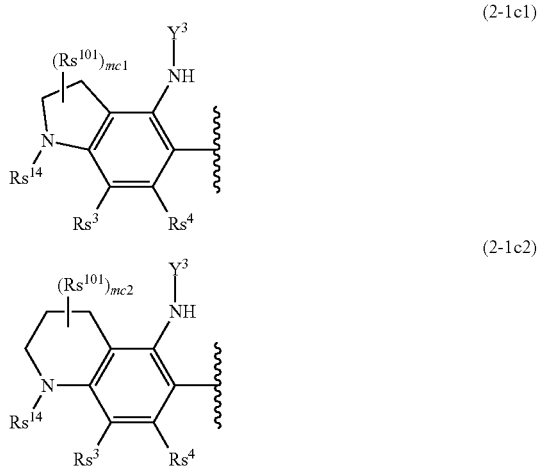

In the formula, a wave line represents a binding site to a squaric acid site in Formula (1), $Y^3$ represents the group represented by Formula (Y-1) or the group represented by Formula (Y-2), $Rs^3$ and $Rs^4$ each independently represent a hydrogen atom or a substituent, $Rs^{101}$'s each independently represent a hydrogen atom or a substituent, mc1 represents an integer of 0 to 2, and mc2 represents an integer of 0 to 3. In a case where mc1 or mc2 represents 2 or more, two Rs$^{101}$'s may be bonded to each other to form a ring. Examples of the substituent represented by Rs$^{101}$ include the above-described substituents.

In Formula (2-1d), A3 and A4 each independently represent a ring including a nitrogen atom. The ring represented by A3 and A4 is preferably a 5- or 6-membered ring. Specific examples of the structure represented by Formula (2-1d) include a structure represented by Formula (2-1d1) and a structure represented by Formula (2-1d2).

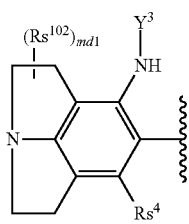
(2-1d1)

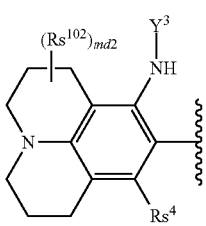
(2-1d2)

In the formula, a wave line represents a binding site to a squaric acid site in Formula (1), Y$^3$ represents the group represented by Formula (Y-1) or the group represented by Formula (Y-2), Rs$^4$ represent a hydrogen atom or a substituent, Rs$^{102}$'s each independently represent a hydrogen atom or a substituent, md1 represents an integer of 0 to 4, and md2 represents an integer of 0 to 6. In a case where md1 or md2 represents 2 or more, two Rs$^{102}$'s may be bonded to each other to form a ring. Examples of the substituent represented by Rs$^{102}$ include the above-described substituents.

As described above, cations in Formula (1) are not localized. Accordingly, cations in Formula (2-1a), Formula (2-1b), Formula (2-1c), and Formula (2-1d) are not localized such that structures represented by the following Formula (2-1a-1), Formula (2-1a-2), Formula (2-1b-1), Formula (2-1b-2), Formula (2-1c-1), Formula (2-1c-2), Formula (2-1d-1), and Formula (2-1d-2) are adopted, respectively. These structures have the same definitions as those of Formula (2-1a), Formula (2-1b), Formula (2-1c), and Formula (2-1d).

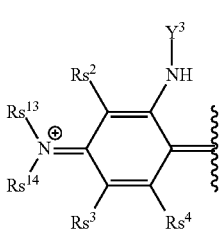
(2-1a-1)

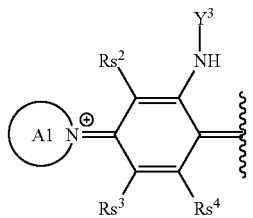
(2-1b-1)

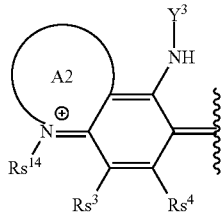
(2-1c-1)

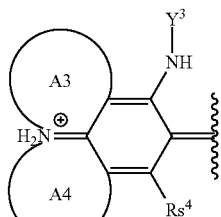
(2-1d-1)

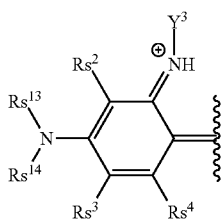
(2-1a-2)

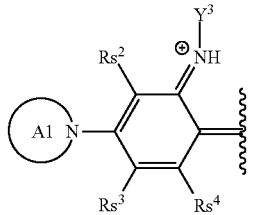
(2-1b-2)

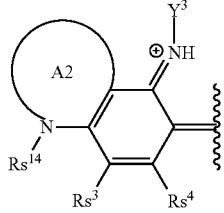
(2-1c-2)

-continued (2-1d-2)

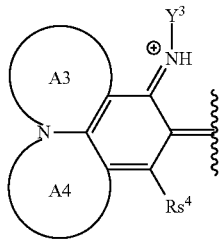

It is preferable that the squarylium compound (1) is a compound represented by the following Formula (1a).

(1a)

In Formula (1a), $Y^4$ and $Y^5$ each independently represent an alkyl group, an aryl group, a group represented by Formula (Y-1), or a group represented by Formula (Y-2), and at least one of $Y^4$ or $Y^5$ represents a group represented by Formula (Y-1) or a group represented by Formula (Y-2). It is preferable that both $Y^4$ and $Y^5$ each independently represent a group represented by Formula (Y-1) or a group represented by Formula (Y-2). In addition, in a case where both $Y^4$ and $Y^5$ each independently represent a group represented by Formula (Y-1) or a group represented by Formula (Y-2), $Y^1$ and $Y^2$ may represent groups having the same structure or groups having different structures. The alkyl group, the aryl group, the group represented by Formula (Y-1), and the group represented by Formula (Y-2) that are represented by $Y^4$ and $Y^5$ have the same ranges and the same preferable ranges as those described above regarding $Y^1$ and $Y^2$ in Formula (1).

In Formula (1a), $Rs^5$ and $Rs^6$ each independently represent a substituent. The substituent represented by $Rs^5$ and $Rs^6$ is the same as that described above regarding Ra and Rb in Formula (1).

In Formula (1a), n1a and n1b each independently represent an integer of 0 to 3 and preferably an integer of 0 to 2.

In Formula (1a), $Rs^{21}$ to $Rs^{24}$ each independently represent an alkyl group, an aryl group, or a heteroaryl group. The alkyl group, the aryl group, and the heteroaryl group represented by $Rs^{21}$ to $Rs^{24}$ have the same ranges as those described above regarding $Rs^{11}$ and $Rs^{12}$ in Formulae (2-1) and (2-2).

In Formula (1a), $Rs^{21}$ and $Rs^{22}$, $Rs^{23}$ and $Rs^{24}$, $Rs^{21}$ and $Rs^5$, $Rs^{22}$ and $Rs^5$, $Rs^{23}$ and $Rs^6$, and $Rs^{24}$ and $Rs^6$ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have the above-described substituent.

Examples of a preferable aspect of Formula (1a) include the following aspects 1 to 4. Among these, the aspects 1 to 3 are preferable, and the aspect 1 or 2 is more preferable.

(Aspect 1) An aspect where $Rs^{21}$ and $Rs^{22}$ and $Rs^{23}$ and $Rs^{24}$ are each independently bonded to each other to form a ring.

(Aspect 2) An aspect where $Rs^{21}$ to $Rs^{24}$ each independently represent an aryl group.

(Aspect 3) An aspect where n1a and n1b represent 1 or more and $Rs^{21}$ and $Rs^5$ and $Rs^{23}$ and $Rs^6$ are each independently bonded to each other to form a ring.

(Aspect 4) An aspect where n1a and n1b represent 2 or more and $Rs^{21}$ and $Rs^5$, $Rs^{22}$ and $Rs^5$, $Rs^{23}$ and $Rs^6$, and $Rs^{24}$ and $Rs^6$ are each independently bonded to each other to form a ring.

Specific examples of the squarylium compound (1) include compounds shown below, but the squarylium compound (1) is not limited thereto.

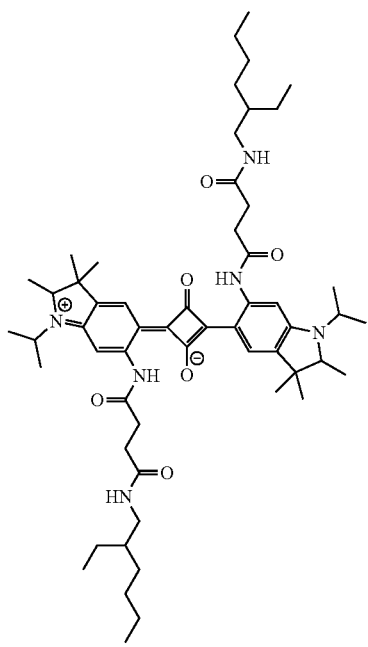

SQ1

23
-continued
SQ2
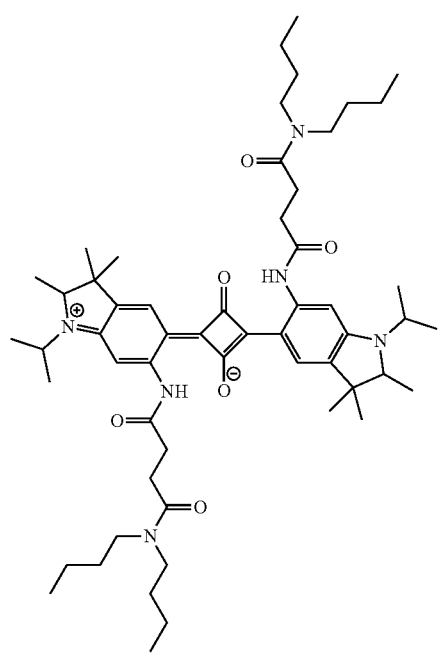
24
-continued
SQ4
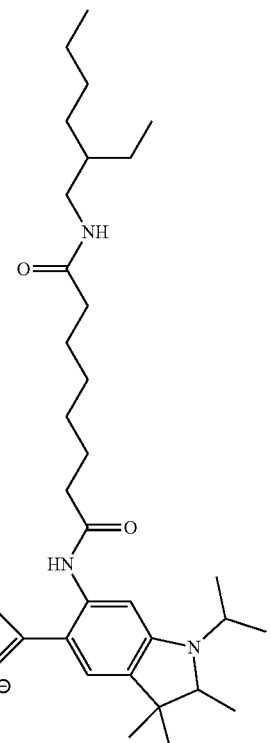
SQ3
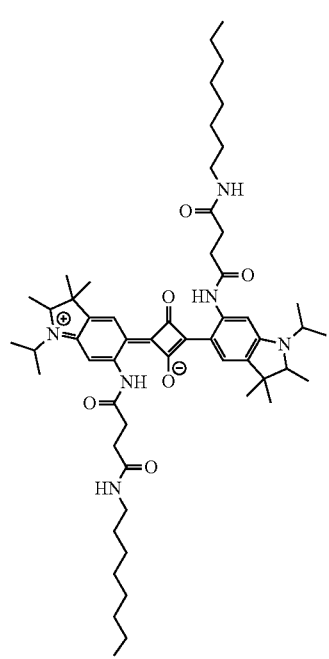

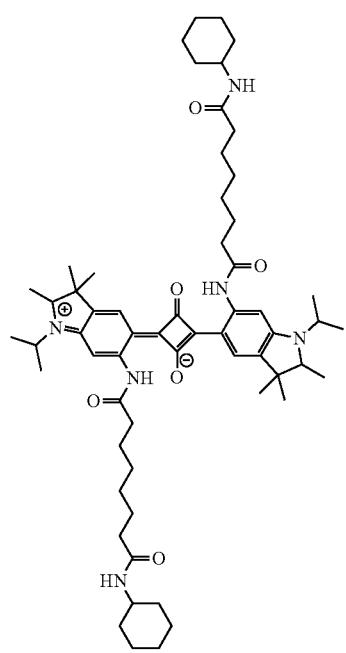
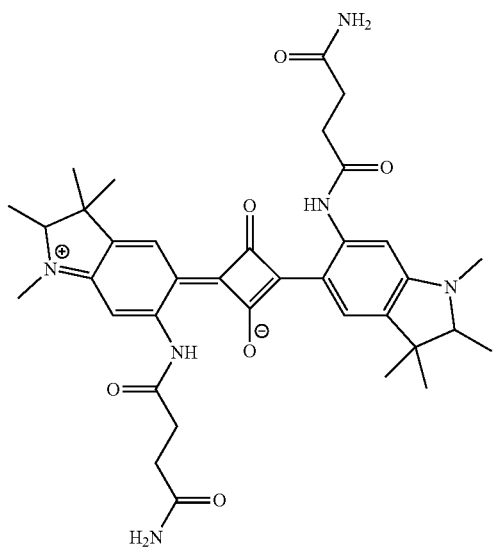
SQ5
SQ7
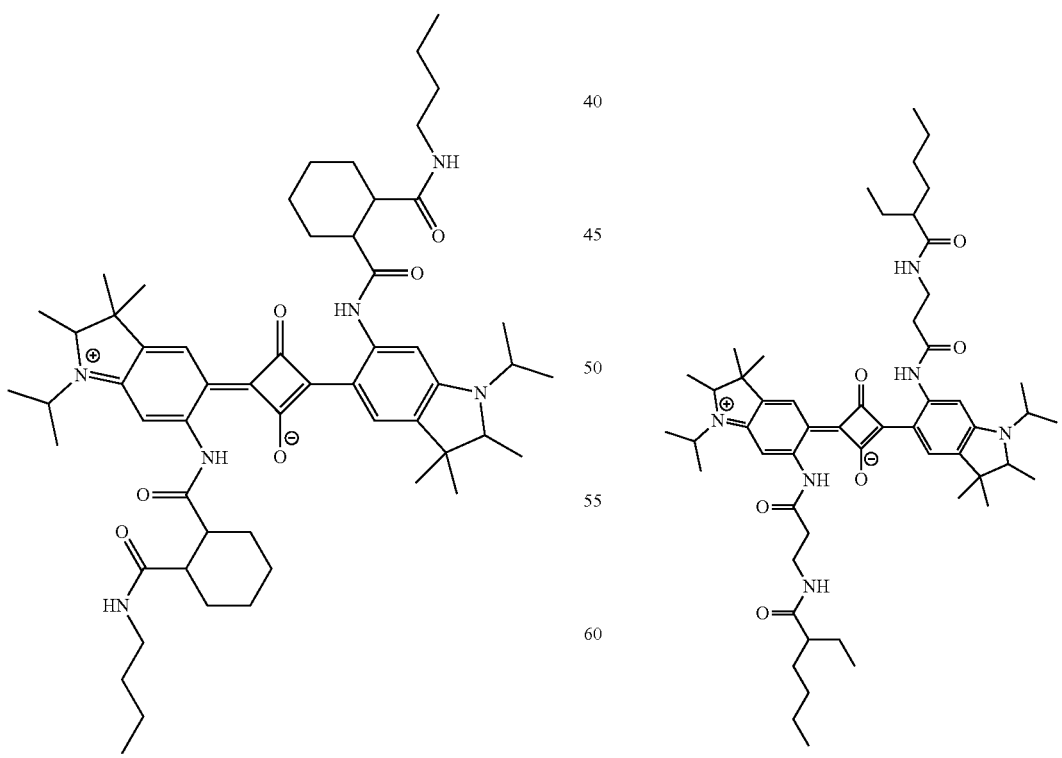
SQ6
SQ8

-continued
SQ9
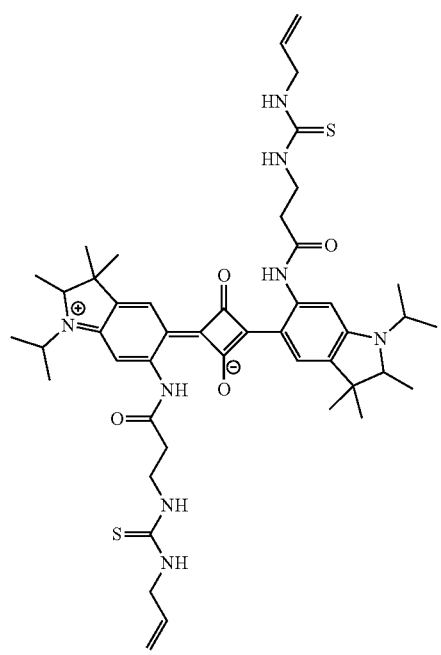
SQ11
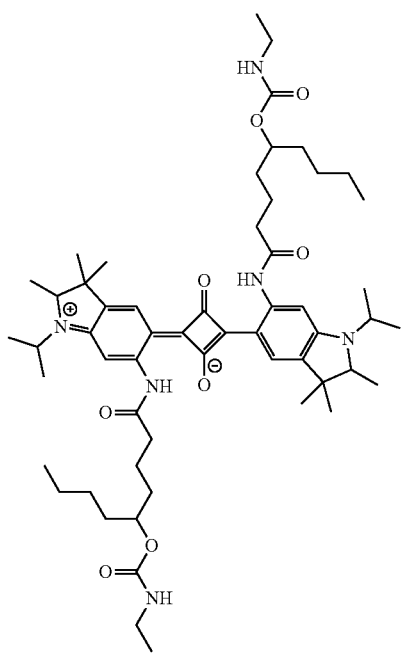
SQ10
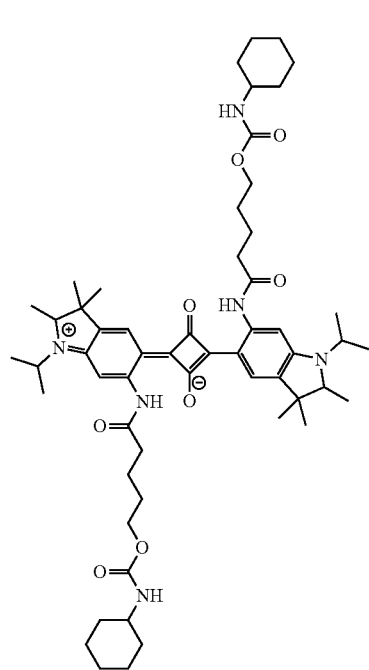
SQ12
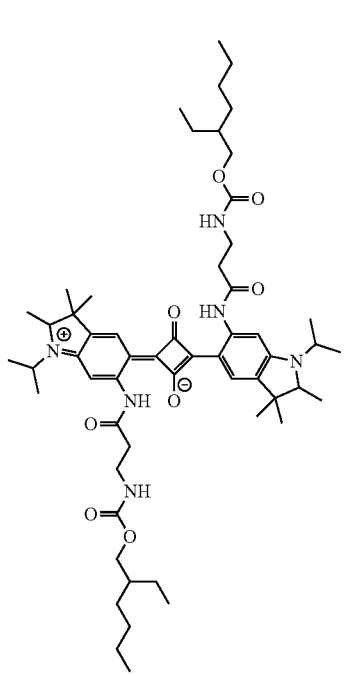

29
-continued
SQ13
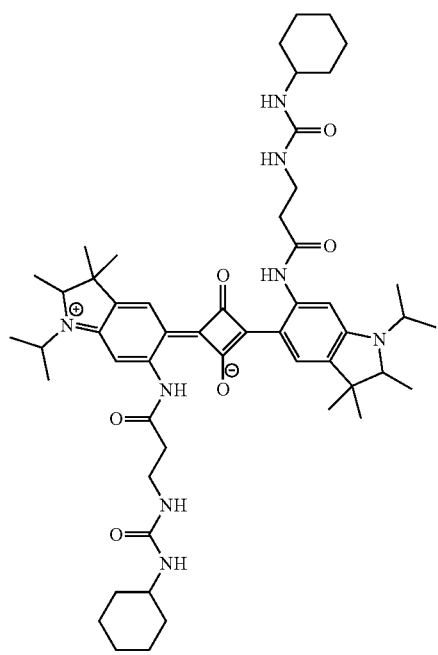
30
-continued
SQ15
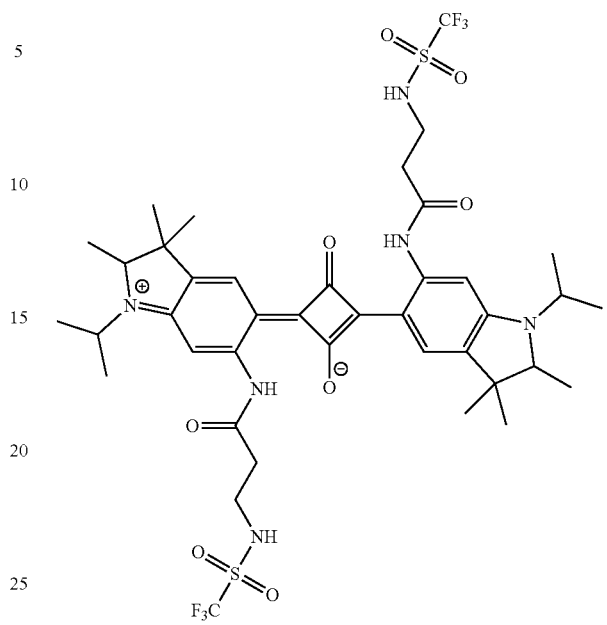
SQ14
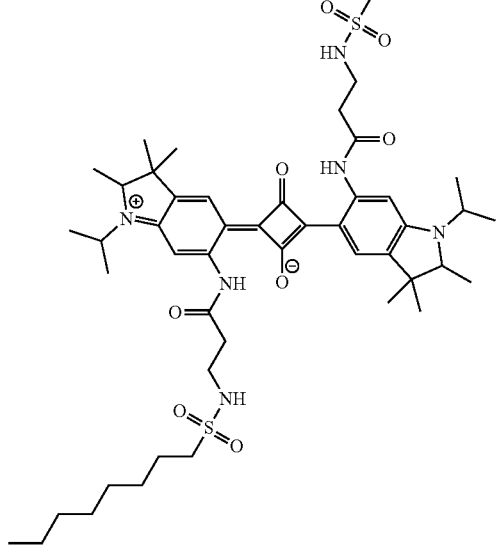
SQ16

SQ17
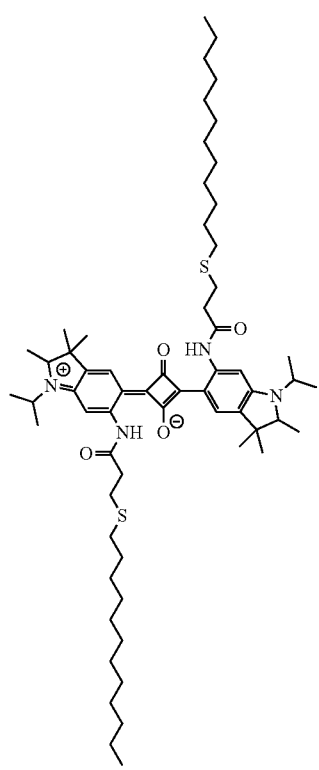
SQ18
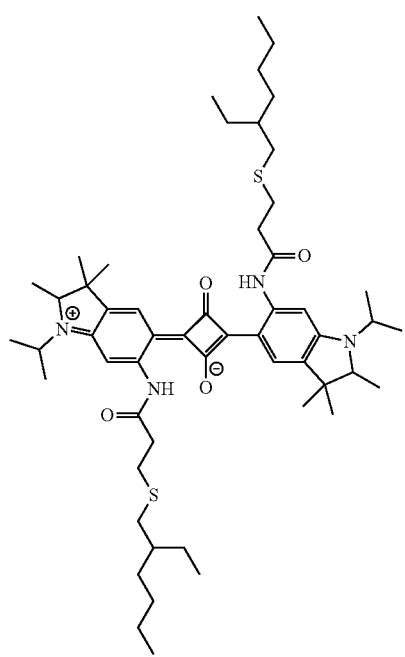
SQ19
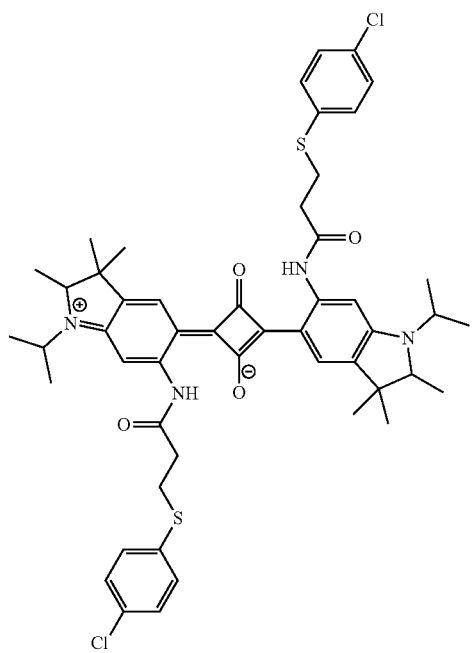
SQ20
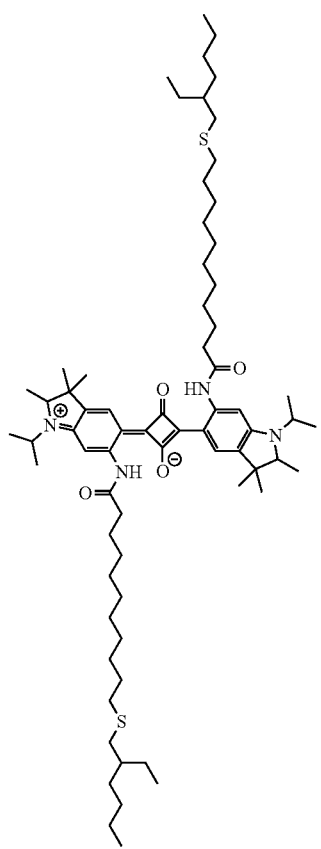

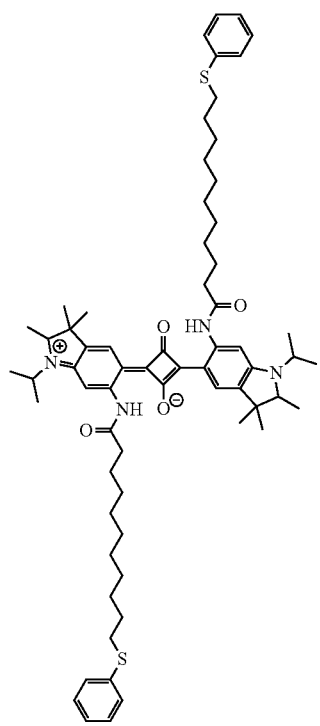
SQ21
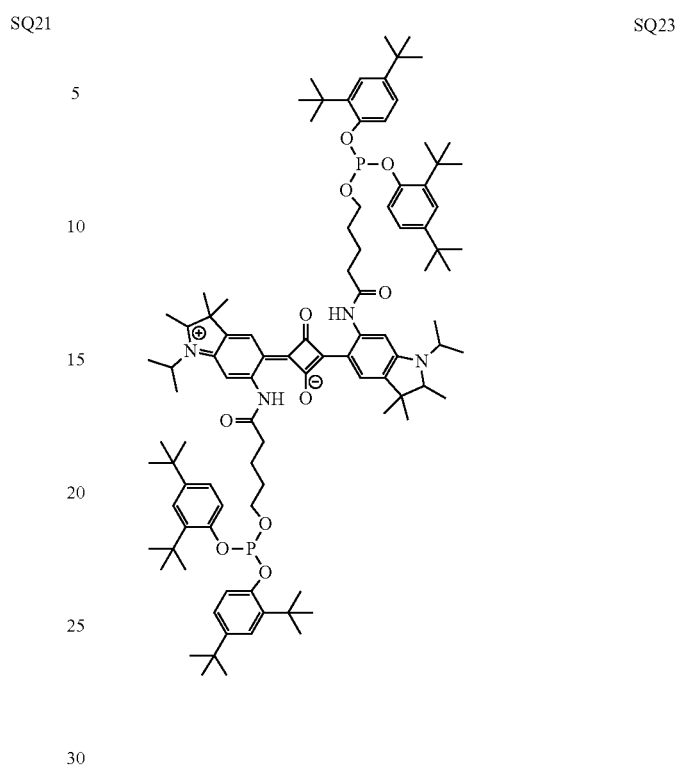
SQ23
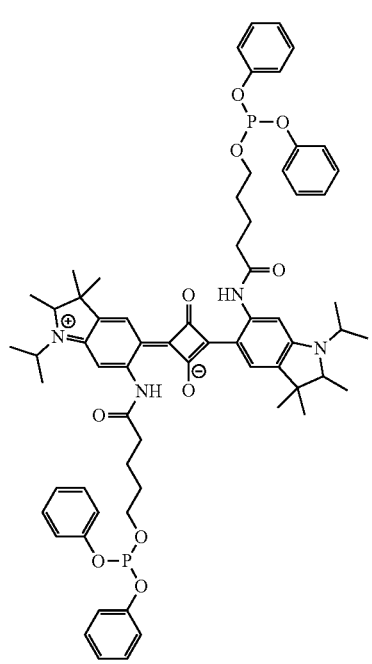
SQ22
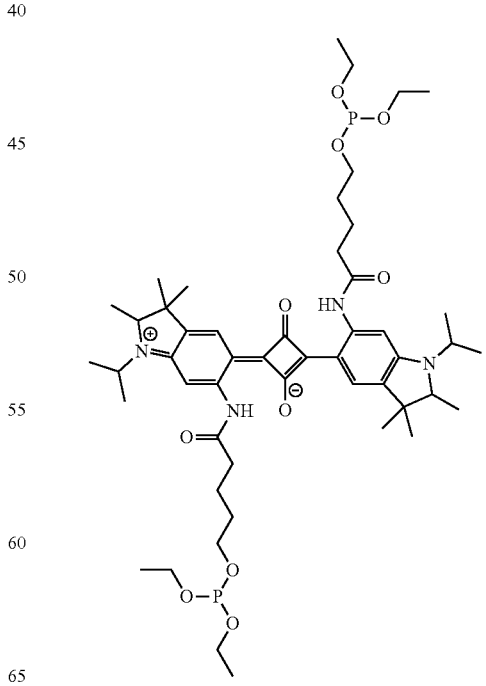
SQ24

-continued
SQ25
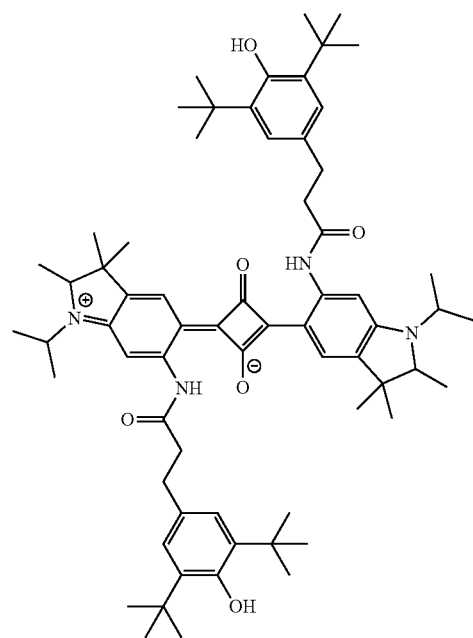
SQ27
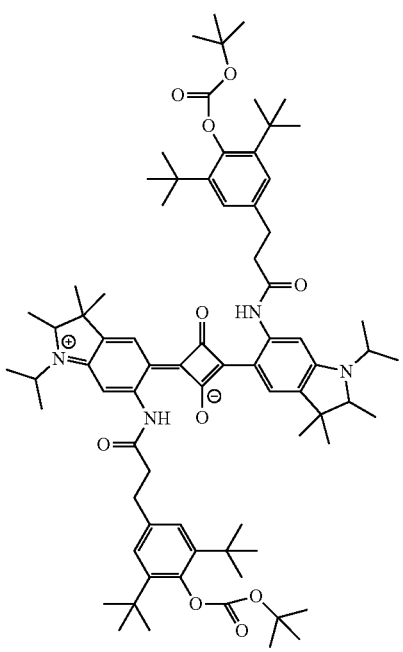
SQ26
SQ28
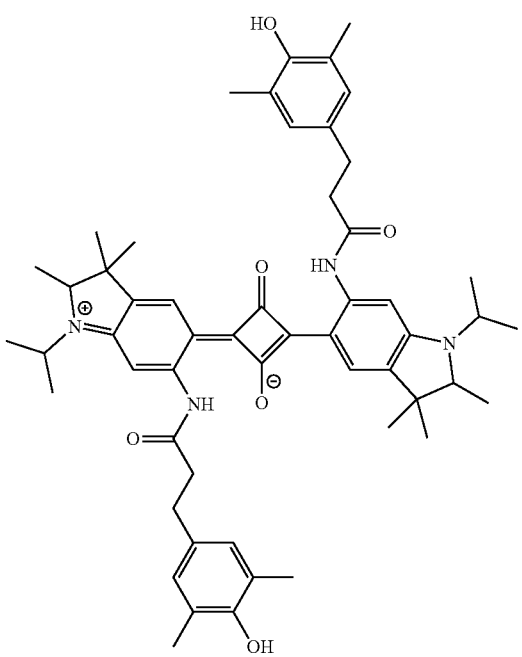

SQ29
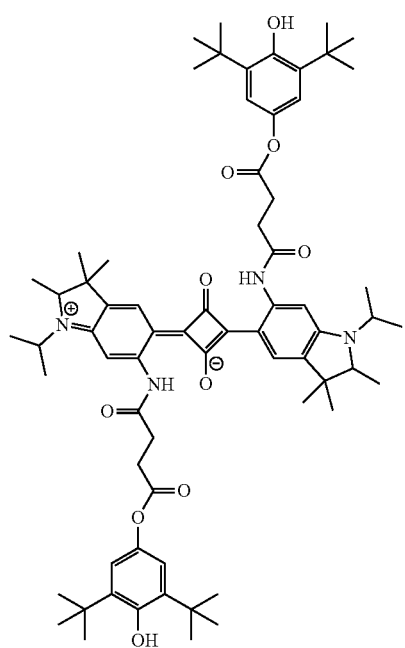
SQ30
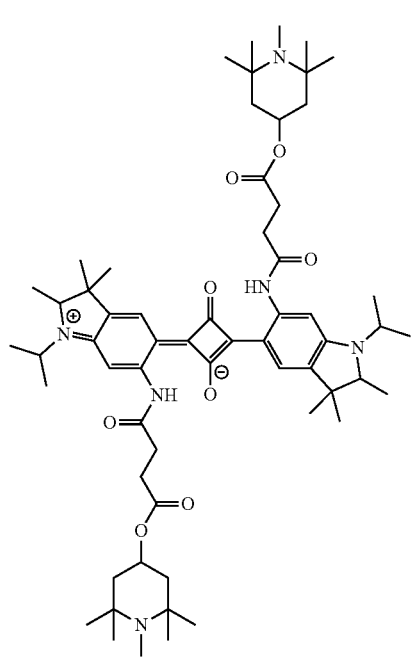
SQ31
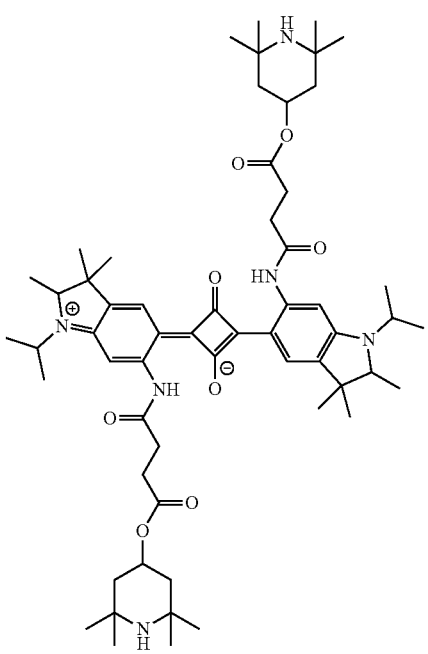
SQ32
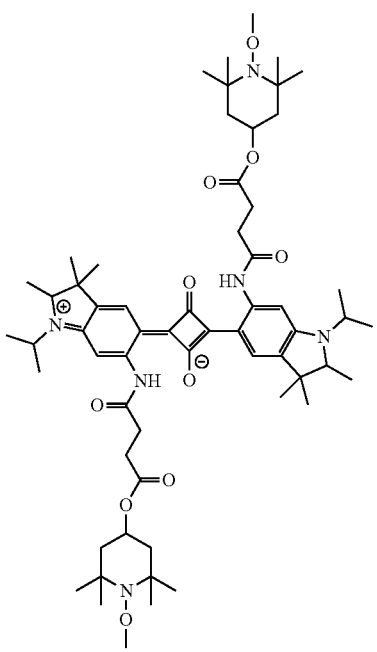

-continued
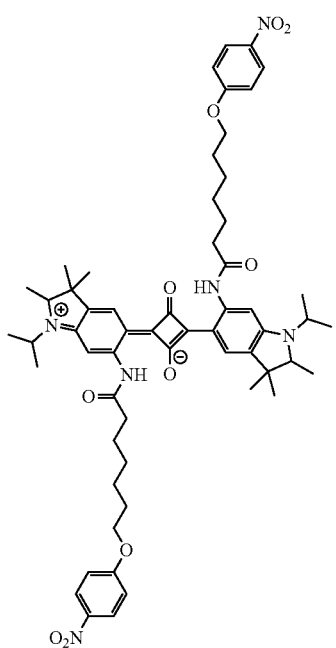
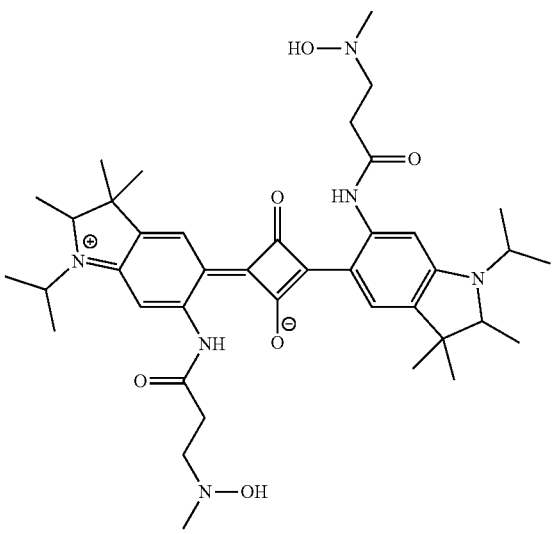
SQ33
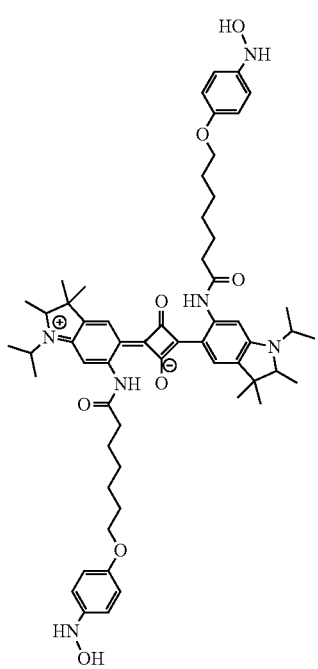
SQ35
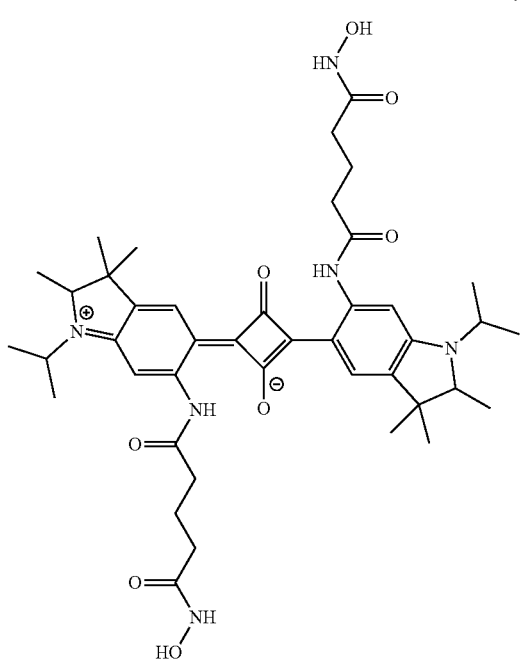
SQ34
SQ36

SQ37
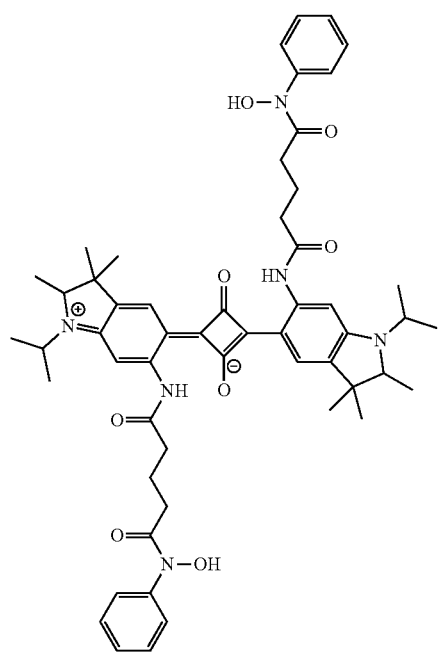
SQ39
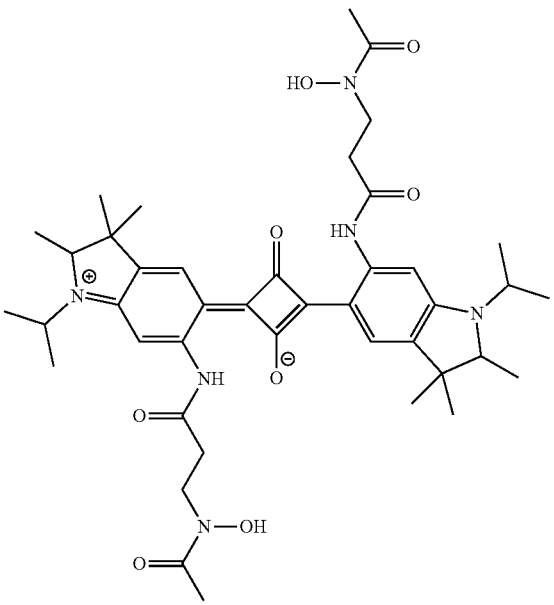
SQ38
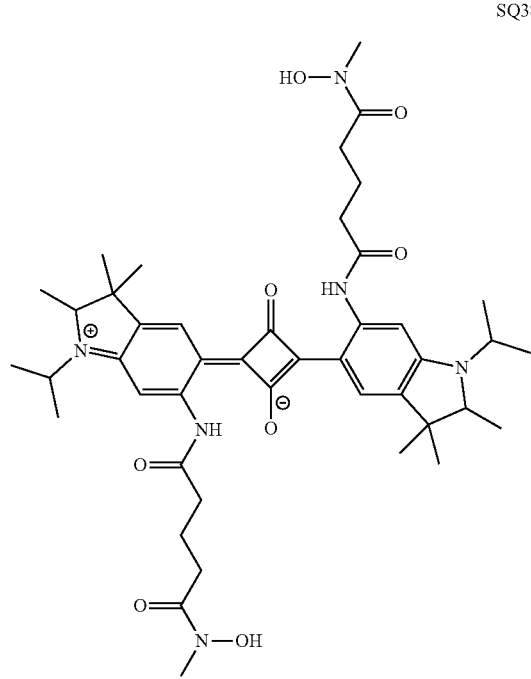
SQ40
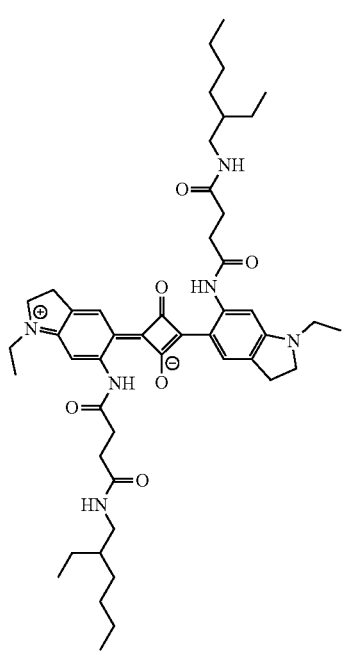

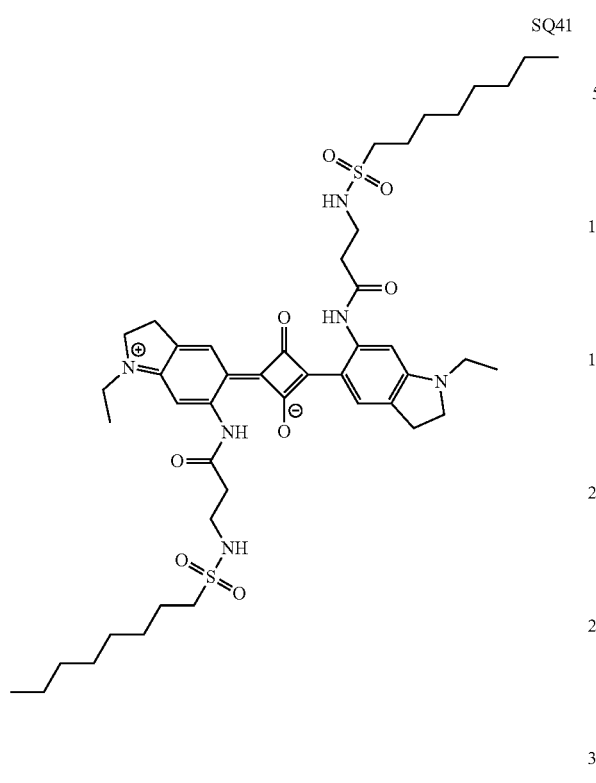
SQ41
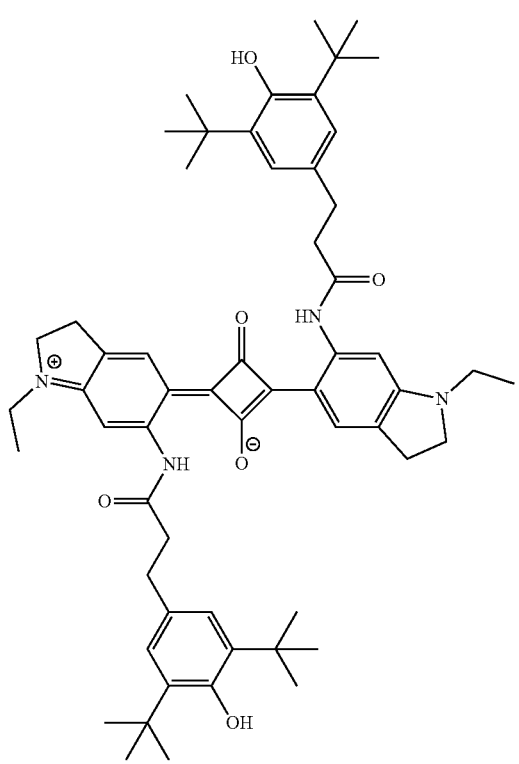
SQ43
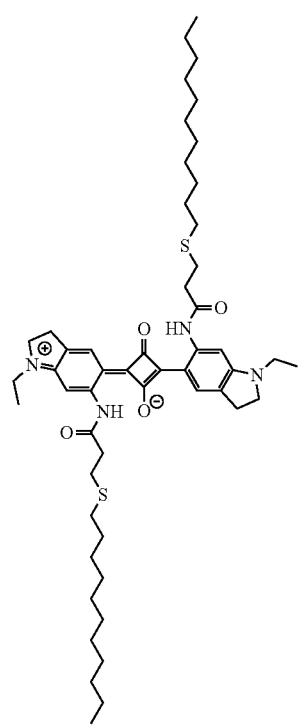
SQ42
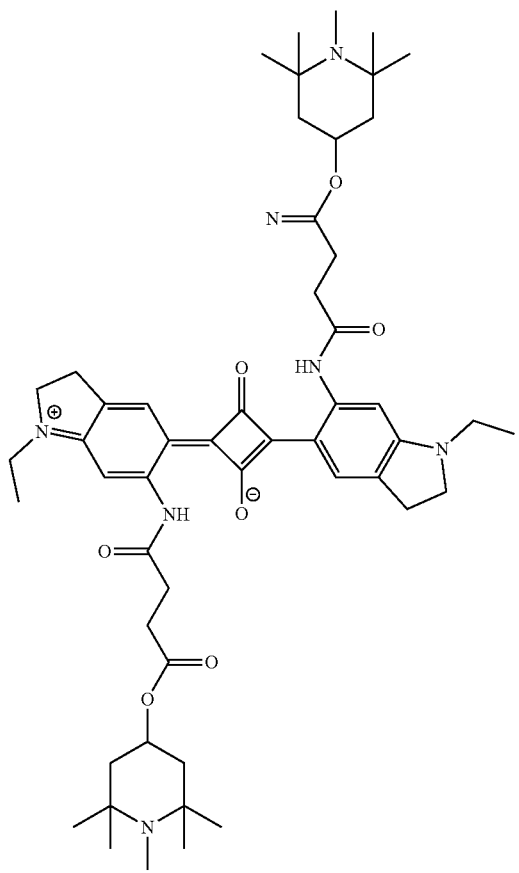
SQ44

45
-continued
SQ45
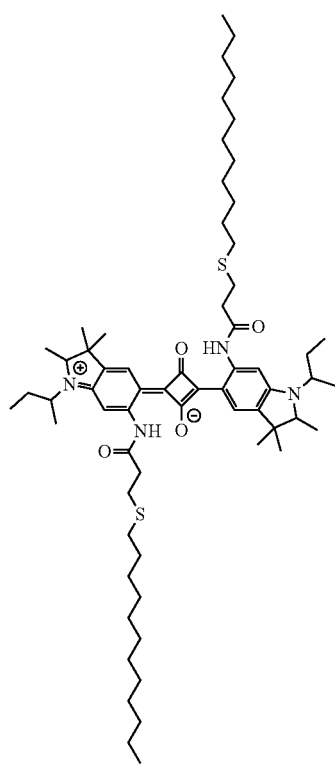
SQ46
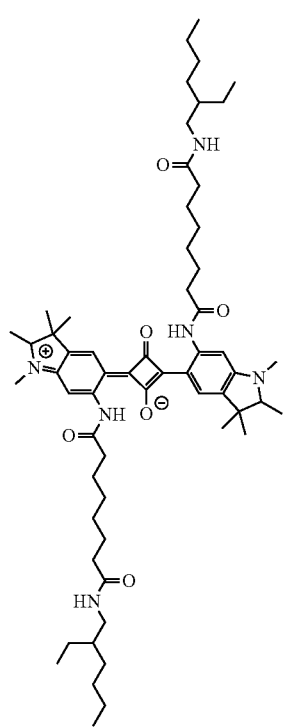
46
-continued
SQ47
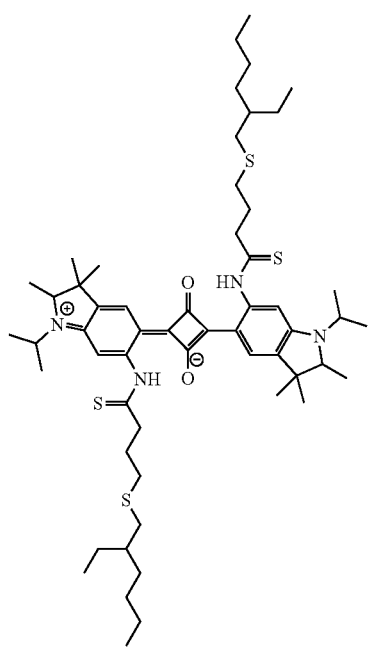
SQ48
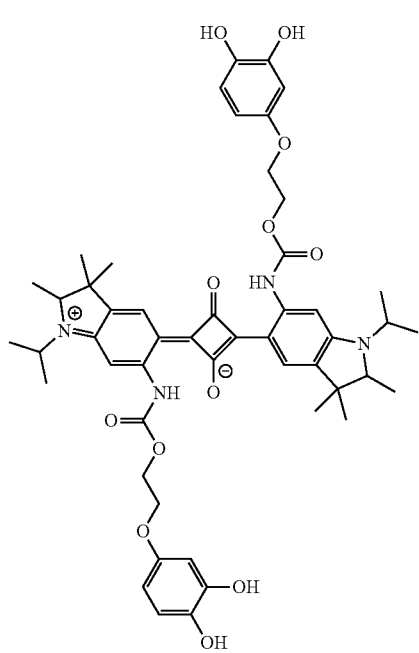

47
-continued
SQ49
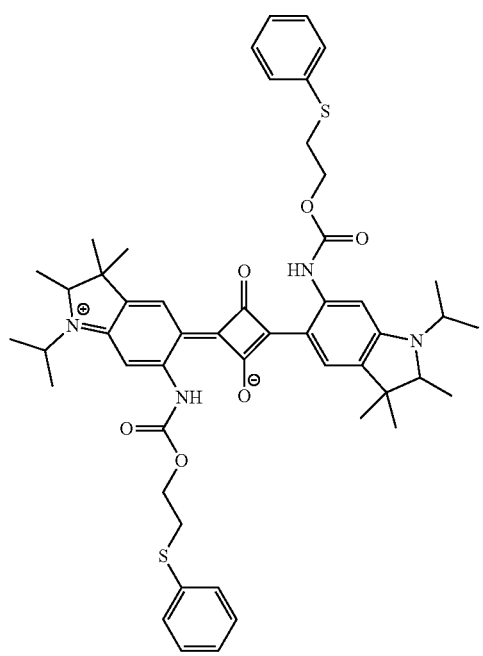
48
-continued
SQ51
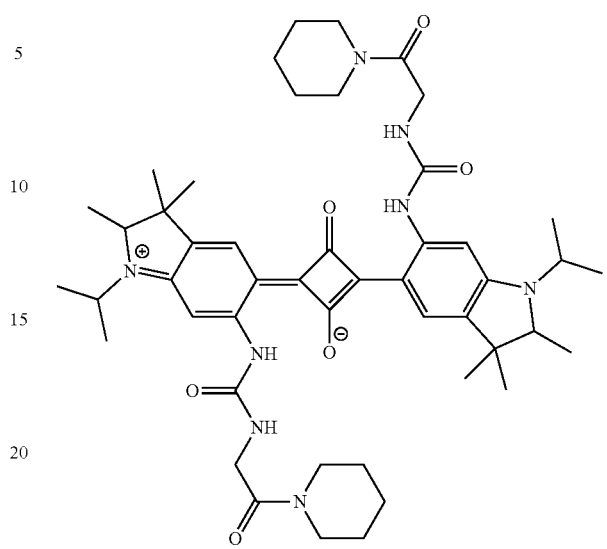
SQ50
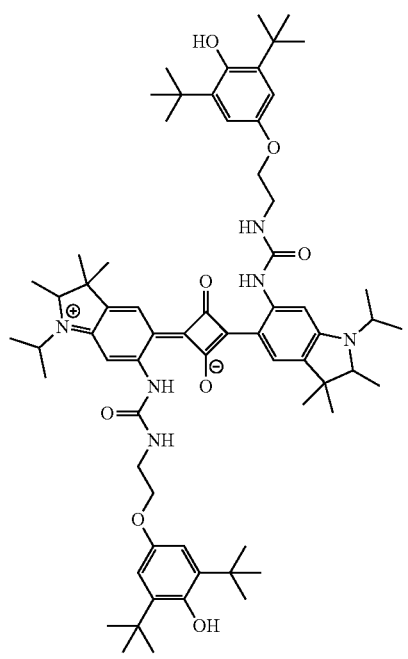
SQ52
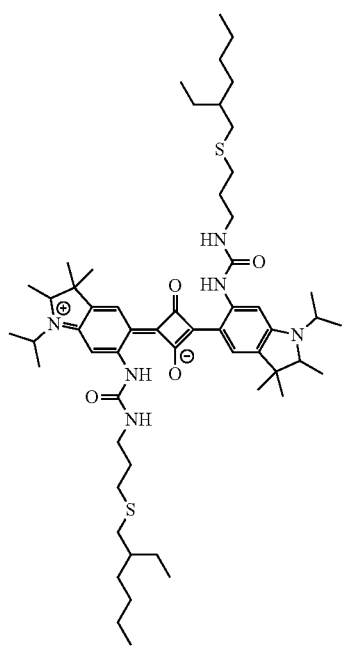

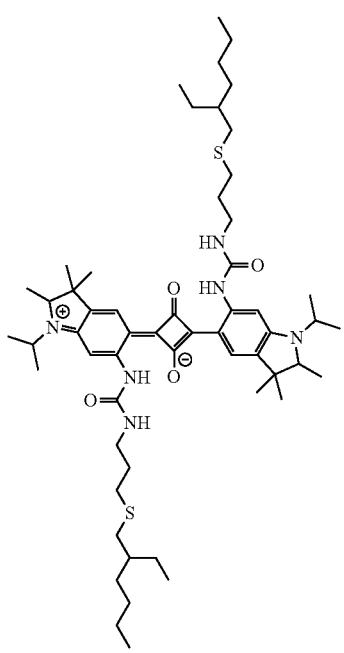
SQ54
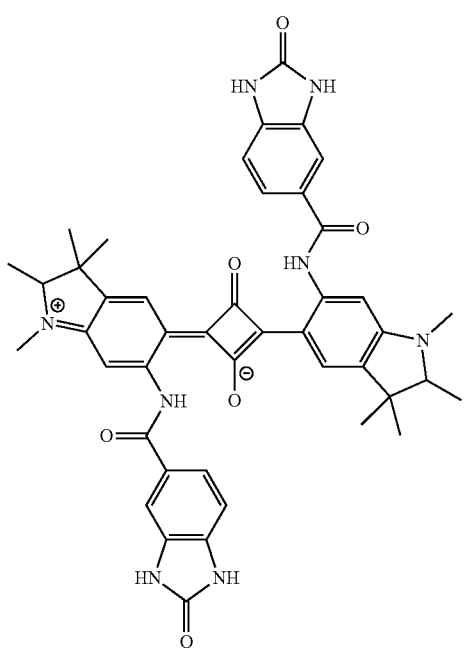
SQ53
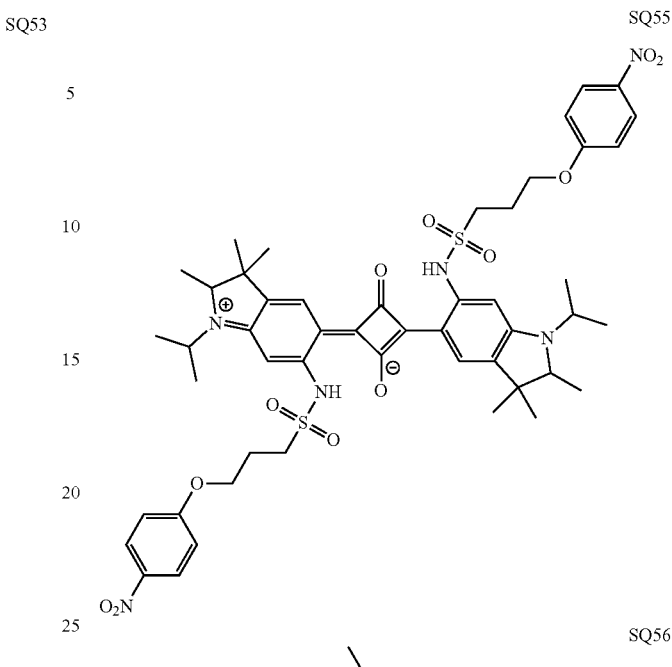
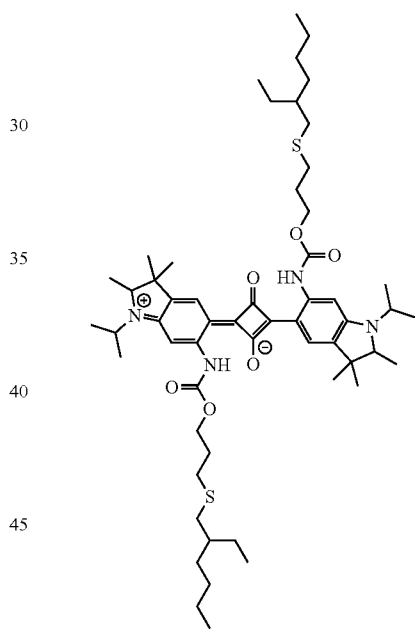
SQ57
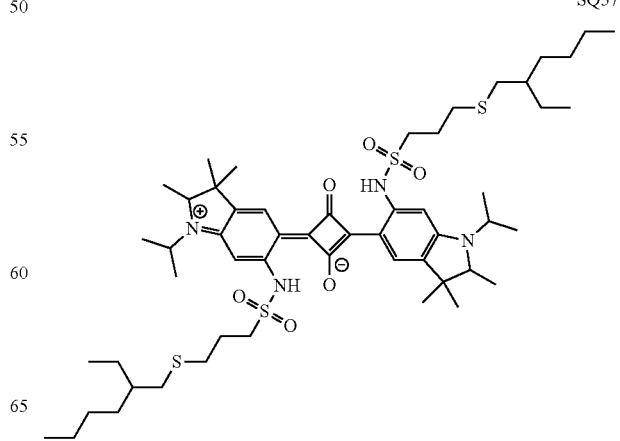

SQ58
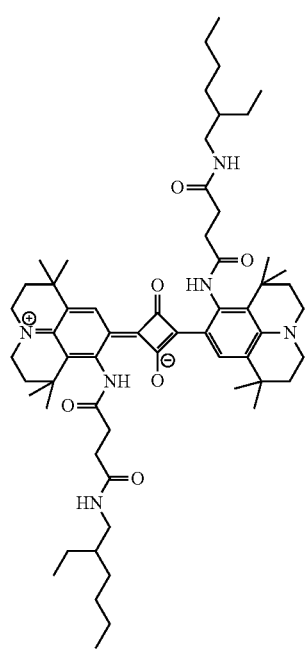
SQ60
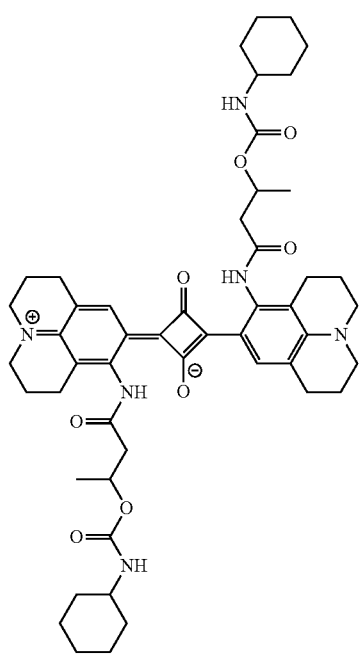
SQ59
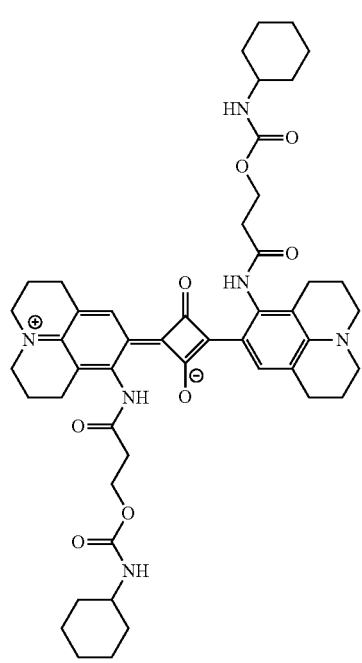
SQ61
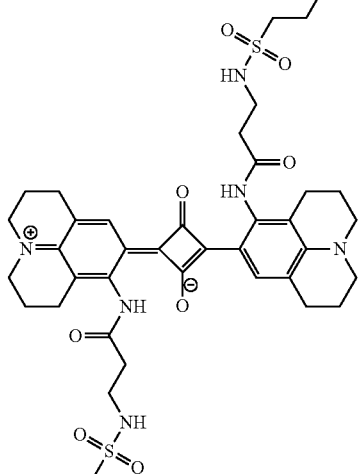

SQ62
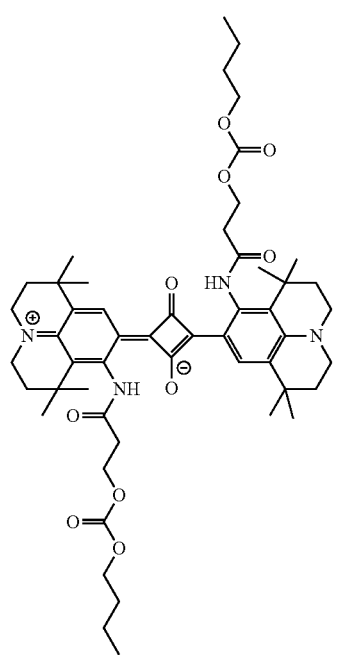
SQ63
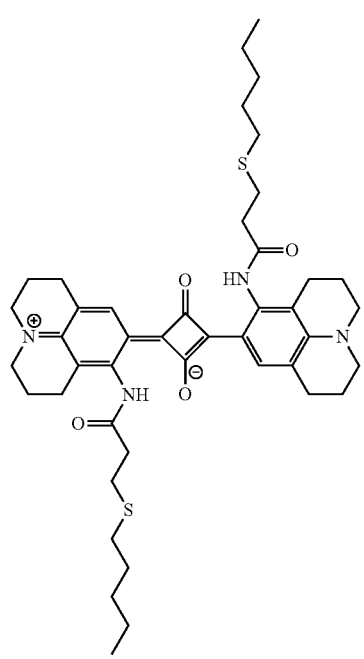
SQ64
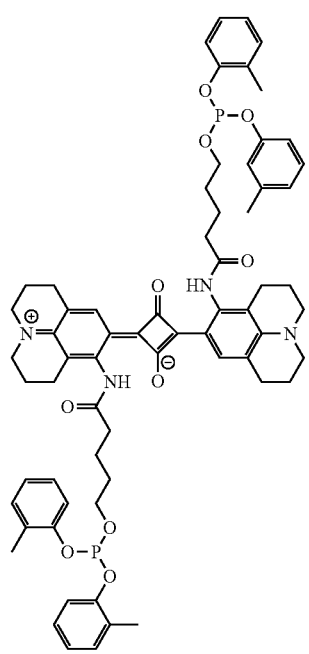
SQ65
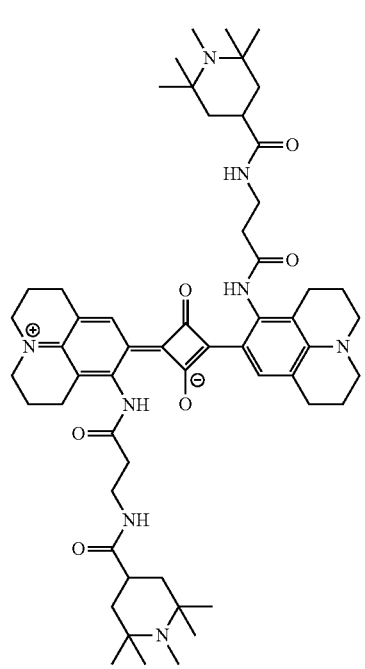

SQ66
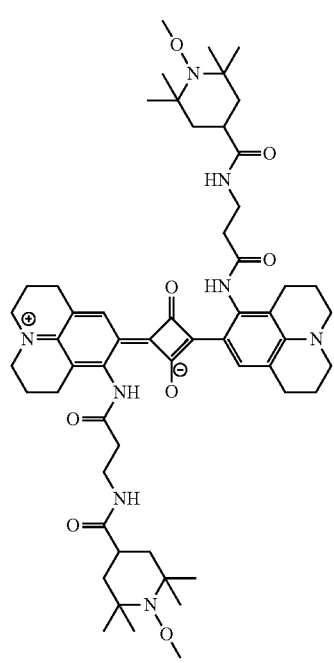
SQ68
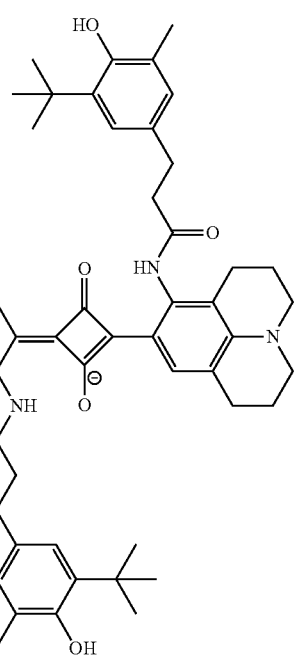
SQ67
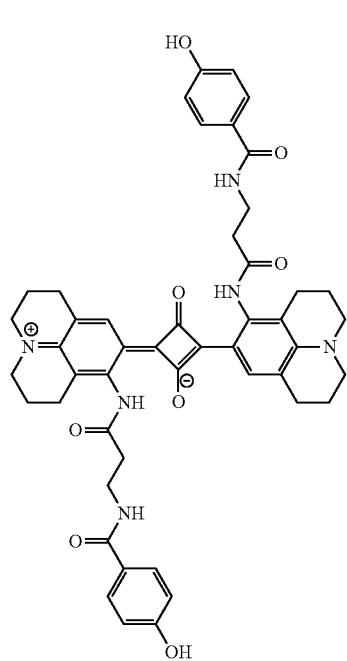
SQ69
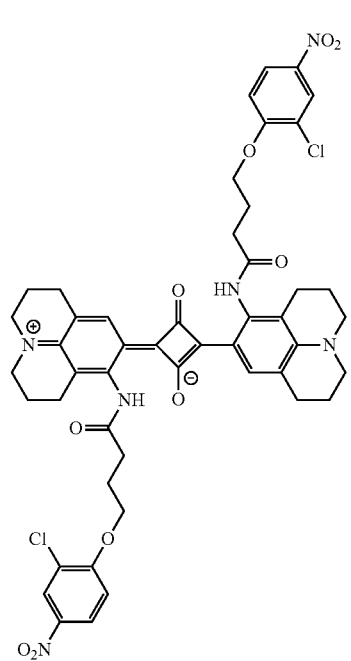

-continued
SQ70
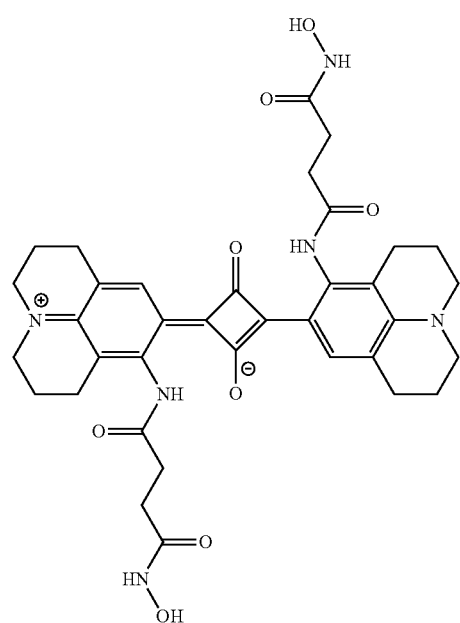
SQ71
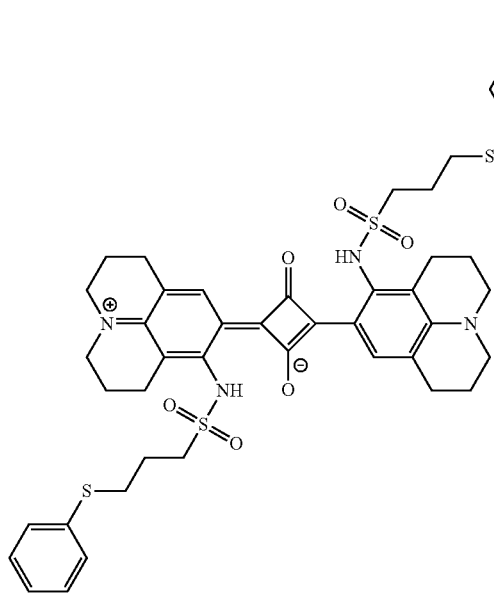
-continued
SQ72
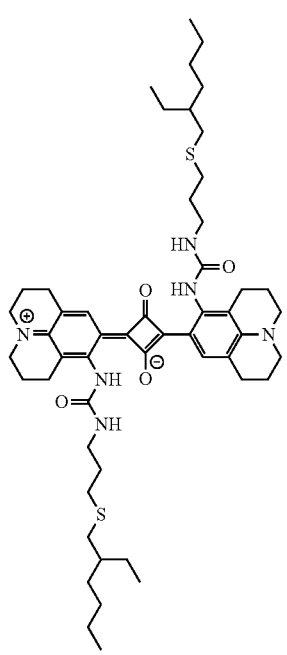
SQ73
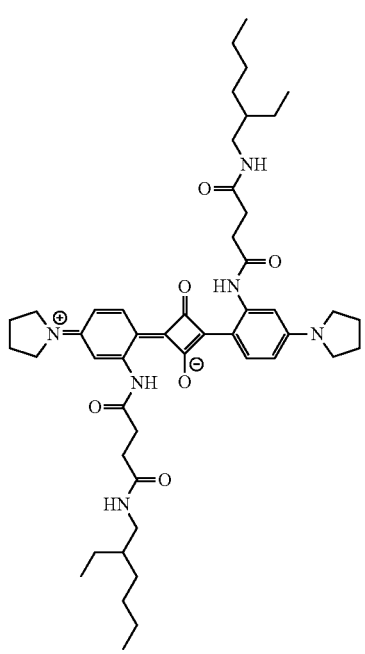

SQ74
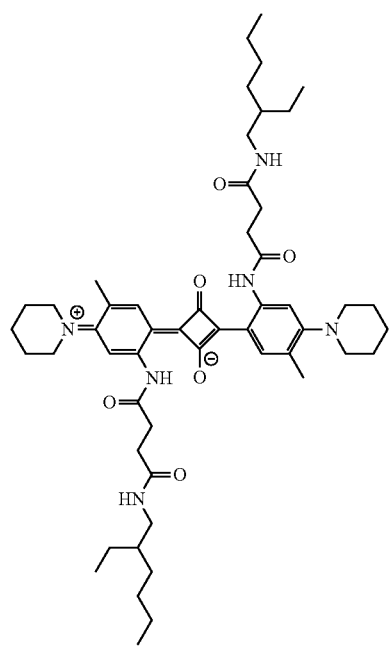
SQ75
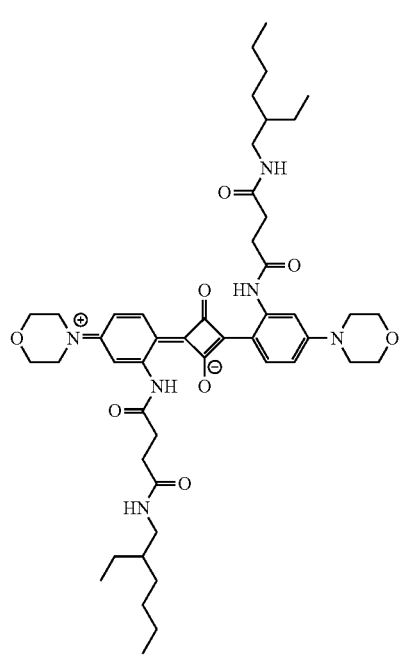
SQ76
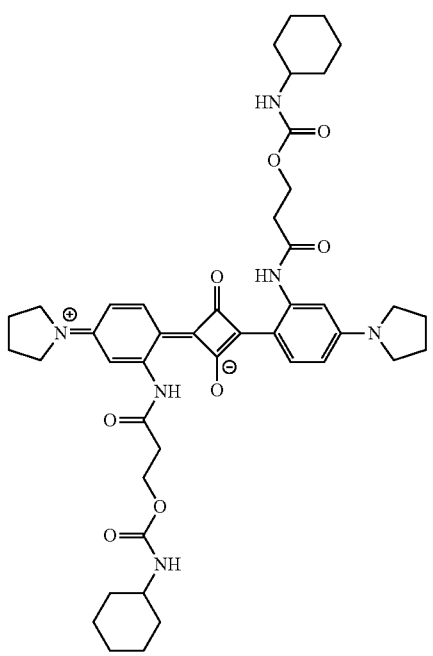
SQ77
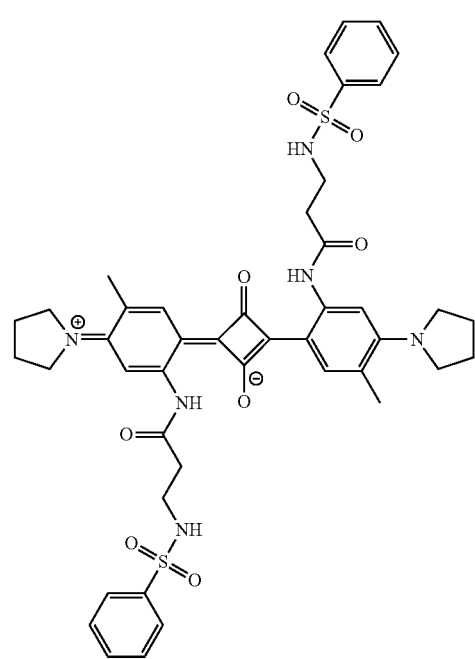

SQ78
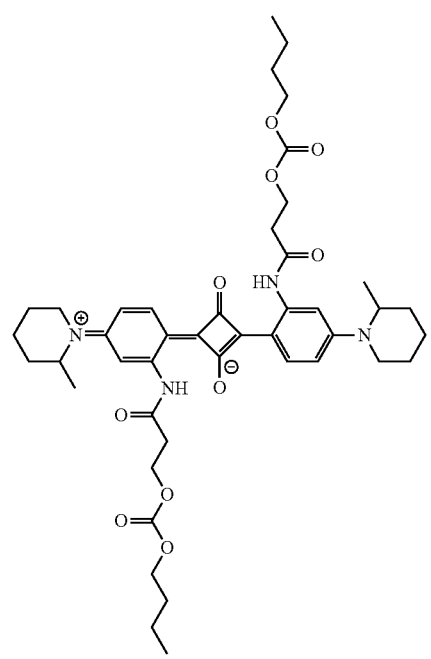
SQ80
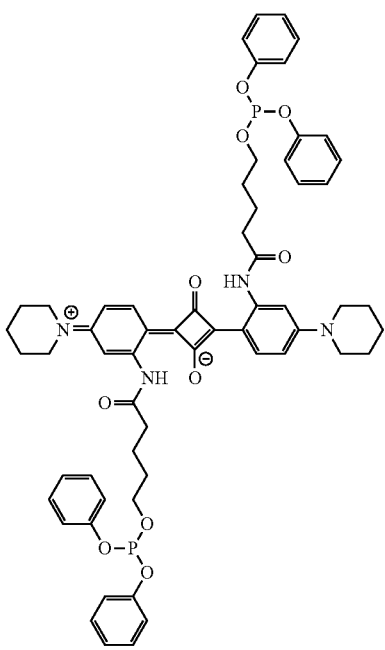
SQ79
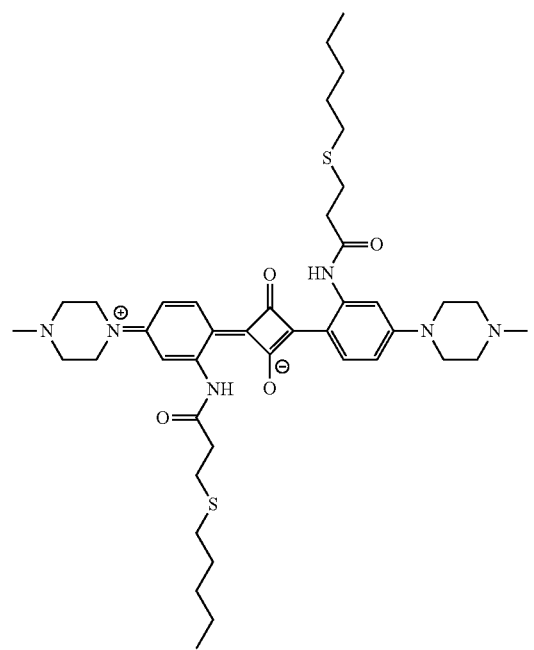
SQ81
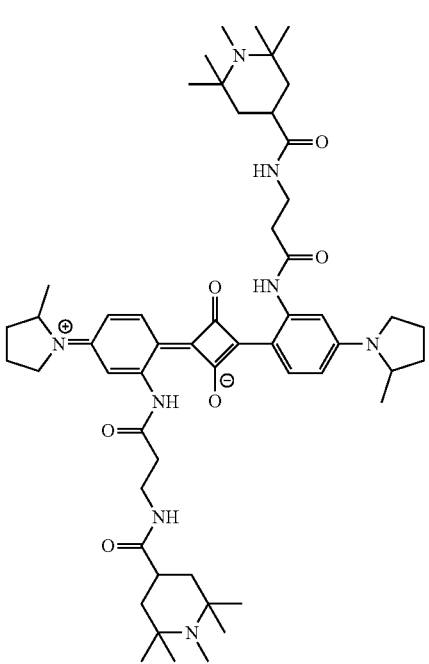

SQ82
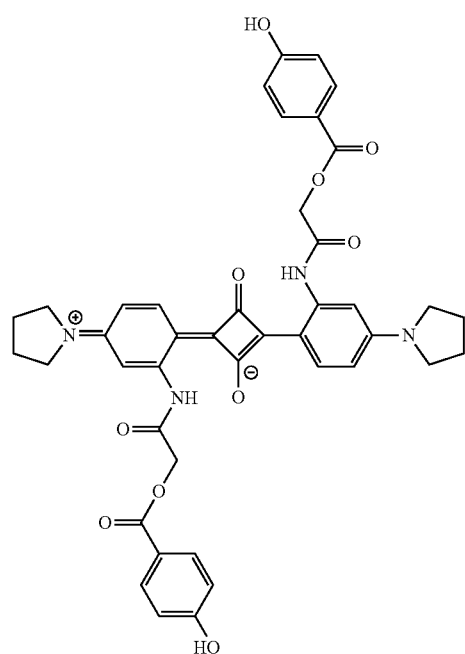
SQ84
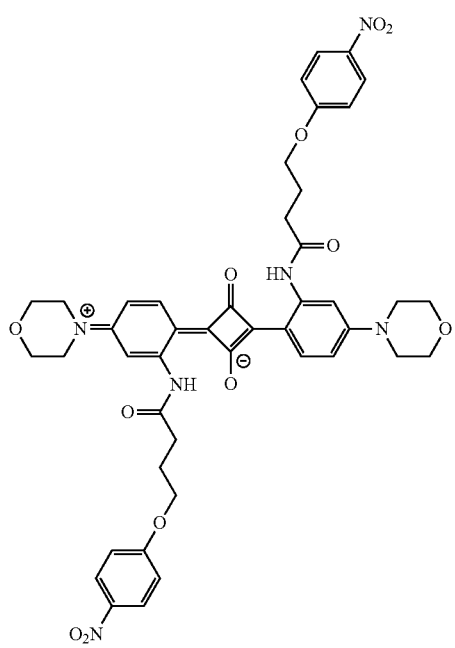
SQ83
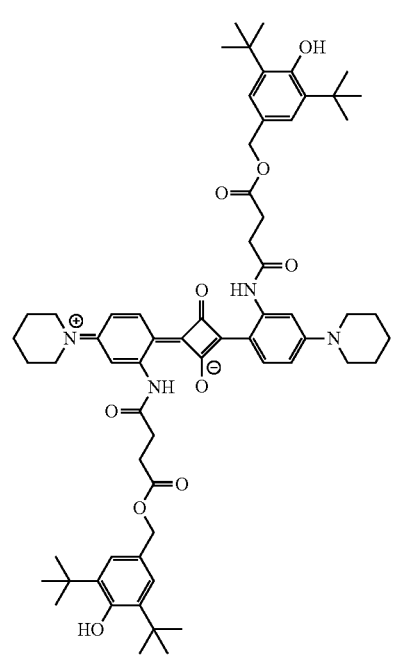
SQ85
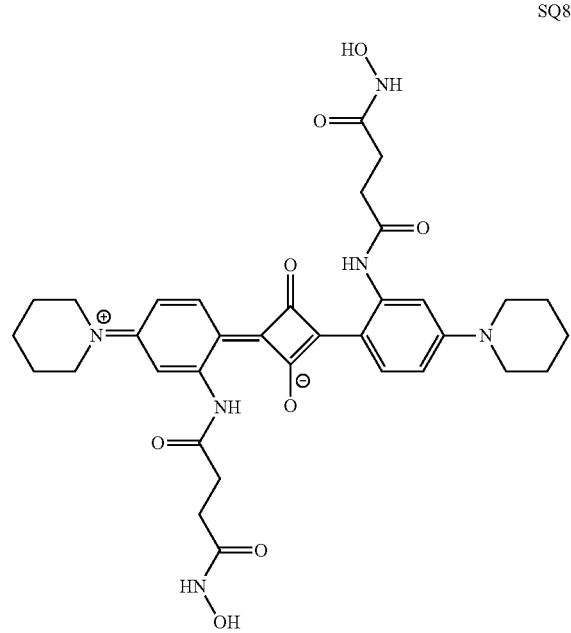

SQ86
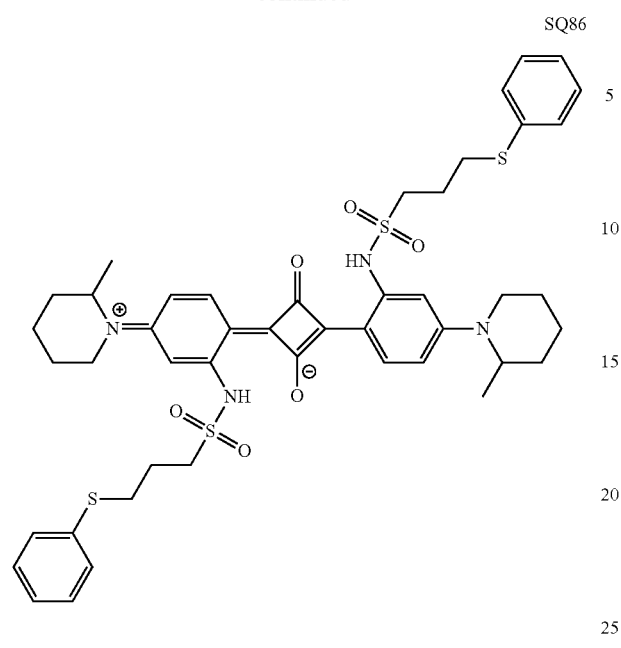
SQ88
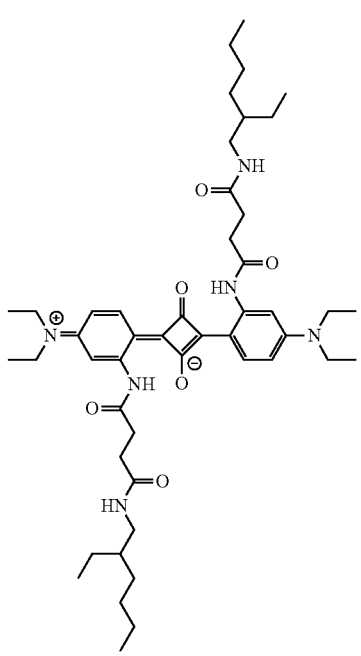
SQ87
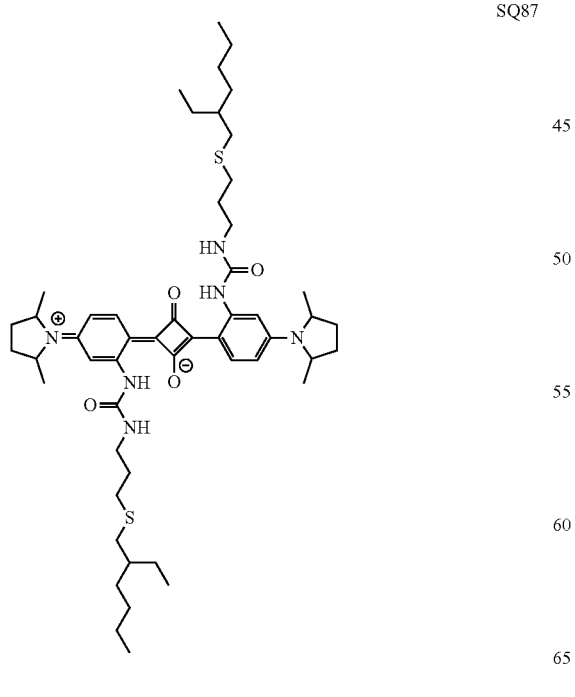
SQ89
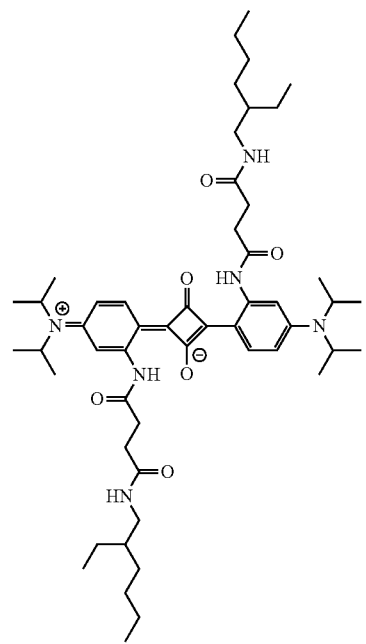

-continued
SQ90
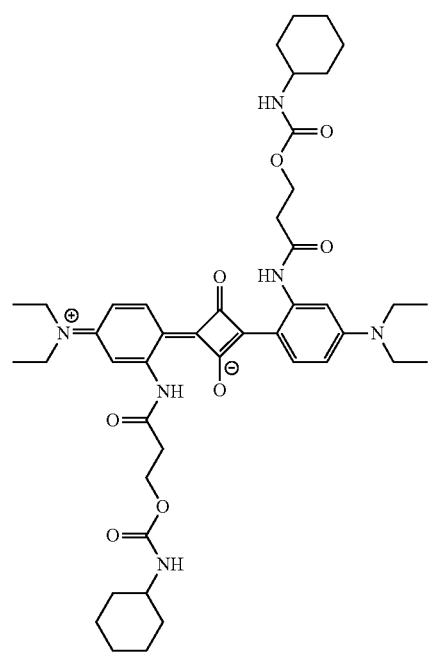
SQ91
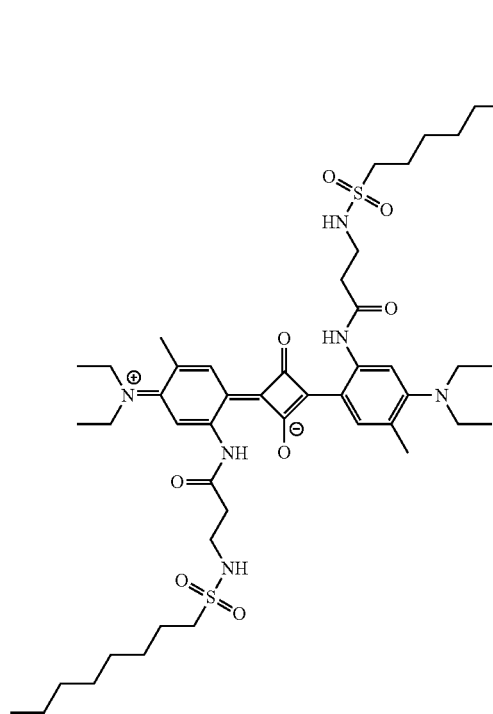
-continued
SQ92
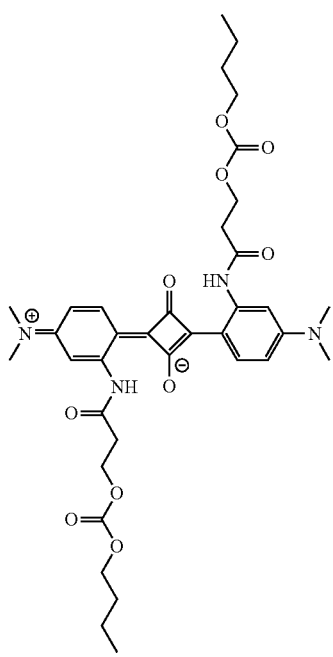
SQ93

SQ94
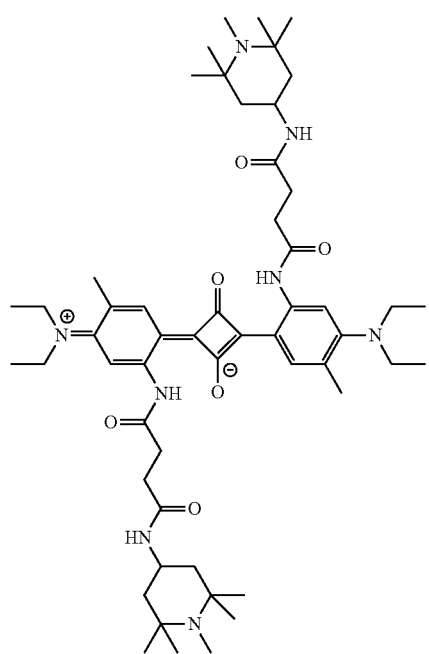
SQ96
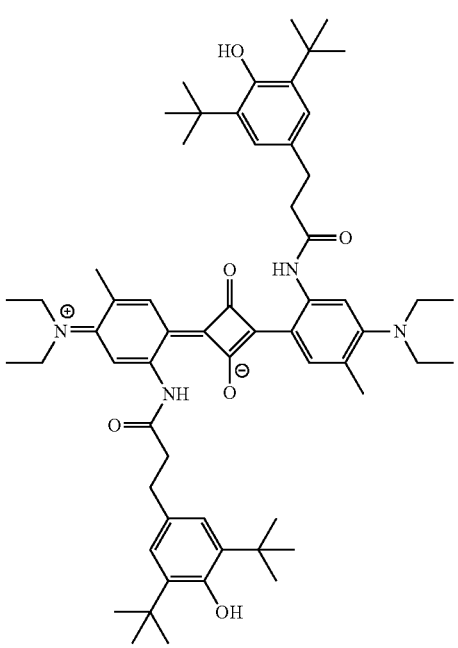
SQ95
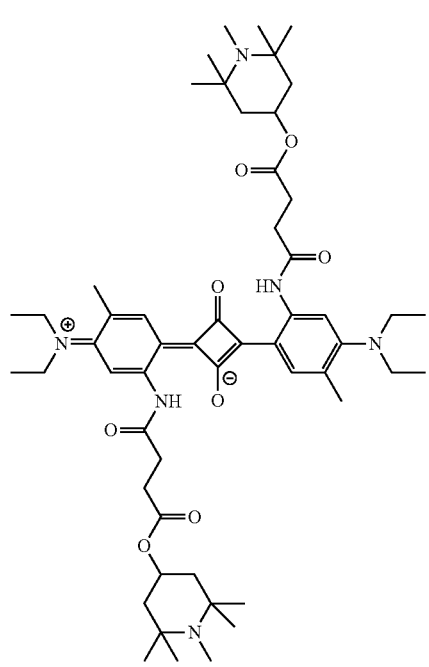
SQ97

-continued
SQ98
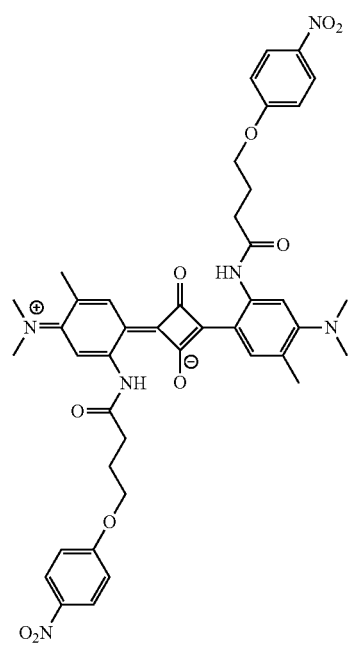
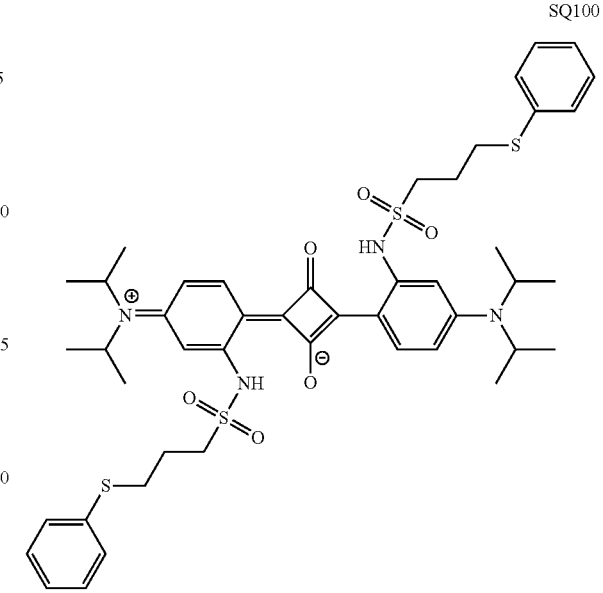
SQ100
SQ99
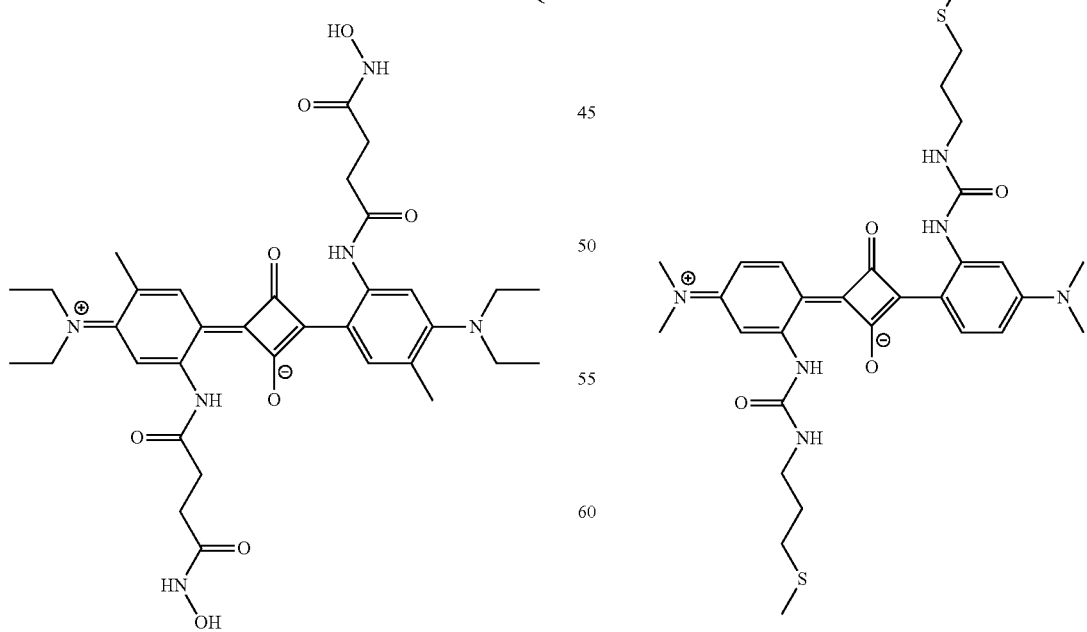
SQ101

SQ102
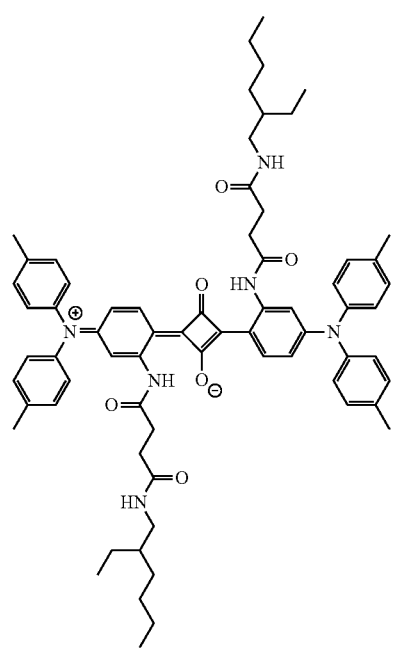
SQ104
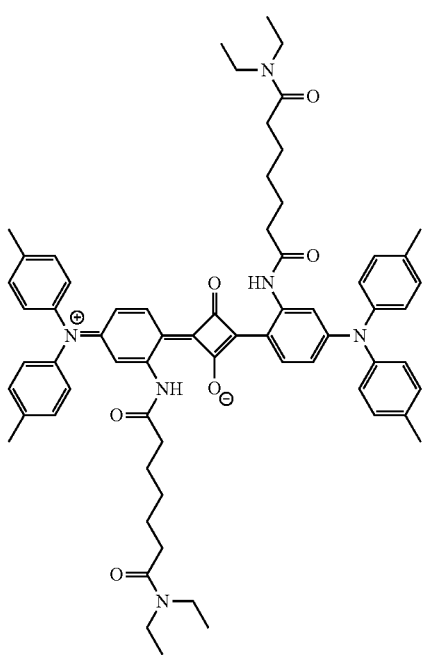
SQ103
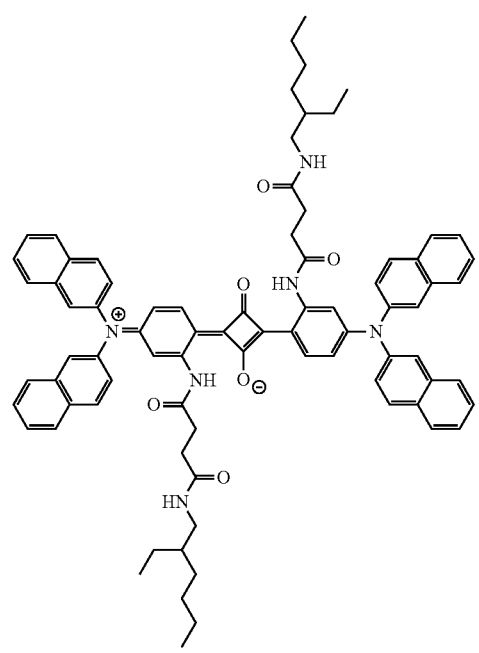
SQ105
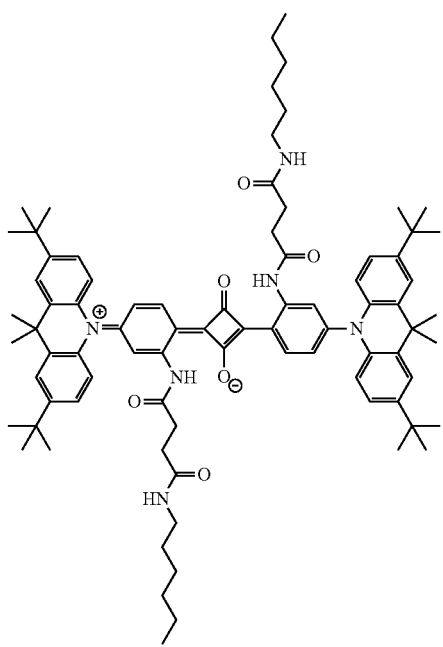

SQ106
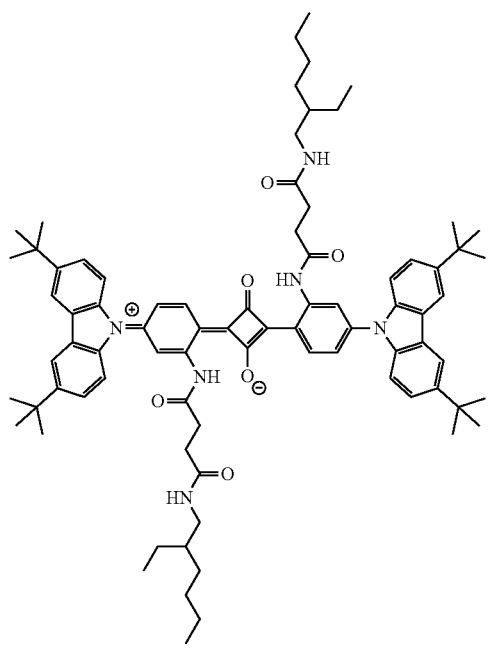
SQ108
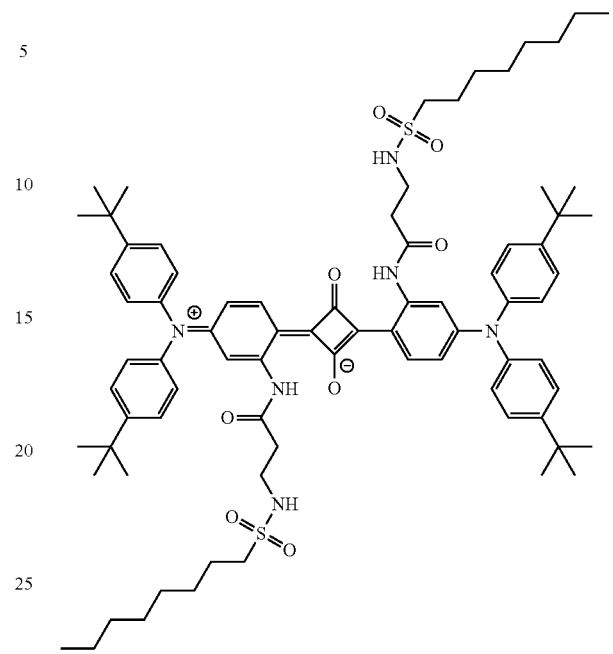
SQ107
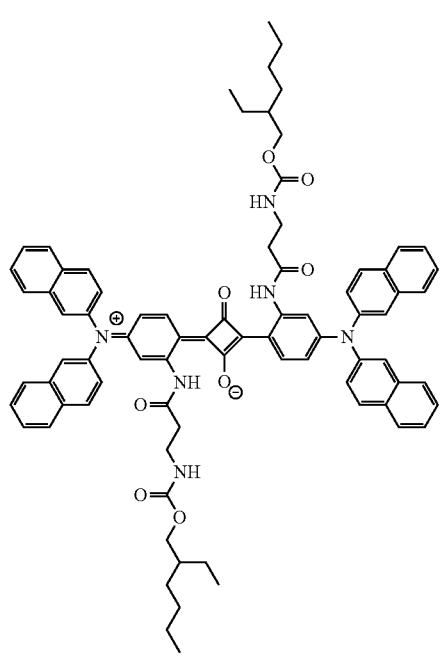
SQ109
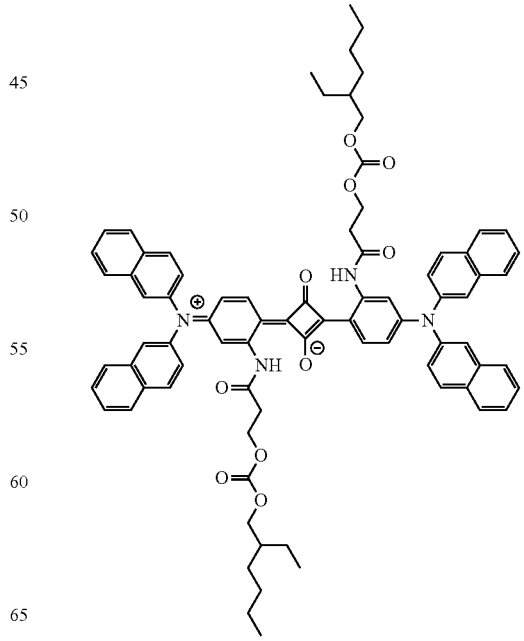

SQ110
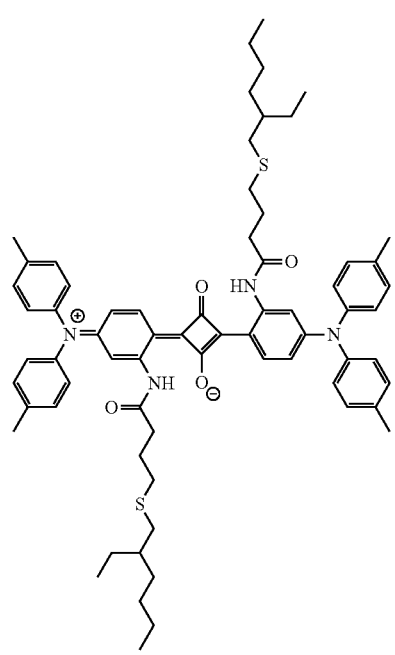
SQ111
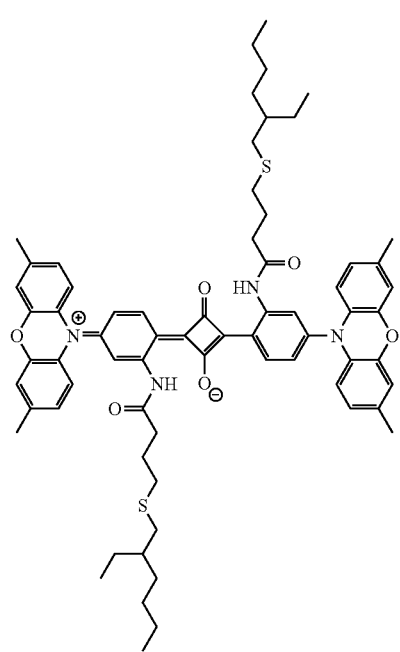
SQ112
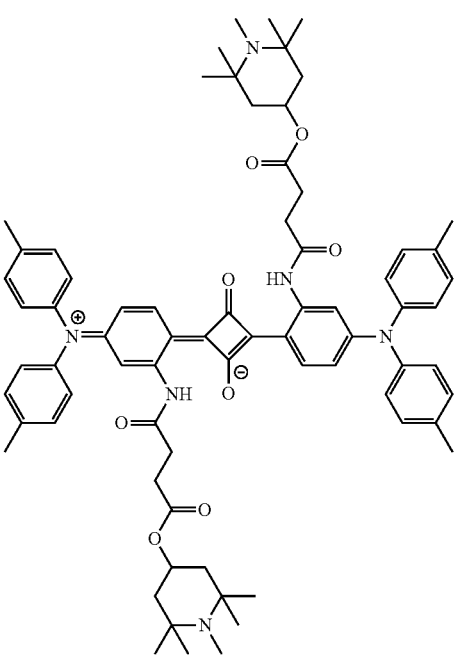
SQ113
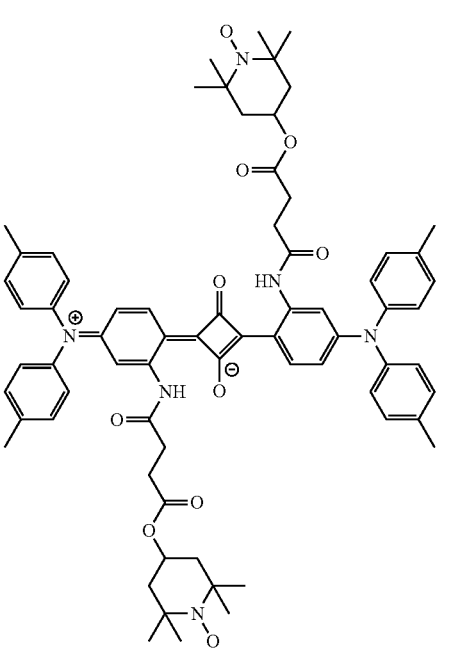

SQ114
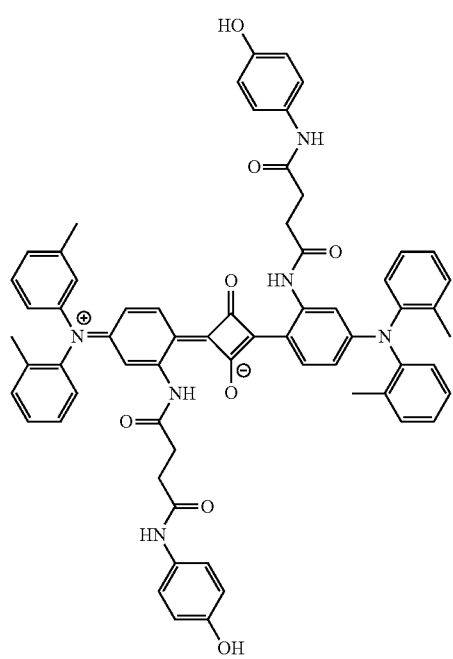
SQ116
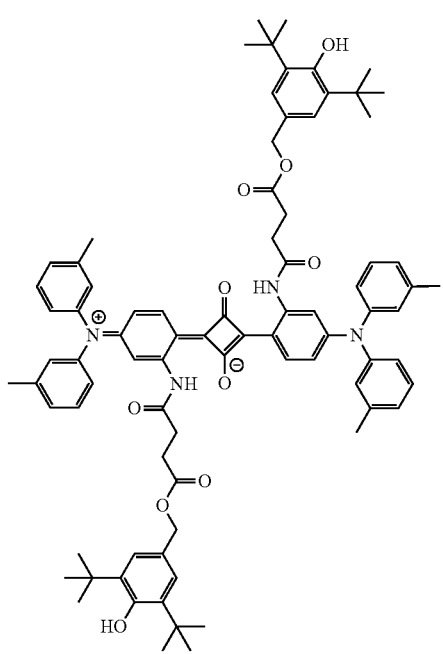
SQ115
SQ117
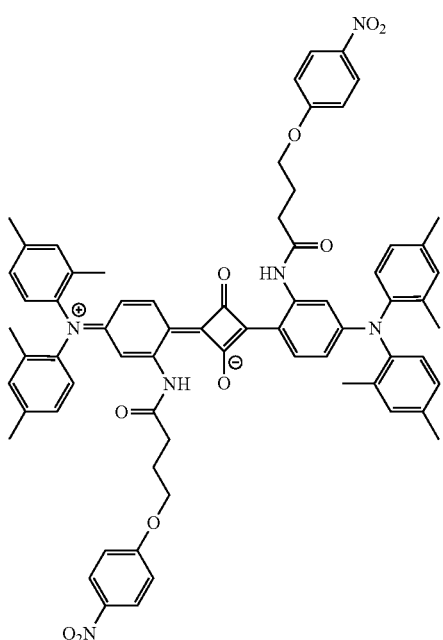

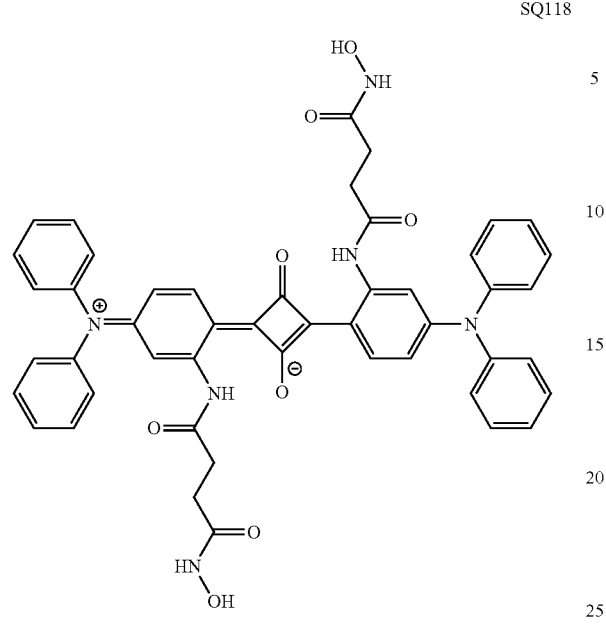
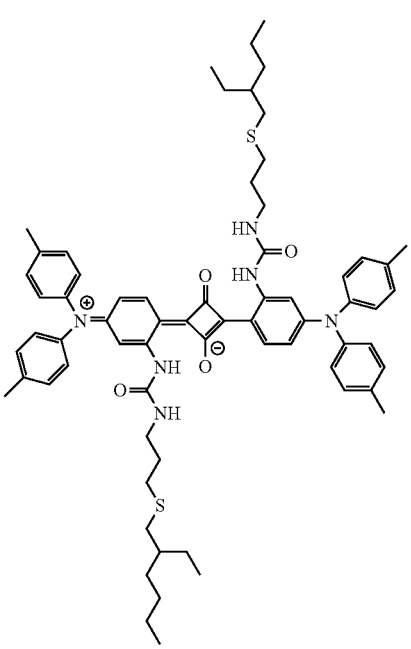

-continued
SQ122
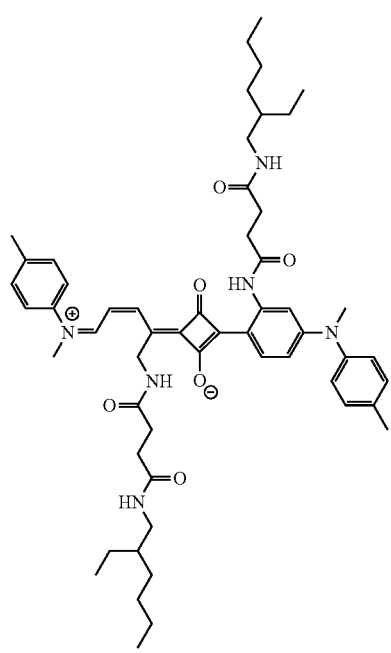
SQ123
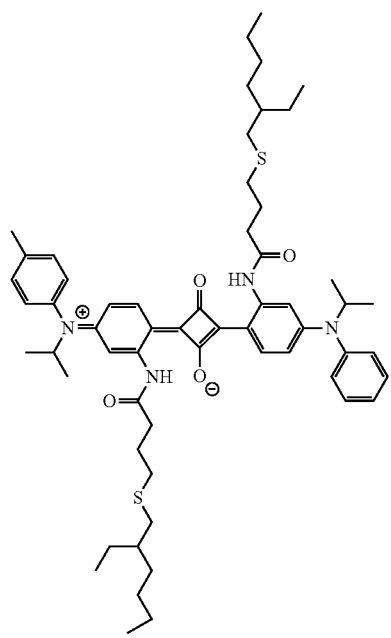
-continued
SQ124
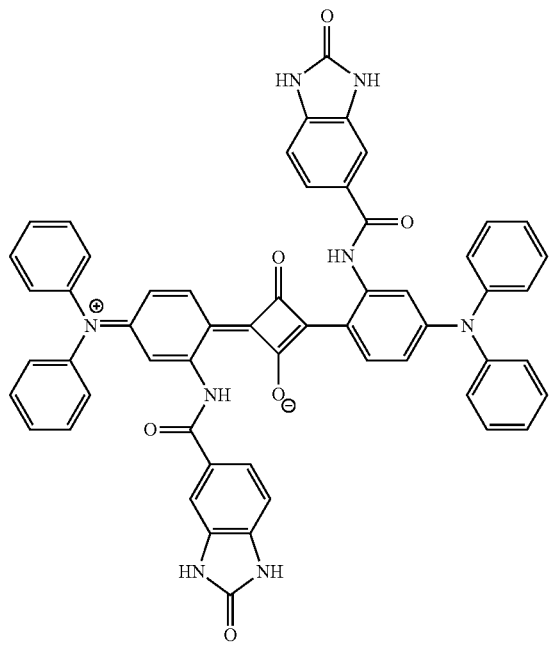
SQ125
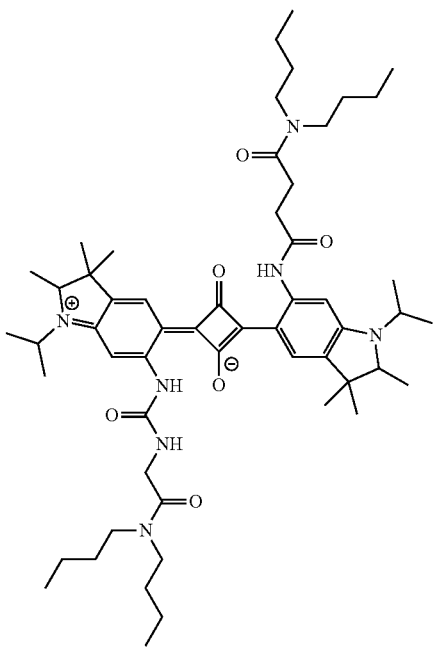

-continued
SQ126
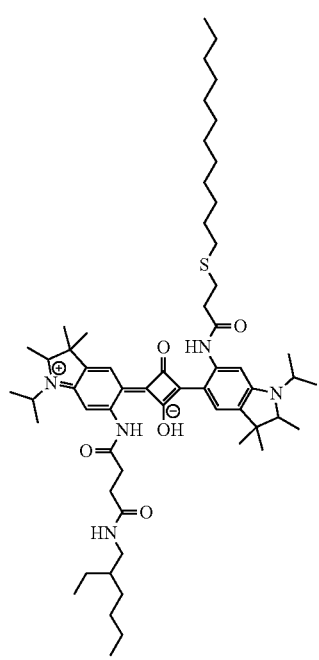
SQ128
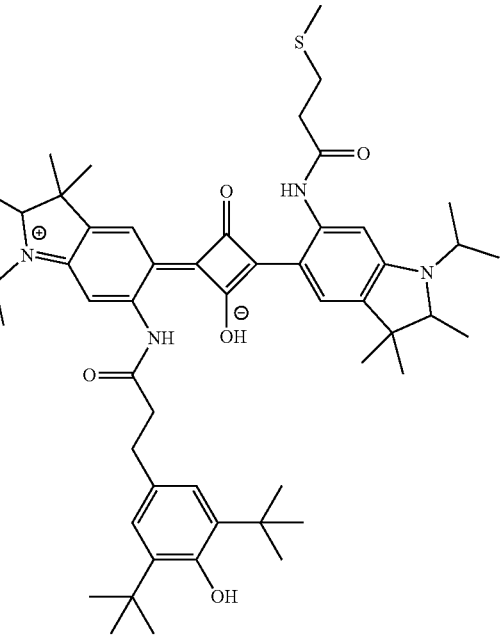
SQ127
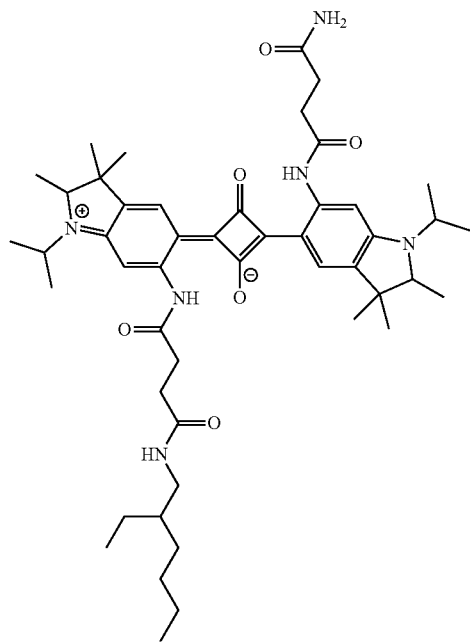
SQ129
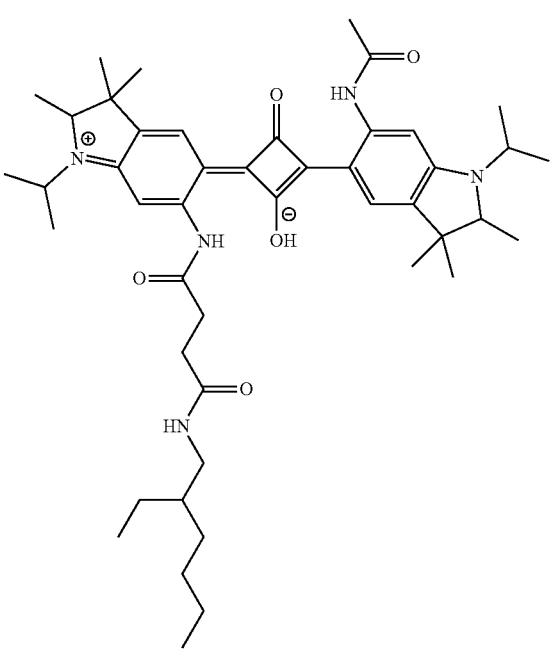

SQ130

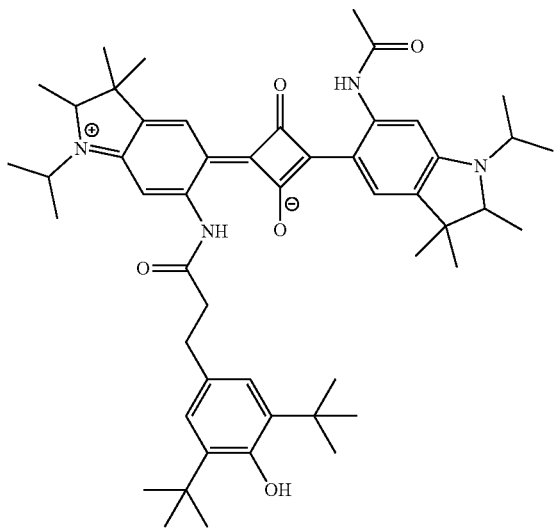

SQ132

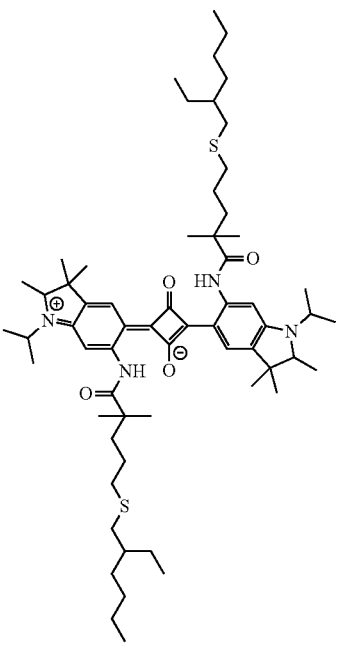

SQ131

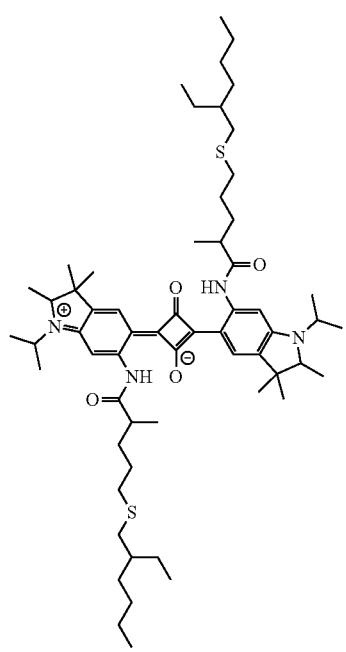

In the resin composition according to the embodiment of the present invention, the content of the squarylium compound (1) is preferably 0.1 to 70 mass % with respect to the total solid content of the resin composition according to the embodiment of the present invention. The lower limit is preferably 0.5 mass % or higher and more preferably 1.0 mass % or higher. The upper limit is preferably 60 mass % or lower, and more preferably 50 mass % or lower. In a case where the content of the squarylium compound (1) is in the above-described range, a film having excellent near infrared shielding properties, light fastness, and adhesiveness is likely to be formed. In a case where the resin composition according to the embodiment of the present invention includes two or more squarylium compounds (1), it is preferable that the total content of the two or more squarylium compounds (1) is in the above-described range.

<<Resin>>

The resin composition according to the embodiment of the present invention includes a resin. Examples of the resin include a compound including a repeating unit. Specific examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, a siloxane resin, and a urethane resin. Among these resins, one kind may be used alone, or a mixture of two or more kinds may be used. As the cyclic olefin resin, a norbornene resin can be preferably used from the viewpoint of improving heat resistance. Examples of a commercially available product of the norbornene resin include ARTON series (for example, ARTON F4520, manufactured by JSR Corporation). Examples of a commercially available product of the polyimide resin include NEOPULIM (registered trade name, manufactured by Mitsubishi Gas Chemical Company Inc.; for example, C3450). Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound. In addition, for example, as the epoxy resin, MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used. As the urethane resin, 8UH-1006 or 8UH-1012 (manufactured by Taisei Fine Chemical Co., Ltd.) can also be used. In addition, as the resin, a resin described in Examples of WO2016/088645A, a resin described in JP2017-057265A, a resin described in JP2017-032685A, a resin described in JP2017-075248A, or a resin described in JP2017-066240A can also be used, the contents of which are incorporated herein by reference. In addition, as the resin, a resin having a fluorene skeleton can also be preferably used. Examples of the resin having a fluorene skeleton include a resin having the following structure. In the following structural formula, A represents a residue of a carboxylic dianhydride selected from pyromellitic dianhydride, benzophenone tetracarboxylic dianhydride, biphenyl tetracarboxylic dianhydride, or diphenyl ether tetracarboxylic dianhydride, and M represents a phenyl group or a benzyl group. The details of the resin having a fluorene skeleton can be found in US2017/0102610A, the content of which is incorporated herein by reference.

examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxy group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

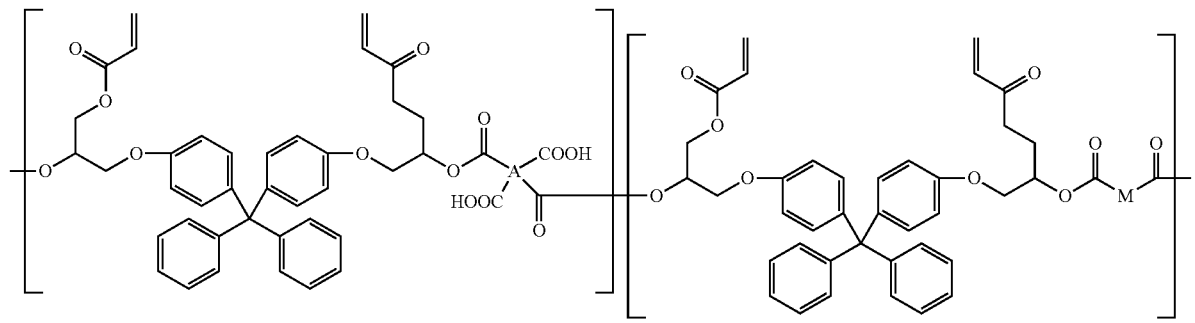

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher. In addition, in a case where the resin is an epoxy resin, the weight-average molecular weight (Mw) of the epoxy resin is preferably 100 or higher and more preferably 100 to 2000000. The upper limit is preferably 1000000 or lower and more preferably 500000 or lower. The lower limit is more preferably 200 or higher.

The resin used in the present invention may have an acid group. Examples of the acid group include a carboxyl group, a phosphate group, a sulfo group, and a phenolic hydroxy group. Among these, a carboxyl group is preferable. Among these acid groups, one kind may be used alone, or two or more kinds may be used in combination. The resin having an acid group can also be used as an alkali-soluble resin.

As the resin having an acid group, a polymer having a carboxyl group at a side chain is preferable. Specific As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer that includes a repeating unit derived from monomer components including a compound represented by the following Formula (ED1) and/or a compound represented by the following Formula (ED2) (hereinafter, these compounds will also be referred to as "ether dimer") is also preferable.

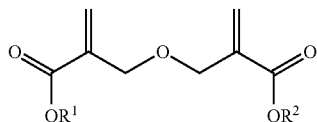
(ED1)

In Formula (ED1), $R^1$ and $R^2$ each independently represent a hydrogen atom or a hydrocarbon group having 1 to 25 carbon atoms which may have a substituent.

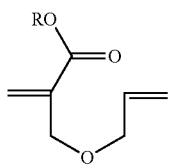
(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

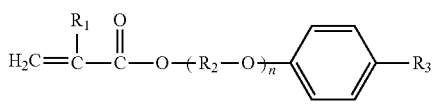
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

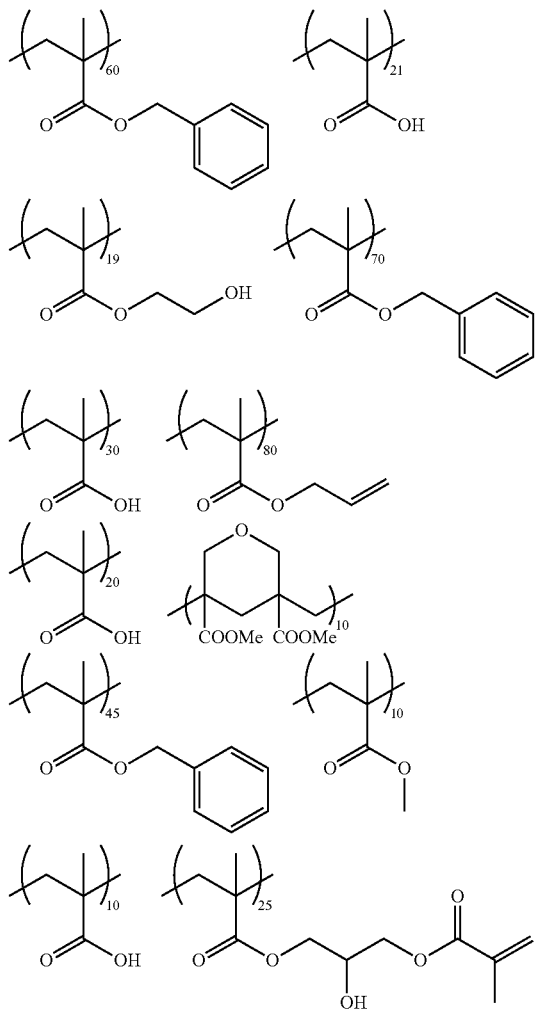

The resin used in the present invention may have a crosslinking group. In the present invention, the crosslinking group refers to a group which reacts due to the action of heat, light or a radical to form a chemical bond. Specific examples of the crosslinking group include a group having an ethylenically unsaturated bond, a cyclic ether group, a methylol group, an alkoxysilyl group, and a chlorosilyl group. Examples of the resin having a crosslinking group include a resin including a constitutional unit having a crosslinking group and the above-described epoxy resin. Examples of the constitutional unit having a crosslinking group include the following (A2-1) to (A2-4).

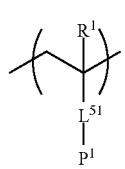
(A2-1)

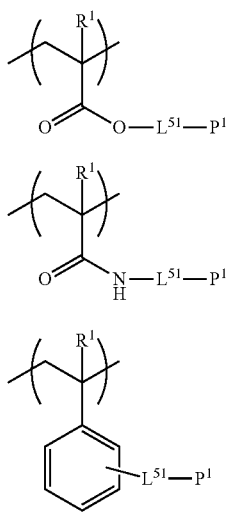

(A2-2)

(A2-3)

(A2-4)

$R^1$ represents a hydrogen atom or an alkyl group. The number of carbon atoms in the alkyl group is preferably 1 to 5, more preferably 1 to 3, and still more preferably 1. It is preferable that $R^1$ represents a hydrogen atom or a methyl group.

$L^{51}$ represents a single bond or a divalent linking group. Examples of the divalent linking group include an alkylene group, an arylene group, —O—, —S—, —CO—, —COO—, —OCO—, —SO$_2$—, —NR$^{10}$— (R$^{10}$ represents a hydrogen atom or an alkyl group and preferably a hydrogen atom), and a group including a combination thereof. Among these, a group including a combination —O— and at least one of an alkylene group, an arylene group, or an alkylene group is preferable. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

$P^1$ represents a crosslinking group. Examples of the crosslinking group include a group having an ethylenically unsaturated bond, a cyclic ether group, a methylol group, an alkoxysilyl group, and a chlorosilyl group. Among these, a group having an ethylenically unsaturated bond, a cyclic ether group, an alkoxysilyl group, or a chlorosilyl group is preferable. Examples of the group having an ethylenically unsaturated bond include a vinyl group, a (meth)allyl group, a (meth)acryloyl group, and a (meth)acryloyloxy group. Examples of the cyclic ether group include an epoxy group (an oxiranyl group) and an oxetanyl group. Examples of the alkoxysilyl group include a monoalkoxysilyl group, a dialkoxysilyl group, and a trialkoxysilyl group. As the group having an ethylenically unsaturated bond, a (meth)acryloyl group or a (meth)acryloyloxy group is preferable. As the cyclic ether group, an epoxy group is preferable. As the alkoxysilyl group, a dialkoxysilyl group or a trialkoxysilyl group is preferable. In addition, the number of carbon atoms in the alkoxy group of the alkoxysilyl group is preferably 1 to 5, more preferably 1 to 3, and still more preferably 1 or 2. Examples of the chlorosilyl group include a monochlorosilyl group, a dichlorosilyl group, and a trichlorosilyl group. Among these, a dichlorosilyl group or a trichlorosilyl group is preferable, and a trichlorosilyl group is more preferable.

Examples of the resin having a crosslinking group include resins having the following structures. In the following structural formulae, Me represents a methyl group. In addition, examples of a commercially available product of the resin having a crosslinking group include DIANAL NR series (manufactured by Mitsubishi Rayon Co., Ltd.), PHOTOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

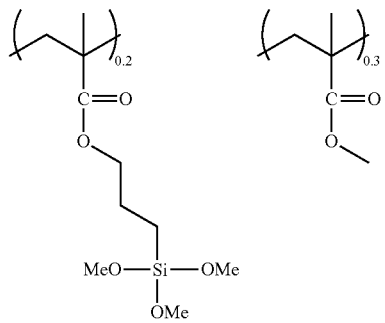

It is also preferable that the resin used in the present invention is a resin having a repeating unit represented by any one of Formulae (A3-1) to (A3-7).

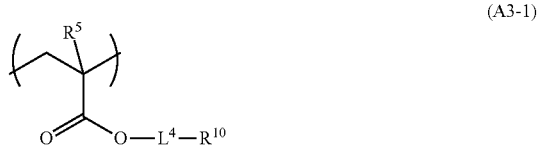

(A3-1)

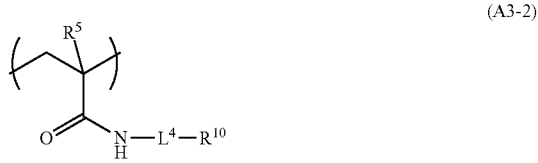

(A3-2)

(A3-3)

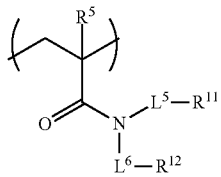
(A3-4)

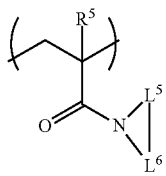
(A3-5)

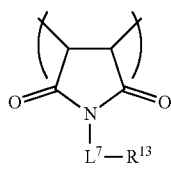
(A3-6)

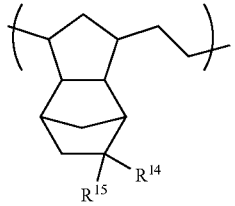
(A3-7)

In the formulae, $R^5$ represents a hydrogen atom or an alkyl group, $L^4$ to $L^7$ each independently represent a single bond or a divalent linking group, and $R^{10}$ to $R^{13}$ each independently represent an alkyl group or an aryl group. $R^{14}$ and $R^{15}$ each independently represent a hydrogen atom or a substituent.

The number of carbon atoms in the alkyl group represented by $R^5$ is preferably 1 to 5, more preferably 1 to 3, and still more preferably 1. It is preferable that $R^5$ represents a hydrogen atom or a methyl group.

Examples of the divalent linking group represented by $L^4$ to $L^7$ include an alkylene group, an arylene group, —O—, —S—, —CO—, —COO—, —OCO—, —SO$_2$—, —NR$^{10}$— ($R^{10}$ represents a hydrogen atom or an alkyl group and preferably a hydrogen atom), and a group including a combination thereof. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

The alkyl group represented by $R^{10}$ to $R^{13}$ may be linear, branched, or cyclic and is preferably cyclic. The alkyl group may have a substituent or may be unsubstituted. The number of carbon atoms in the alkyl group is preferably 1 to 30, more preferably 1 to 20, and still more preferably 1 to 10. The number of carbon atoms in the aryl group represented by $R^{10}$ to $R^{13}$ is preferably 6 to 18, more preferably 6 to 12, and still more preferably 6. It is preferable that $R^{10}$ represents a cyclic alkyl group or an aryl group. It is preferable that $R^{11}$ and $R^{12}$ represent a linear or branched alkyl group.

It is preferable that $R^{13}$ represents a linear alkyl group, a branched alkyl group, or an aryl group.

Examples of the substituent represented by $R^{14}$ and $R^{15}$ include a halogen atom, a cyano group, a nitro group, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, —NR$^{a1}$R$^{a2}$, —COR$^{a3}$, —COOR$^{a4}$, —OCOR$^{a5}$, —NHCOR$^{a6}$, —CONR$^{a7}$R$^{a8}$, —NHCONR$^{a9}$R$^{a10}$, —NHCOOR$^{a11}$, —SO$_2$R$^{a12}$, —SO$_2$OR$^{a13}$, —NHSO$_2$R$^{a14}$, and —SO$_2$NR$^{a15}$R$^{a16}$. $R^{a1}$ to $R^{a16}$ each independently represent a hydrogen atom, an alkyl group, an alkenyl group, an alkynyl group, an aryl group, or a heteroaryl group. In particular, it is preferable that at least one of $R^{14}$ or $R^{15}$ represents a cyano group or —COOR$^{a4}$. It is preferable that $R^{a4}$ represents a hydrogen atom, an alkyl group, or an aryl group.

Examples of a commercially available product of the resin having a repeating unit represented by Formula (A3-7) include ARTON F4520 (manufactured by JSR Corporation). In addition, the details of the resin having a repeating unit represented by Formula (A3-7) can be found in paragraphs "0053" to "0075" and "0127" to "0130" of JP2011-100084A, the content of which is incorporated herein by reference.

The resin composition according to the embodiment of the present invention may include a resin as a dispersant. In particular, in a case where the resin composition according to the embodiment of the present invention includes a pigment, it is preferable that the resin composition includes a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference.

In addition, in the present invention, as the resin, an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain including a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0174" of JP2012-255128A, the content of which is incorporated herein by reference.

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

The content of the resin is preferably 1 to 80 mass % with respect to the total solid content of the resin composition. The lower limit is preferably 5 mass % or higher, more preferably 10 mass % or higher, still more preferably 15 mass % or higher, and still more preferably 20 mass % or higher. The upper limit is preferably 70 mass %% or lower, more preferably 60 mass % or lower, still more preferably 50 mass % or lower, and still more preferably 40 mass % or lower.

In addition, the content of the resin having an acid group is preferably 0.1 to 50 mass % with respect to the total solid content of the resin composition. The lower limit is preferably 0.5 mass % or higher, more preferably 1 mass % or higher, still more preferably 2 mass % or higher, and still more preferably 3 mass % or higher. The upper limit is more preferably 30 mass % or lower, and still more preferably 20 mass % or lower.

In addition, in a case where the resin composition includes a dispersant as the resin, the content of the dispersant is preferably 0.1 to 40 mass % with respect to the total solid content of the resin composition. The upper limit is preferably 20 mass % or lower, and more preferably 10 mass % or lower. The lower limit is preferably 0.5 mass % or higher and more preferably 1 mass % or higher. The content of the dispersant is preferably 1 to 100 parts by mass with respect to 100 parts by mass of the pigment. The upper limit is preferably 80 parts by mass or less and more preferably 75 parts by mass or less. The lower limit is preferably 2.5 parts by mass or more and more preferably 5 parts by mass or more.

The resin composition according to the embodiment of the present invention may include one resin or two or more resins. In a case where the composition includes two or more resins, it is preferable that the total content of the two or more resins is in the above-described range.

<<Other Near Infrared Absorbing Colorant>>

The resin composition according to the embodiment of the present invention may further include near infrared absorbing colorants (hereinafter, also referred to as "other near infrared absorbing colorant") other than the squarylium compound (1). As the other near infrared absorbing colorant, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, a phthalocyanine compound, a naphthalocyanine compound, or a diimmonium compound is more preferable, at least one selected from a pyrrolopyrrole compound, a cyanine compound, a squarylium compound is still more preferable, and a pyrrolopyrrole compound is still more preferable. Specific examples of the pyrrolopyrrole compound include a compound having the following structure, a compound described in paragraphs "0016" to "0058" of JP2009-263614A, a compound described in paragraphs "0037" to "0052" of JP2011-068731A, and a compound described in paragraphs "0010" to "0033" of WO2015/166873A, the contents of which are incorporated herein by reference. Specific examples of the squarylium compound as the other near infrared absorbing colorant include a compound having the following structure, a compound described in paragraphs "0044" to "0049" of JP2011-208101A, a compound described in paragraphs "0060" and "0061" of JP6065169B, a compound described in paragraph "0040" of WO2016/181987A, a compound described in JP2015-176046A, a compound described in paragraph "0072" of WO2016/190162A, a compound described in paragraphs "0196" to "0228" of JP2016-074649A, and a compound described in paragraph "0124" of JP2017-067963A, the contents of which are incorporated herein by reference. Specific examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, a compound described in JP2008-088426A, and a compound described in paragraph "0090" of WO2016/190162A, the contents of which are incorporated herein by reference. Specific examples of the diimmonium compound include a compound described in JP2008-528706A, the content of which is incorporated herein by reference. Specific examples of the phthalocyanine compound include a compound having the following structure, a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Specific examples of the naphthalocyanine compound include a compound described in paragraph "0093" of JP2012-077153A, the content of which is incorporated herein by reference. In addition, a compound described in paragraphs JP2016-146619A can also be used as the other near infrared absorbing colorant, the content of which is incorporated herein by reference.

99
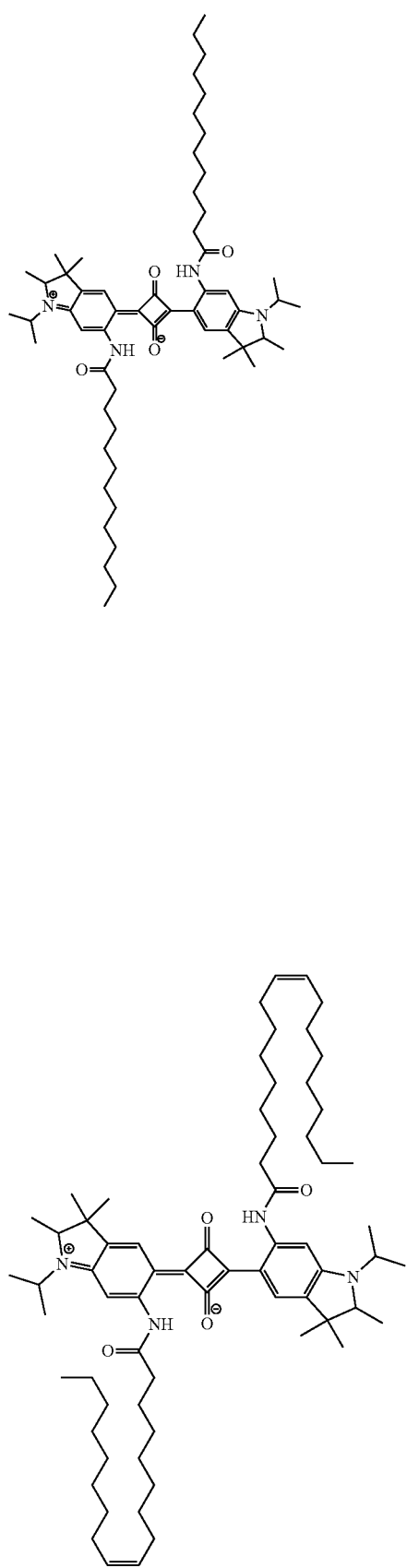
100
-continued
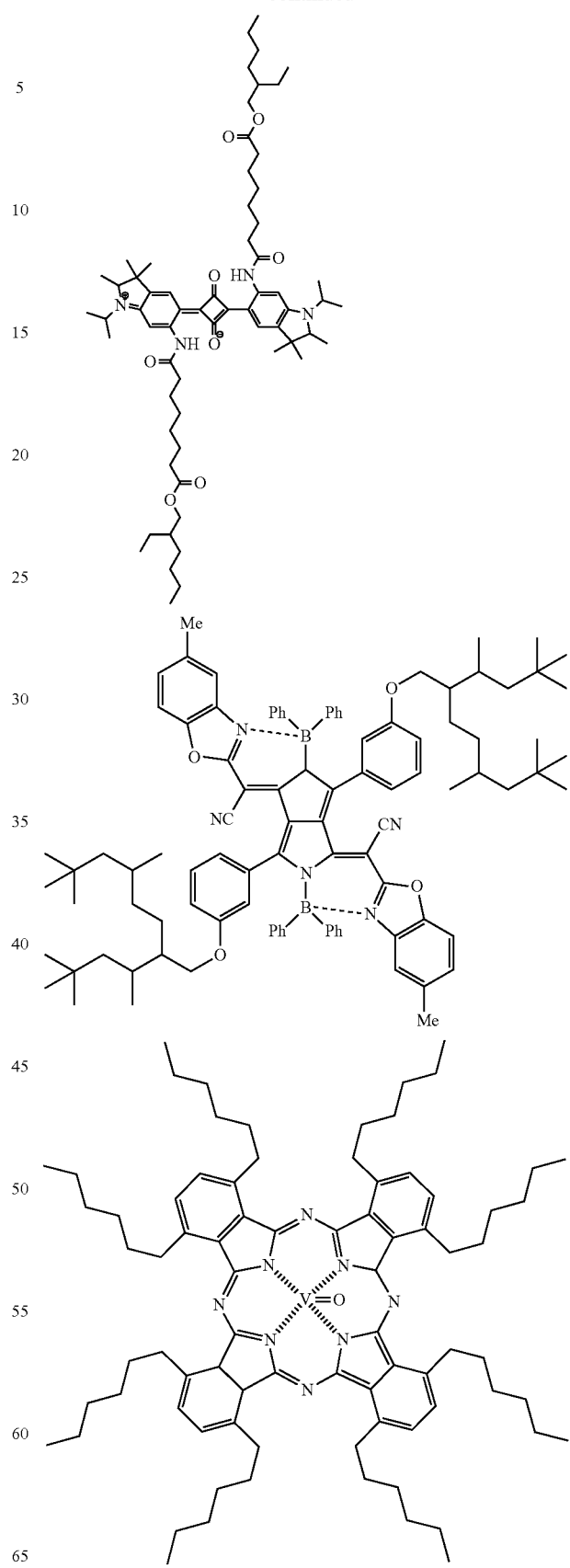

-continued

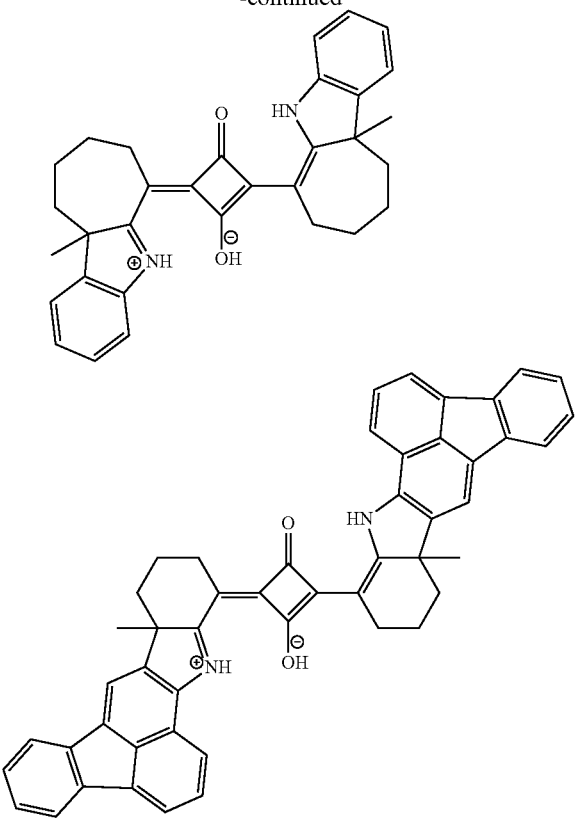

In a case where the resin composition according to the embodiment of the present invention includes the other near infrared absorbing colorant, the content of the other near infrared absorbing colorant is preferably 0.1 to 70 mass % with respect to the total solid content of the resin composition according to the embodiment of the present invention. The lower limit is preferably 0.5 mass % or higher and more preferably 1.0 mass % or higher. The upper limit is preferably 60 mass % or lower, and more preferably 50 mass % or lower. In a case where the resin composition according to the embodiment of the present invention includes two or more other near infrared absorbing colorants, it is preferable that the total content of the two or more near infrared absorbing colorants is in the above-described range.

In addition, the resin composition according to the embodiment of the present invention may include substantially no other near infrared absorbing colorant. A case where the resin composition according to the embodiment of the present invention includes substantially no other near infrared absorbing colorant represents that the content of the other near infrared absorbing colorant is preferably 0.05 mass % or lower, more preferably 0.01 mass % or lower, and still more preferably 0 mass % with respect to the total solid content of the resin composition.

<<Chromatic Colorant>>

The resin composition according to the embodiment of the present invention may include a chromatic colorant. In the present invention, "chromatic colorant" denotes a colorant other than a white colorant and a black colorant. It is preferable that the chromatic colorant is a colorant having an absorption maximum in a wavelength range of 400 to 650 nm. As the chromatic colorant, a pigment or a dye may be used. It is preferable that the chromatic colorant is a pigment.

The pigment is preferably an organic pigment, and examples thereof are as follows. However, the present invention is not limited to the examples.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In a case where the resin composition according to the embodiment of the present invention includes a chromatic colorant, the content of the chromatic colorant is preferably 0.1 to 70 mass % with respect to the total solid content of the resin composition according to the embodiment of the present invention. The lower limit is preferably 0.5 mass % or higher and more preferably 1.0 mass % or higher. The upper limit is preferably 60 mass % or lower, and more preferably 50 mass % or lower.

The content of the chromatic colorant is preferably 10 to 1000 parts by mass and more preferably 50 to 800 parts by mass with respect to 100 parts by mass of the squarylium compound (1).

In addition, the total content of the chromatic colorant, the squarylium compound (1), and the other near infrared absorbing colorant is preferably 1 to 80 mass % with respect to the total solid content of the resin composition according to the embodiment of the present invention. The lower limit is preferably 5 mass % or higher and more preferably 10 mass % or higher. The upper limit is preferably 70 mass % or lower, and more preferably 60 mass % or lower. In a case where the resin composition according to the embodiment of the present invention includes two or more chromatic colorants, it is preferable that the total content of the two or more chromatic colorants is in the above-described range.

In addition, it is also preferable that the resin composition according to the embodiment of the present invention does not substantially include a chromatic colorant. A case where the resin composition according to the embodiment of the present invention does not substantially include a chromatic colorant represents that the content of the chromatic colorant is preferably 0.05 mass % or lower, more preferably 0.01 mass % or lower, and still more preferably 0 mass % with respect to the total solid content of the resin composition.

<<Coloring Material that Allows Transmission of Infrared Light and Shields Visible Light>>

The resin composition according to the embodiment of the present invention may also include the coloring material that allows transmission of infrared light and shields visible light (hereinafter, also referred to as "coloring material that shields visible light").

In the present invention, it is preferable that the coloring material that shields visible light is a coloring material that absorbs light in a wavelength range of violet to red. In addition, in the present invention, it is preferable that the coloring material that shields visible light is a coloring material that shields light in a wavelength range of 450 to 650 nm. In addition, it is preferable that the coloring material that shields visible light is a coloring material that allows transmission of light in a wavelength range of 900 to 1300 nm.

In the present invention, it is preferable that the coloring material that shields visible light satisfies at least one of the following requirement (A) or (B).

(A): The coloring material that shields visible light includes two or more chromatic colorants, and a combination of the two or more chromatic colorants forms black.

(B): The coloring material that shields visible light includes an organic black colorant.

Examples of the chromatic colorant are as described above. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, and JP2015-525260A. For example, "Irgaphor Black" (manufactured by BASF SE) is available. Examples of the perylene compound include C.I. Pigment Black 31 and 32. Examples of the azomethine compound include a compound described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

In a case where a combination of two or more chromatic colorants forms black, examples of the combination of chromatic colorants are as follows.

(1) An aspect in which the coloring material that shields visible light includes a yellow colorant, a blue colorant, a violet colorant, and a red colorant.

(2) An aspect in which the coloring material that shields visible light includes a yellow colorant, a blue colorant, and a red colorant.

(3) An aspect in which the coloring material that shields visible light includes a yellow colorant, a violet colorant, and a red colorant.

(4) An aspect in which the coloring material that shields visible light includes a yellow colorant and a violet colorant.

(5) An aspect in which the coloring material that shields visible light includes a green colorant, a blue colorant, a violet colorant, and a red colorant.

(6) An aspect in which the coloring material that shields visible light includes a violet colorant and an orange colorant.

(7) An aspect in which the coloring material that shields visible light includes a green colorant, a violet colorant, and a red colorant.

(8) An aspect in which the coloring material that shields light in the visible range includes a green colorant and a red colorant.

In a case where the resin composition according to the embodiment of the present invention includes the coloring material that shields visible light, the content of the coloring material that shields visible light is preferably 60 mass % or lower, more preferably 50 mass % or lower, still more preferably 30 mass % or lower, still more preferably 20 mass % or lower, and still more preferably 15 mass % or lower with respect to the total solid content of the resin composition. The lower limit is, for example, 0.1 mass % or higher or 0.5 mass % or higher.

In addition, it is also preferable that the resin composition according to the embodiment of the present invention does not substantially include the coloring material that shields visible light. The resin composition substantially not including the coloring material that shields visible light represents that the content of the coloring material that shields visible light is preferably 0.05 mass % or lower, more preferably 0.01 mass % or lower, and still more preferably 0% with respect to the total solid content of the resin composition according to the embodiment of the present invention.

<<Pigment Derivative>>

The resin composition according to the embodiment of the present invention may include a pigment derivative. Examples of the pigment derivative include a compound having a structure in which a portion of a pigment is substituted with an acidic group, or a basic group. It is preferable that the pigment derivative has an acidic group or a basic group from the viewpoints of dispersibility and dispersion stability.

<<Crosslinking Compound>>

The resin composition according to the embodiment of the present invention may include a compound having a crosslinking group (crosslinking compound). As the crosslinking compound, a well-known compound which is crosslinkable by a radical, an acid, or heat can be used. Examples of the crosslinking compound include a compound which has a group having an ethylenically unsaturated bond, a compound having a cyclic ether group, a compound having a methylol group, a compound having an alkoxysilyl group, and a compound having a chlorosilyl group. The details of the group having an ethylenically unsaturated bond, the cyclic ether group, the alkoxysilyl group, and the chlorosilyl group can be found in the description of the groups regarding the resin. The crosslinking compound including a repeating unit such as a polymer type crosslinking compound also corresponds to a resin.

The crosslinking compound may be in the form of a monomer or a polymer and is preferably a monomer. The molecular weight of the monomer type crosslinking compound is preferably 100 to 3000. The upper limit is preferably 2000 or lower and more preferably 1500 or lower. The lower limit is preferably 150 or higher and more preferably 250 or higher. In addition, it is preferable that the crosslinking compound is a compound substantially not having a molecular weight distribution. Here, the compound substantially not having a molecular weight distribution represents that the dispersity (weight-average molecular weight (Mw)/number-average molecular weight (Mn)) of the compound is preferably 1.0 to 1.5 and more preferably 1.0 to 1.3.

[Compound which has Group Having Ethylenically Unsaturated Bond]

In the present invention, as the crosslinking compound, a compound which has a group having an ethylenically unsaturated bond can be used. The compound which has a group having an ethylenically unsaturated bond is used as a polymerizable compound. It is preferable that the compound which has a group having an ethylenically unsaturated bond is a monomer. The molecular weight of the compound which has a group having an ethylenically unsaturated bond is preferably 100 to 3000. The upper limit is preferably 2000 or lower and more preferably 1500 or lower. The lower limit is preferably 150 or higher and more preferably 250 or higher. The compound which has a group having an ethylenically unsaturated bond is preferably a (meth)acrylate compound having 3 to 15 functional groups and more preferably a (meth)acrylate compound having 3 to 6 functional groups.

Examples of the compound can be found in paragraphs "0033" and "0034" of JP2013-253224A, the content of which is incorporated herein by reference. As the radically polymerizable compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a compound having a structure in which the (meth)acryloyl group is bonded through an ethylene glycol residue and/or a propylene glycol residue is preferable. In addition, oligomers of the above-described examples can be used. For example, the details of the polymerizable compound can be found in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the contents of which are incorporated herein by reference. In addition, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For example, RP-1040 (manufactured by Nippon Kayaku Co., Ltd.) is used.

The compound which has a group having an ethylenically unsaturated bond may have an acid group such as a carboxyl group, a sulfo group, or a phosphate group. Examples of a commercially available product include ARONIX M-305, M-510, and M-520 (manufactured by Toagosei Co., Ltd.). The acid value of the compound is preferably 0.1 to 40 mgKOH/g. The lower limit is more preferably 5 mgKOH/g or higher. The upper limit is more preferably 30 mgKOH/g or lower.

In addition, a compound having a caprolactone structure is also preferable as the compound which has a group having an ethylenically unsaturated bond. As the compound having a caprolactone structure, for example, KAYARAD DPCA series (manufactured by Nippon Kayaku Co., Ltd.) is commercially available, and examples thereof include DPCA-20, DPCA-30, DPCA-60, and DPCA-120. Examples of the compound having a caprolactone structure can be found in paragraphs "0042" to "0045" of JP2013-253224A, the content of which is incorporated herein by reference.

In addition, a compound having an alkyleneoxy group is also preferable as the compound which has a group having an ethylenically unsaturated bond. As the compound which has a group having an ethylenically unsaturated bond and an alkyleneoxy group, a compound which has a group having an ethylenically unsaturated bond, an ethyleneoxy group, and/or a propyleneoxy group is preferable, a compound which has a group having an ethylenically unsaturated bond and an ethyleneoxy group is more preferable, and a trifunctional to hexafunctional (meth)acrylate compound having 4 to 20 ethyleneoxy groups is still more preferable. Examples of a commercially available product include SR-494 (manufactured by Sartomer) which is a tetrafunctional (meth)acrylate having four ethyleneoxy groups, and KAYARAD TPA-330 (manufactured by Nippon Kayaku Co., Ltd.) which is a trifunctional (meth)acrylate having three isobutyleneoxy groups.

As the compound which has a group having an ethylenically unsaturated bond, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, a radically polymerizable compound having an amino structure or a sulfide structure in the molecules described in JP1988-277653A (JP-S63-277653A), JP1988-260909A (JP-S63-260909A), or JP1989-105238A (JP-H1-105238A) is also preferably used. Examples of a commercially available product of the polymerizable compound include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.). In addition, as the radically polymerizable compound, for example, 8UH-1006 or 8UH-1012 (manufactured by Taisei Fine Chemical Co., Ltd.) or LIGHT ACRYLATE POB-A0 (manufactured by Kyoeisha Chemical Co., Ltd.) is also preferably used.

In addition, as the compound which has a group having an ethylenically unsaturated bond, a compound described in JP2017-048367A, JP6057891B, or JP6031807B can also be used.

In addition, as the compound which has a group having an ethylenically unsaturated bond, for example, 8UH-1006 or 8UH-1012 (manufactured by Taisei Fine Chemical Co., Ltd.) or LIGHT ACRYLATE POB-A0 (manufactured by Kyoeisha Chemical Co., Ltd.) is also preferably used.

[Compound having Cyclic Ether Group]

In the present invention, as the crosslinking compound, a compound having a cyclic ether group can also be used. Examples of the cyclic ether group include an epoxy group and an oxetanyl group. Among these, an epoxy group is preferable. Examples of the compound having a cyclic ether group include a monofunctional or polyfunctional glycidyl ether compound, and a polyfunctional aliphatic glycidyl ether compound. The details of the compound having a cyclic ether group can be found in, for example, paragraph "0045" JP2009-265518A, the contents of which are incorporated herein by reference.

Examples of a commercially available product of the compound having a cyclic ether group can be found in, for example, paragraph "0191" JP2012-155288A, the contents of which are incorporated herein by reference. In addition, for example, a polyfunctional aliphatic glycidyl ether compound such as DENACOL EX-212L, EX-214L, EX-216L, EX-321L, or EX-850L (all of which are manufactured by Nagase ChemteX Corporation) can be used. The above-described examples are low-chlorine products, but a commercially available product which is not a low-chlorine product such as EX-212, EX-214, EX-216, EX-321, or EX-850 can also be used. In addition, ADEKA RESIN EP-4000S, EP-4003S, EP-4010S, and EP-4011S (all of which are manufactured by Adeka Corporation); NC-2000, NC-3000, NC-7300, XD-1000, EPPN-501, and EPPN-502 (all of which are manufactured by Adeka Corporation); JER1031S, CELLOXIDE 2021P, CELLOXIDE 2081, CELLOXIDE 2083, CELLOXIDE 2085, EHPE 3150, EPOLEAD PB 3600, and EPOLEAD PB 4700 (all of which are manufactured by Daicel Corporation); CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (all of which are manufactured by Daicel Corporation); JER-157S65, JER-152, JER-154, and JER-157S70 (all of which are manufactured by Mitsubishi Chemical Corporation); and ARONE OXETANE OXT-121, OXT-221, OX-SQ, and PNOX (all of which are manufactured by Toagosei Co., Ltd.) can be used.

[Compound having Alkoxysilyl Group, Compound having Chlorosilyl Group]

In the present invention, as the crosslinking compound, a compound having an alkoxysilyl group or a compound having a chlorosilyl group can also be used. Specific examples include methyl trimethoxysilane, dimethyl dimethoxysilane, phenyl trimethoxysilane, methyltriethoxysilane, and dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl) hexane, trifluoropropyltrimethoxysilane, vinyl trimethoxysilane, vinyltriethoxysilane, 2-(3,4-epoxycyclohexyl) ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylethyldimethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, 3-isocyanatepropyltriethoxysilane, methyltrichlorosilane, ethyltrichlorosilane, phenyltrichlorosilane, dichloro(methyl)phenylsilane, dimethyldichlorosilane, and diethyldichlorosilane. Examples of a commercially available product of the silane coupling agent include KBM-13, KBM-22, KBM-103, KBE-13, KBE-22, KBE-103, KBM-3033, KBE-3033, KBM-3063, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, and KBE-9007 (all of which are manufactured by Shin-Etsu Chemical Co., Ltd.).

The content of the crosslinking compound is preferably 1 to 90 mass % with respect to the total solid content of the resin composition. The lower limit is preferably 2 mass % or higher and more preferably 5 mass % or higher. The upper limit is preferably 80 mass % or lower, more preferably 70 mass % or lower, still more preferably 50 mass % or lower, still more preferably 40 mass % or lower, still more preferably 30 mass % or lower, and still more preferably 20 mass % or lower. As the crosslinking compound, one kind may be used alone, or two or more kinds may be used. In a case where the resin composition includes two or more resins, it is preferable that the total content of the two or more resins is in the above-described range.

<<Photopolymerization Initiator>>

In a case where the polymerizable compound is used as the crosslinking compound, it is preferable that the resin composition according to the embodiment of the present invention further includes a photopolymerization initiator. The photopolymerization initiator is not particularly limited as long as it has an ability to initiate the polymerization reaction of the polymerizable compound, and can be selected from well-known photopolymerization initiators. It is preferable that the photopolymerization initiator is a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from the group consisting of an oxime compound, an α-hydroxyketone compound, an α-aminoketone compound, and an acylphosphine compound is more preferable, and an oxime compound is still more preferable. The details of the photopolymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the ca-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

Examples of the oxime compound include a compound described in JP2001-233842A, a compound described in JP2000-080068A, a compound described in JP2006-342166A, a compound described in J. C. S. Perkin 11 (1979, pp. 1653 to 1660), a compound described in J. C. S. Perkin II (1979, pp. 156 to 162), a compound described in Journal of Photopolymer Science and Technology (1995, pp. 202 to 232), a compound described in JP2000-066385A, a compound described in JP2000-080068A, a compound described in JP2004-534797A, a compound described in JP2006-342166A, a compound described in JP2017-019766A, a compound described in JP6065596B, a compound described in WO2015/152153A, and a compound described in WO2017/051680A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A). As the oxime compound, a compound having no colorability or a compound having high transparency that is not likely to be discolored can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of this specification is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of this specification is incorporated herein by reference.

In the present invention, as the photopolymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to 0025" of JP4223071B, and ADEKA ARKLS NCI-831 (manufactured by Adeka Corporation).

In the present invention, as the photopolymerization initiator, an oxime compound having a benzofuran skeleton can also be used. Specific examples include OE-01 to OE-75 described in WO2015/036910A.

Hereinafter, specific examples of the oxime compound which are preferably used in the present invention are shown below, but the present invention is not limited thereto.

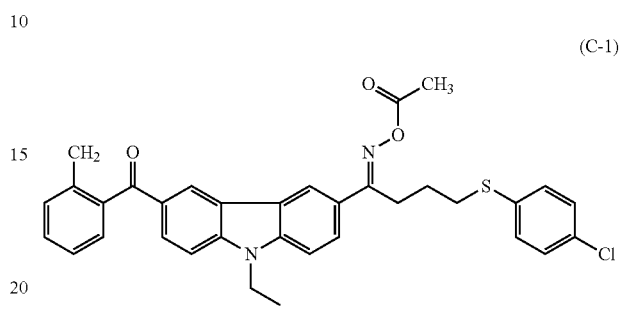

(C-1)

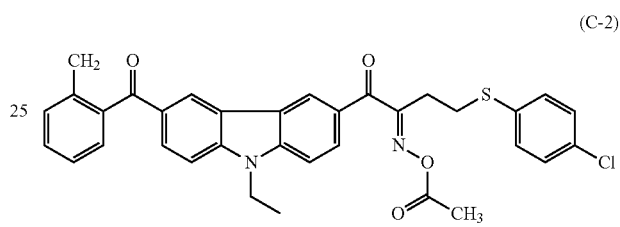

(C-2)

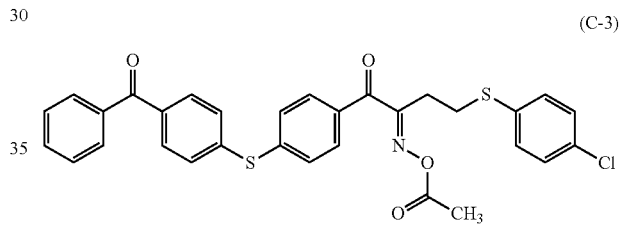

(C-3)

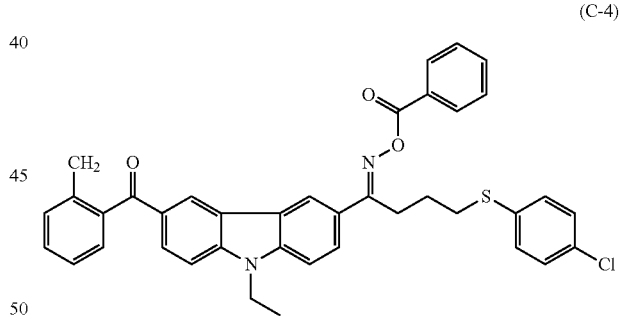

(C-4)

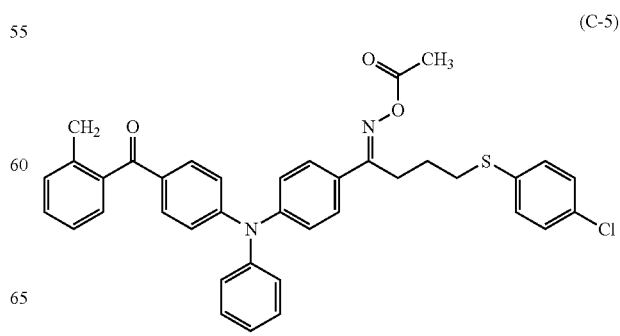

(C-5)

-continued
(C-6)
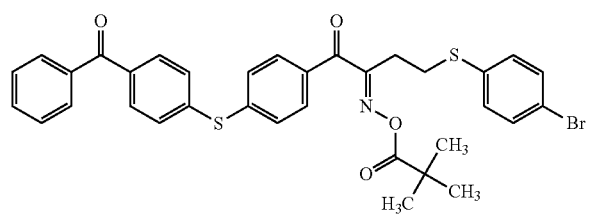
(C-7)
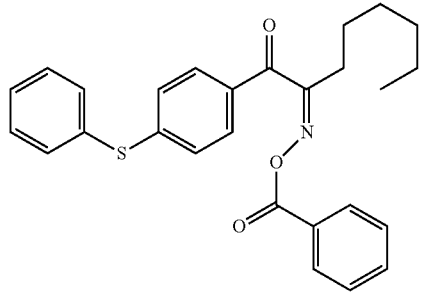
(C-8)
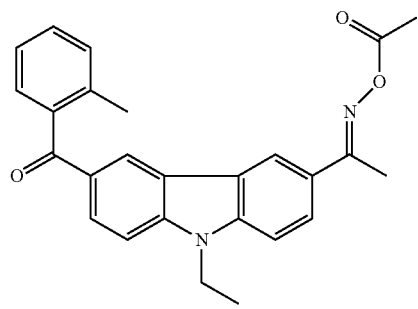
(C-9)
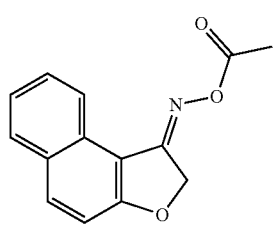
(C-10)
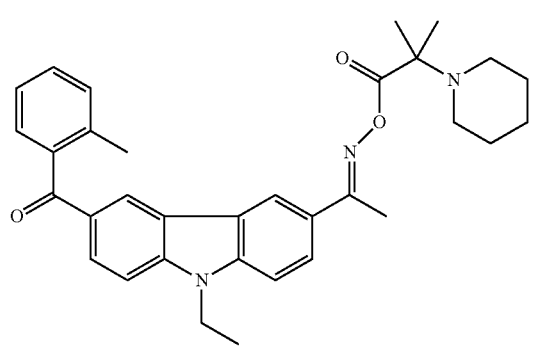
-continued
(C-11)
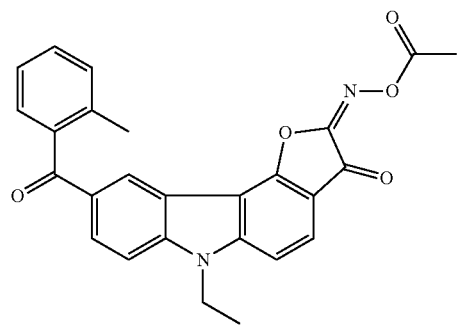
(C-12)
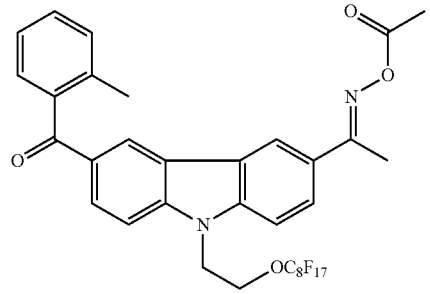
(C-13)
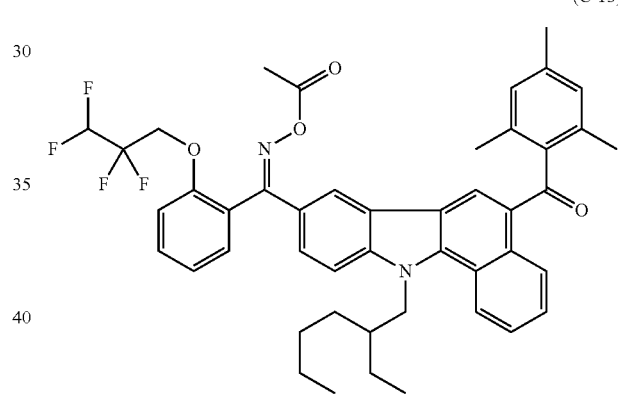
(C-14)
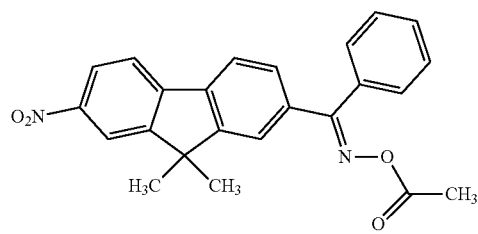
(C-15)
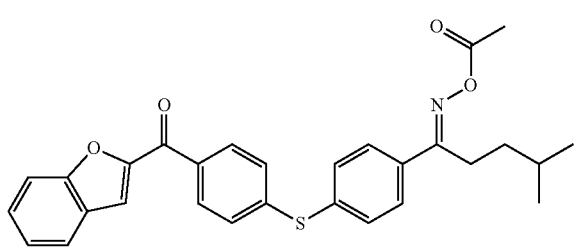

-continued (C-16)

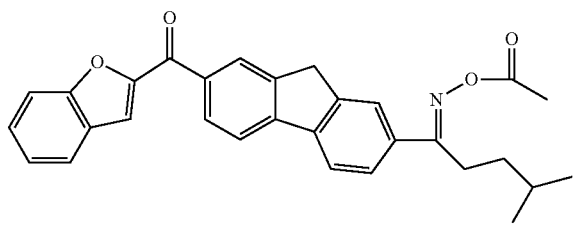

The oxime compound is preferably a compound having a maximum absorption wavelength in a wavelength range of 350 to 500 nm and more preferably a compound having a maximum absorption wavelength in a wavelength range of 360 to 480 nm. In addition, the molar absorption coefficient of the oxime compound at a wavelength of 365 nm or 405 nm is preferably high, more preferably 1,000 to 300,000, still more preferably 2,000 to 300,000, and still more preferably 5,000 to 200,000 from the viewpoint of sensitivity. The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, as the photopolymerization initiator, a photopolymerization initiator having two functional groups or three or more functional groups may be used. Specific examples of the photopolymerization initiator include a dimer of an oxime compound described in JP2010-527339A, JP2011-524436A, WO2015/004565A, paragraphs "0417" to "0412" of JP2016-532675A, or paragraphs "0039" to "0055" of WO2017/033680A, a compound (E) and a compound (G) described in JP2013-522445A, and Cmpd 1 to 7 described in WO2016/034963A.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 0.5 to 20 mass % with respect to the total solid content of the resin composition according to the embodiment of the present invention. The resin composition according to the embodiment of the present invention may include one photopolymerization initiator or two or more photopolymerization initiators. In a case where the resin composition includes two or more photopolymerization initiators, it is preferable that the total content of the two or more photopolymerization initiators is in the above-described range.

<<Acid Generator>>

The resin composition according to the embodiment of the present invention may include an acid generator. In particular, in a case where the resin composition according to the embodiment of the present invention includes a compound having a cyclic ether group or a cationically polymerizable compound as the crosslinking compound, it is preferable that the resin composition according to the embodiment of the present invention includes an acid generator. As the acid generator, a compound (photoacid generator) which generates an acid by light irradiation is preferable. Examples of the acid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or ortho-nitrobenzyl sulfonate. The kind, specific compounds, and preferable examples of the acid generator can be found in the description of a compound in paragraphs "0066" to "0122" of JP2008-013646A, the content of which is also applicable to the present invention.

Examples of a compound which can be preferably used as the acid generator in the present invention include compounds represented by the following Formulae (b1), (b2), and (b3).

(b1)

(b2)

(b3)

In Formula (b1), $R^{201}$, $R^{202}$, and $R^{203}$ each independently represent an organic group. $X^-$ represents a non-nucleophilic anion, preferably a sulfonate anion, a carboxylate anion, a bis(alkylsulfonyl)amide anion, a tris(alkylsulfonyl)methide anion, $BF_4^-$, $PF_6^-$, or $SbF_6^-$, and more preferably $BF_4^-$, $PF_6^-$, or $SbF_6^-$.

Examples of a commercially available product of the acid generator include WPAG-469 (manufactured by Wako Pure Chemical Industries, Ltd.) and CPI-100P (manufactured by San-Apro Ltd.).

The content of the acid generator is preferably 0.1 to 50 mass %, more preferably 0.5 to 30 mass %, and still more preferably 0.5 to 20 mass % with respect to the total solid content of the resin composition. The resin composition according to the embodiment of the present invention may include one acid generator or two or more acid generators. In a case where the composition includes two or more acid generators, it is preferable that the total content of the two or more acid generators is in the above-described range.

<<Crosslinking Aid>>

It is preferable that the resin composition according to the embodiment of the present invention includes a crosslinking aid in order to promote a reaction of the crosslinking compound. Examples of the crosslinking aid include at least one selected from the group consisting of a polyfunctional thiol, an alcohol, an amine, and a carboxylic acid.

Examples of the polyfunctional thiol as the crosslinking aid include a compound having two or more thiol groups in a molecule. The polyfunctional thiol is preferably a secondary alkanethiol and more preferably a compound having a structure represented by the following Formula (T1).

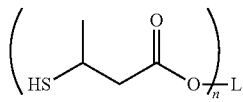

Formula (T1)

In Formula (T1), n represents an integer of 2 to 4, and L represents a divalent to tetravalent linking group.

In Formula (T1), it is preferable that a linking group L is an aliphatic group having 2 to 12 carbon atoms, and it is more preferable that n represents 2 and L represents an alkylene group having 2 to 12 carbon atoms. Specific examples of the polyfunctional thiol include compounds represented by the following Structural Formulae (T2) to (T4). In particular, a compound represented by Structural Formula (T2) is preferable. Among these polyfunctional thiols, one kind may be used alone, or two or more kinds may be used in combination.

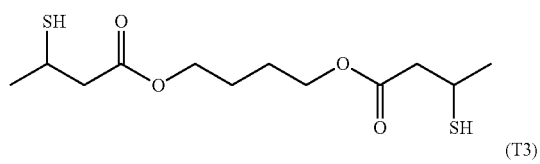

(T2)

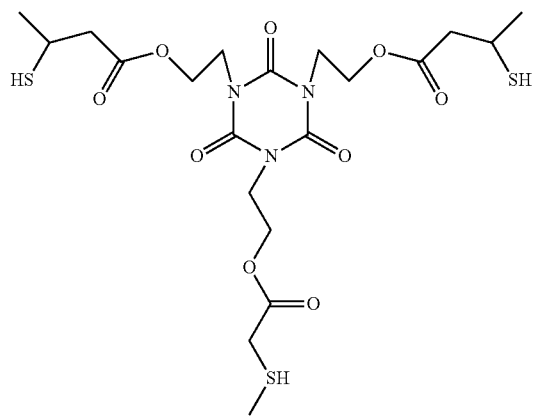

(T3)

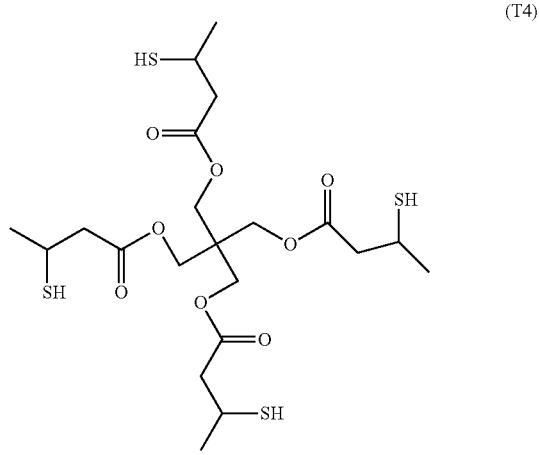

(T4)

The amine as crosslinking aid is preferably polyamine and more preferably diamine. Examples of the amine include hexamethylenediamine, triethylenetetramine, and polyethyleneimine.

The alcohol as the crosslinking aid is preferably polyhydric alcohol and more preferably diol. Examples of the alcohol include a polyether diol compound, a polyester diol compound, and a polycarbonate diol compound. Specific examples of the alcohol can be found in paragraphs "0128" to "0163" and "0172" of JP2013-253224A, the content of which is incorporated herein by reference.

Examples of the carboxylic acid as the crosslinking aid include 3,3',4,4'-biphenyltetracarboxylic anhydride, maleic acid, phthalic acid, and trimellitic acid. In addition, a carboxy group-containing epoxy curing agent described in JP2017-036379A can also be used.

The content of the crosslinking aid is preferably 1 to 1000 parts by mass, more preferably 1 to 500 parts by mass, and still more preferably 1 to 200 parts by mass with respect to 100 parts by mass of the crosslinking compound. The resin composition according to the embodiment of the present invention may include one crosslinking aid or two or more crosslinking aids. In a case where the composition includes two or more crosslinking aids, it is preferable that the total content of the two or more crosslinking aids is in the above-described range.

<<Catalyst>>

The resin composition according to the embodiment of the present invention may include a catalyst. In particular, in a case where a compound having an alkoxysilyl group or a chlorosilyl group is used as the crosslinking compound, it is preferable that the resin composition includes the catalyst. According to this aspect, a sol-gel reaction is promoted, and a stronger film can be easily obtained. Examples of the catalyst include an acid catalyst and a base catalyst. Examples of the acid catalyst include hydrochloric acid, nitric acid, sulfuric acid, sulfurous acid, hydrogen sulfide, perchloric acid, hydrogen peroxide, carbonic acid, a carboxylic acid such as formic acid or acetic acid, a substituted carboxylic acid in which R in a structural formula represented by RCOOH is substituted with another element or a substituent, a sulfonic acid such as benzenesulfonic acid, and phosphoric acid. Further, Lewis acid such as aluminum chloride, aluminum acetylacetonate, zinc chloride, tin chloride, a boron trifluoride diethyl ether complex, or iodotrimethylsilane may be used. In addition, examples of the base catalyst include an ammonia base compound such as ammonia water and an organic amine such as ethylamine or aniline. In addition, as the catalyst, a catalyst described in paragraphs "0070" to "0076" of JP2013-201007A can also be used.

The content of the catalyst is preferably 0.1 to 100 parts by mass, more preferably 0.1 to 50 parts by mass, and still more preferably 0.1 to 20 parts by mass with respect to 100 parts by mass of the crosslinking compound. The resin composition according to the embodiment of the present invention may include one catalyst or two or more catalysts. In a case where the resin composition includes two or more catalysts, it is preferable that the total content of the two or more catalysts is in the above-described range.

<<Solvent>>

The resin composition according to the embodiment of the present invention may include a solvent. Examples of the solvent include water and an organic solvent. Basically, the solvent is not particularly limited as long as it satisfies the solubility of each component and the coating properties of the resin composition. However, it is preferable that the organic solvent is selected in consideration of the coating properties and safety of the resin composition.

Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide or 3-butoxy-N,N-dimethylpropanamide is also preferable from the viewpoint of improving solubility. In addition, due to the reasons of an environmental aspect, it may be preferable to reduce the content of an aromatic hydrocarbon (for example, benzene, toluene, xylene, or ethylbenzene) as a solvent. For example, the content may be 50 mass parts per million (ppm) or lower, 10 mass ppm or lower, or 1 mass ppm or lower with respect to the total mass of the organic solvent.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 80 mass %, and still more preferably 25 to 75 mass % with respect to the total mass of the resin composition.

<<Polymerization Inhibitor>>

The resin composition according to the embodiment of the present invention may include a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and N-nitrosophenylhydroxyamine salt (for example, an ammonium salt or a cerium (III) salt). Among these, p-methoxyphenol is preferable. The content of the polymerization inhibitor is preferably 0.01 to 5 mass % with respect to the total solid content of the resin composition.

<<Surfactant>>

The resin composition according to the embodiment of the present invention may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

In the present invention, it is preferable that the surfactant is a fluorine surfactant. By the resin composition according to the embodiment of the present invention containing a fluorine surfactant, liquid characteristics (for example, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, as the fluorine surfactant, a polymer of a fluorine-containing vinyl ether compound having a fluorinated alkyl group or a fluorinated alkylene ether group and a hydrophilic vinyl ether compound is also preferable. The details of this fluorine surfactant can be found in JP2016-216602A, the content of which is incorporated herein by reference.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

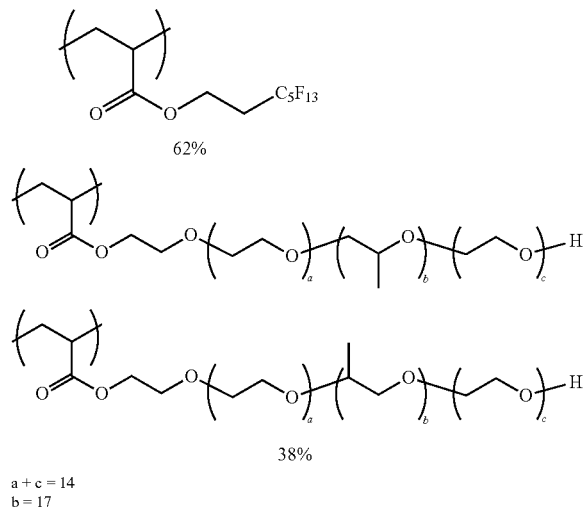

a + c = 14
b = 17

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010, SURFYNOL 104, 400, and 440 (all of which are manufactured by Nissin Chemical Co., Ltd.).

Examples of the cationic surfactant include an organosiloxane polymer KP-341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP-341, KF6001, and KF6002 (all of which are manufactured by Shin-Etsu Chemical Co., Ltd.); and BYK307, BYK323, and BYK330 (all of which are manufactured by BYK-Chemie Japan K.K.).

The content of the surfactant is preferably 0.001 to 2.0 mass % and more preferably 0.005 to 1.0 mass % with respect to the total solid content of the resin composition. As the surfactant, one kind may be used alone, or two or more kinds may be used. In a case where the resin composition includes two or more surfactants, it is preferable that the total content of the two or more surfactants is in the above-described range.

<<Ultraviolet Absorber>>

The resin composition according to the embodiment of the present invention may include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, or a hydroxyphenyltriazine compound can be used. The details can be found in paragraphs "0052" to "0072" of JP2012-208374A and paragraphs "0317" to "0334" of JP2013-068814A, the contents of which are incorporated herein by reference. Examples of a commercially available product of the conjugated diene compound include UV-503 (manufactured by Daito Chemical Co., Ltd.). In addition, as the benzotriazole compound, MYUA series (manufactured by Miyoshi Oil&Fat Co., Ltd.; The Chemical Daily, Feb. 1, 2016) may be used. The content of the ultraviolet absorber is preferably 0.01 to 10 mass % and more preferably 0.01 to 5 mass % with respect to the total solid content of the resin composition according to the embodiment of the present invention.

<<Antioxidant>>

The resin composition according to the embodiment of the present invention may include an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl) dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G ADEKA STAB AO-80, and ADEKA STAB AO-330 (all of which are manufactured by Adeka Corporation). In addition, as the antioxidant, a polyfunctional hindered amine antioxidant described in WO17/006600A can also be used.

The content of the antioxidant is preferably 0.01 to 20 mass % and more preferably 0.3 to 15 mass % with respect to the mass of the total solid content of the resin composition according to the embodiment of the present invention. As the antioxidant, one kind may be used alone, or two or more kinds may be used in combination. In a case where two or more antioxidants are used in combination, it is preferable that the total content of the two or more antioxidants is in the above-described range.

<<Other Components>>

Optionally, the resin composition according to the embodiment of the present invention may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By the resin composition appropriately including the components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the contents of which are incorporated herein by reference.

In addition, the resin composition according to the embodiment of the present invention may optionally include a potential antioxidant. The potential antioxidant is a compound in which a portion that functions as the antioxidant is protected by a protective group and this protective group is desorbed by heating the compound at 100° C. to 250° C. or by heating the compound at 80° C. to 200° C. in the presence of an acid/a base catalyst. Examples of the potential antioxidant include a compound described in WO2014/021023A, WO2017/030005A, and JP2017-008219A. Examples of a commercially available product of the potential antioxidant include ADEKA ARKLS GPA-5001 (manufactured by Adeka Corporation).

For example, in a case where a film is formed by coating, the viscosity (23° C.) of the resin composition according to the embodiment of the present invention is preferably 1 to 100 mPa·s. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

A storage container of the resin composition according to the embodiment of the present invention is not particularly limited, and a well-known storage container can be used. In addition, as the storage container, in order to suppress infiltration of impurities into the raw materials or the resin composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The use of the resin composition according to the embodiment of the present invention is not particularly limited. The resin composition according to the embodiment of the present invention can be preferably used to form a near infrared cut filter or the like. In addition, by the resin composition according to the embodiment of the present invention including the coloring material that shields visible light, an infrared transmitting filter that can allow transmission of only near infrared light at a specific wavelength or higher can also be formed. Accordingly, the resin composition according to the embodiment of the present invention can also be preferably used for forming an infrared transmitting filter or the like.

<Method of Preparing Resin Composition>

The resin composition according to the embodiment of the present invention can be prepared by mixing the above-described components with each other. During the preparation of the resin composition, all the components may be dissolved or dispersed in a solvent at the same time to prepare the resin composition. Optionally, two or more solutions or dispersions to which the respective components are appropriately added may be prepared, and the solutions or dispersions may be mixed with each other during use (during application) to prepare the resin composition.

In addition, in a case where the resin composition according to the embodiment of the present invention includes particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like after pulverization. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the resin composition, it is preferable that the resin composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more.

In addition, a combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NIEY), Toyo Roshi Kaisha, Ltd., Entegris Japan Co., Ltd. (former Mykrolis Corporation), or Kits Microfilter Corporation.

The second filter may be formed of the same material as that of the first filter.

In addition, the filtering using the first filter may be performed only on the dispersion, and the filtering using the second filter may be performed on a mixture of the dispersion and other components.

<Film, Near Infrared Cut Filter, Infrared Transmitting Filter>

The film according to the embodiment of the present invention is formed of the above-described resin composition according to the embodiment of the present invention. The film according to the embodiment of the present invention can be preferably used as a near infrared cut filter, an infrared transmitting filter, or the like. The film according to the embodiment of the present invention may be a film having a pattern or a film (flat film) not having a pattern.

The film according to the embodiment of the present invention may be used in a state where it is laminated on a support, or may be peeled off from a support. Examples of the support include a semiconductor substrate such as a silicon and a transparent substrate. The transparent substrate is not particularly limited as long as it is formed of a material that can allow transmission of at least visible light. For example, a substrate formed of a material such as glass, crystal, or a resin can be used. As the material of the transparent substrate, glass is preferable. That is, it is preferable that the transparent substrate is a glass substrate. Examples of the glass include soda-lime glass, borosilicate glass, non-alkali glass, quartz glass, and copper-containing glass. Examples of the copper-containing glass include a phosphate glass including copper and a fluorophosphate glass including copper. Examples of a commercially available product of the copper-containing glass include NF-50 (manufactured by AGC Techno Glass Co., Ltd.). Examples of the crystal include rock crystal, lithium niobate, and sapphire. Examples of the resin include a polyester resin such as polyethylene terephthalate or polybutylene terephthalate, a polyolefin resin such as polyethylene, polypropylene, or an ethylene vinyl acetate copolymer, a norbornene resin, an acrylic resin such as polyacrylate or polymethyl methacrylate, a urethane resin, a vinyl chloride resin, a fluororesin, a polycarbonate resin, a polyvinyl butyral resin, and a polyvinyl alcohol resin. In addition, in order to improve adhesiveness between the support and the film according to the embodiment of the present invention, a underlayer or the like may be provided on a surface of the support.

In a case where the film according to the embodiment of the present invention is used as a near infrared cut filter, it is preferable that the film according to the embodiment of the present invention has an absorption maximum in a wavelength range of 700 to 1200 nm. In addition, an average transmittance in a wavelength range of 400 to 550 nm is preferably 70% or higher, more preferably 80% or higher, still more preferably 85% or higher, and still more preferably 90% or higher. In addition, a transmittance of in the entire wavelength range of 400 to 550 nm is preferably 70% or higher, more preferably 80% or higher, and still more preferably 90% or higher. In addition, a transmittance at at least one point in a wavelength range of 700 to 1000 nm is preferably 20% or lower, more preferably 15% or lower, and still more preferably 10% or lower.

The film according to the embodiment of the present invention can be used in combination with a color filter that includes a chromatic colorant. The color filter can be manufactured using a coloring composition including a chromatic colorant. Examples of the chromatic colorant include the chromatic colorants described above. The coloring composition may further include, for example, a resin, a crosslinking compound, a photopolymerization initiator, a surfactant, a solvent, a polymerization inhibitor, and an ultraviolet absorber. In more detail, for example, the materials described above can be used.

In a case where the film according to the embodiment of the present invention is used as a near infrared cut filter and in combination with a color filter, it is preferable that the color filter is disposed on an optical path of the film according to the embodiment of the present invention. For example, the film according to the embodiment of the present invention and the color filter can be laminated to be used as a laminate. In the laminate, the film according to the embodiment of the present invention and the color filter may be or may not be adjacent to each other in a thickness direction. In a case where the film according to the embodiment of the present invention is not adjacent to the color filter in the thickness direction, the film according to the embodiment of the present invention may be formed on another support other than a support on which the color filter is formed, or another member (for example, a microlens or a planarizing layer) constituting a solid image pickup element may be interposed between the film according to the embodiment of the present invention and the color filter.

The thickness of the film according to the embodiment of the present invention can be adjusted according to the purpose. The thickness is preferably 20 μm or less, more preferably 10 μm or less, and still more preferably 5 μm or less. For example, the lower limit of the thickness is preferably 0.1 μm or more, more preferably 0.2 μm or more, and still more preferably 0.3 μm or more.

In addition, the near infrared cut filter according to the embodiment of the present invention includes the film according to the embodiment of the present invention. It is preferable that the near infrared cut filter according to the embodiment of the present invention has an absorption maximum in a wavelength range of 700 to 1200 nm. In addition, an average transmittance in a wavelength range of 400 to 550 nm is preferably 70% or higher, more preferably 80% or higher, still more preferably 85% or higher, and still more preferably 90% or higher. In addition, a transmittance of in the entire wavelength range of 400 to 550 nm is preferably 70% or higher, more preferably 80% or higher, and still more preferably 90% or higher. In addition, a transmittance at at least one point in a wavelength range of 700 to 1000 nm is preferably 20% or lower, more preferably 15% or lower, and still more preferably 10% or lower.

The near infrared cut filter according to the embodiment of the present invention may further include, for example, a dielectric multi-layer film or an ultraviolet absorbing layer in addition to the film according to the embodiment of the present invention. By further including the dielectric multi-layer film in addition to the film according to the embodiment of the present invention, the near infrared cut filter according to the embodiment of the present invention having a wide viewing angle and excellent near infrared shielding properties can be easily obtained. In addition, by further including the ultraviolet absorbing layer in addition to the film according to the embodiment of the present invention, the near infrared cut filter according to the embodiment of the present invention having excellent ultraviolet shielding properties can be obtained. The details of the ultraviolet absorbing layer can be found in, for example, the description of an absorbing layer described in paragraphs "0040" to "0070" and paragraphs "0119" to "0145" of WO2015/099060, the content of which is incorporated herein by reference. The details of the dielectric multi-layer film can be found in paragraphs "0255" to "0259" of JP2014-041318A, the content of which is incorporated herein by reference.

In addition, the infrared transmitting filter according to the embodiment of the present invention includes the film according to the embodiment of the present invention. Examples of the infrared transmitting filter include a filter that shields visible light and allows transmission of light in a wavelength range of 900 nm or longer. Specific examples of the infrared transmitting filter a filter having spectral characteristics in which a maximum value of a transmittance of light in a wavelength range of 400 to 830 nm is 20% or lower and a minimum value of a transmittance of light in a wavelength range of 1000 to 1300 nm is 80% or higher.

In the present invention, "near infrared cut filter" refers to a filter that allows transmission of light (visible light) in the visible range and shields at least a part of light (near infrared light) in the near infrared range. The near infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, a color filter refers to a filter that allows transmission of light in a specific wavelength range of the visible range and shields light in another specific wavelength range of the visible range. In addition, in the present invention, "infrared transmitting filter" refers to a filter that shields visible light and allows transmission of at least a part of near infrared light.

The film, the near infrared cut filter, and the infrared transmitting filter according to the embodiment of the present invention can be used in various devices including a solid image pickup element such as a charge coupled device (CCD) or a complementary metal-oxide semiconductor (CMOS), an infrared sensor, or an image display device.

<Film Forming Method>

Next, a film forming method according to the embodiment of the present invention will be described. The film according to the embodiment of the present invention can be formed through a step of applying the resin composition according to the embodiment of the present invention.

In the film forming method according to the embodiment of the present invention, it is preferable that the resin composition according to the embodiment of the present invention is applied to a support. Examples of the support include a semiconductor substrate such as a silicon and the above-described transparent substrate. For example, an organic film or an inorganic film may be formed on the substrate. Examples of a material of the organic film include the above-described transparent resin. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the support flat. In addition, in a case where a glass substrate is used as the support, it is preferable that an inorganic film is formed on the glass substrate or the glass substrate may be dealkalized to be used.

As a method of applying the resin composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (February, 2005, S.B. Research Co., Ltd.) and methods described in JP2003-262716A, JP2003-185831A, JP2003-261827A, JP2012-126830A, and JP2006-169325A. In addition, the details of the method of applying the resin composition can be found in WO2017/030174A and WO2017/018419A, the content of which is incorporated herein by reference.

A composition layer formed by applying the resin composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By performing pre-baking at 150° C. or lower, for example, in a case where a photoelectric conversion film of an image sensor is formed of an organic material, the characteristics of the organic material can be effectively maintained. The pre-baking time is preferably 10 to 3000 seconds, more preferably 40 to 2500 seconds, and still more preferably 80 to 220 seconds. Pre-baking can be performed using a hot plate, an oven, or the like.

The composition layer may be further heated (post-baked) after pre-baking. In a case where post-baking is performed, for example, the post-baking temperature is preferably 100° C. to 240° C. From the viewpoint of curing the film, the post-baking temperature is more preferably 180° C. to 240° C. The post-baking time is preferably 2 to 10 minutes and more preferably 4 to 8 minutes. Post-baking can be performed using a hot plate, an oven, or the like.

The film forming method according to the embodiment of the present invention may further include a step of forming a pattern. Examples of a pattern forming method include a pattern forming method using a photolithography method and a pattern forming method using a dry etching method. In a case where the film according to the embodiment of the present invention is used as a flat film, the step of forming a pattern is not necessarily performed. Hereinafter, the step of forming a pattern will be described in detail.

(Case where Pattern is Formed Using Photolithography Method)

It is preferable that the pattern forming method using a photolithography method includes: a step (exposure step) of exposing the composition layer, which is formed by applying the resin composition according to the embodiment of the present invention, in a pattern shape; and a step (development step) of forming a pattern by removing a non-exposed portion of the composition layer by development.

<<Exposure Step>>

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, in particular, ultraviolet rays such as g-rays or i-rays are preferable, and i-rays are more preferable. The irradiation dose (exposure dose) is preferably 0.03 to 2.5 $J/cm^2$, more preferably 0.05 to 1.0 $J/cm^2$, and most preferably 0.08 to 0.5 $J/cm^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 $W/m^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photo-cured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, a surfactant may be used as the developer. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 180° C. to 230° C.

(Case where Pattern is Formed Using Dry Etching Method)

The formation of a pattern using a dry etching method can be performed using a method including: curing the composition layer on the support to form a cured composition layer; forming a patterned photoresist layer on the cured composition layer; and dry-etching the cured composition layer with etching gas by using the patterned photoresist layer as a mask. It is preferable that pre-baking is further performed in order to form the photoresist layer. In particular, in a preferable aspect, as a process of forming the photoresist layer, baking after exposure or baking after development (post-baking) is performed. The details of the pattern formation using the dry etching method can be found in paragraphs "0010" to "0067" of JP2013-064993A, the content of which is incorporated herein by reference.

<Solid Image Pickup Element and Camera Module>

A solid image pickup element according to the embodiment of the present invention includes the film according to the embodiment of the present invention. In addition, a camera module according to the embodiment of the present invention includes a solid image pickup element and the near infrared cut filter according to the embodiment of the present invention. The configuration of the solid image pickup element according to the embodiment of the present invention is not particularly limited as long as it includes the film according to the embodiment of the present invention and functions as a solid image pickup element. For example, the following configuration can be adopted.

The solid image pickup element includes a plurality of photodiodes and transfer electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the embodiment of the present invention is formed on the device protective film. Further, a configuration in which light collecting means (for example, a microlens; hereinafter, the same shall be applied) is provided above the device protective film and below the film according to the embodiment of the present invention (on a side thereof close the support), or a configuration in which light collecting means is provided on the film according to the embodiment of the present invention may be adopted. In addition, the color filter may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention includes the film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 to 485 nm), a green range (530 to 580 nm), and a yellow range (580 to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray h v side of the color filters 112 and the infrared transmitting filters 114. A planarizing layer 116 is formed so as to cover the microlenses 115.

The near infrared cut filter 111 can be formed using the resin composition according to the embodiment of the present invention. Spectral characteristics of the near infrared cut filters 111 can be selected according to the emission wavelength of an infrared light emitting diode (infrared LED) to be used.

The color filters 112 is not particularly limited as long as pixels which allow transmission of light having a specific wavelength in the visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected according to the emission wavelength of the infrared LED to be used. The infrared transmitting filter 114 can also be formed using the resin composition according to the embodiment of the present invention.

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multilayer film may be provided. The details of the groups are as described above. In addition, as the other near infrared cut filter, a dual band pass filter may be used. In addition, in the infrared sensor illustrated in FIG. 1, the position of the near infrared cut filter 111 and the position of the color filter 112 may be replaced with each other. In addition, another layer may be arranged between the solid image pickup element 110 and the near infrared cut filter 111 and/or between the solid image pickup element 110 and the infrared transmitting filter 114. Examples of the other layer include an organic layer that is formed using a composition including a polymerizable compound, a resin, and a photopolymerization initiator. In addition, a planarizing layer may be formed on the color filter 112.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

<Measurement of Weight-Average Molecular Weight (Mw)>

The weight-average molecular weight (Mw) was measured using the following method.

Kind of Column: TSKgel Super HZ4000 (manufactured by Tosoh Corporation, 4.6 mm (Inner diameter)×15 cm)

Developing solvent: tetrahydrofuran

Column temperature: 40° C.

Flow rate (sample injection volume): 60 μL

Device name: High-Speed GPC (HLC-8220GPC), manufactured by Tosoh Corporation

Calibration curve base resin: polystyrene

Synthesis of Compound

Synthesis Example 1

A compound SQ1 was synthesized according to the following synthesis scheme.

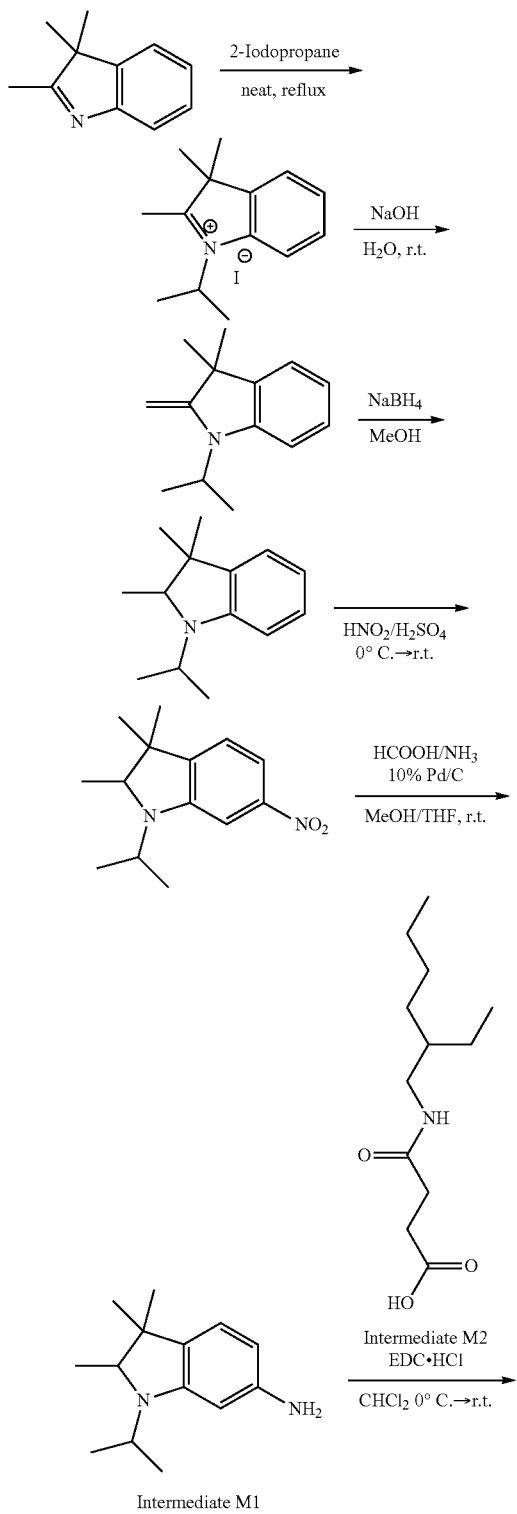

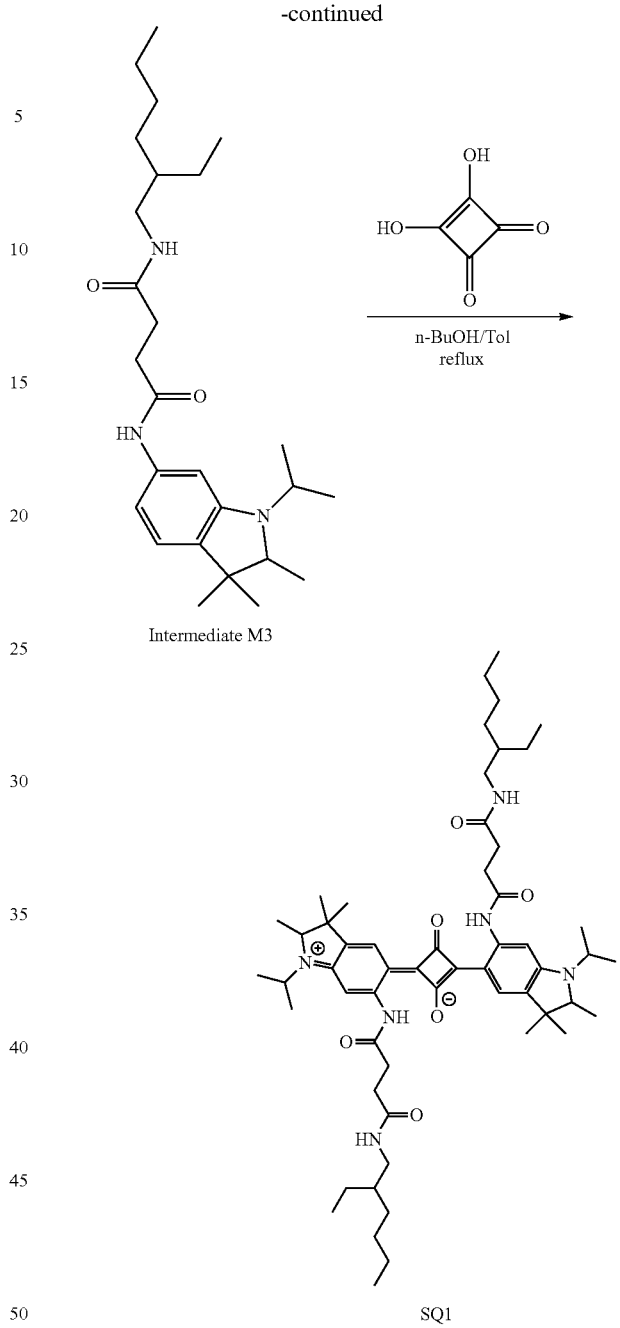

An intermediate M1 was synthesized using a method described in WO2014/088063A according to the scheme shown above. An intermediate M2 was synthesized using a method described in Journal of Heterocyclic Chemistry, 2010, vol. 47, #1, p. 188-193. An intermediate M3 was synthesized by condensing the intermediate M1 and the intermediate M2 using a method described in Organic and Biomolecular Chemistry, 2011, vol. 9, #23, p. 8122-8129.

The intermediate M3 (3.0 g, 7.0 mmol) and squaric acid (0.36 g, 3.1 mmol) were heated to reflux for 12 hours under azeotropic dehydration in n-butanol/toluene (26 cm³/60 cm³). The reaction solution was cooled, the solvent was removed by distillation under reduced pressure, and the residue was purified by silica gel column chromatography (developing solvent: chloroform). Chloroform was removed by distillation under reduced pressure, the solid was ultrasonically dispersed in methanol, and the solid was filtered under reduced pressure. As a result, a target compound (compound SQ1) was obtained (green crystal, 0.9 g, yield: 31%).

Identification data of the compound SQ1: MALDI TOF-MASS (time-of-flight mass spectrometry) Calc. for [M+H]+: 937.7, found: 937.7.

Using the same synthesis method as that of the compound SQ1, compounds SQ4, SQ40, SQ58, SQ73, SQ88, SQ102, and SQ125 were synthesized.

Synthesis Example 2

A compound SQ9 was synthesized according to the following synthesis scheme.

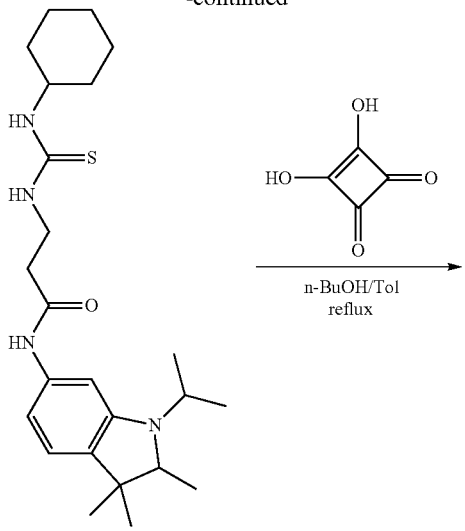

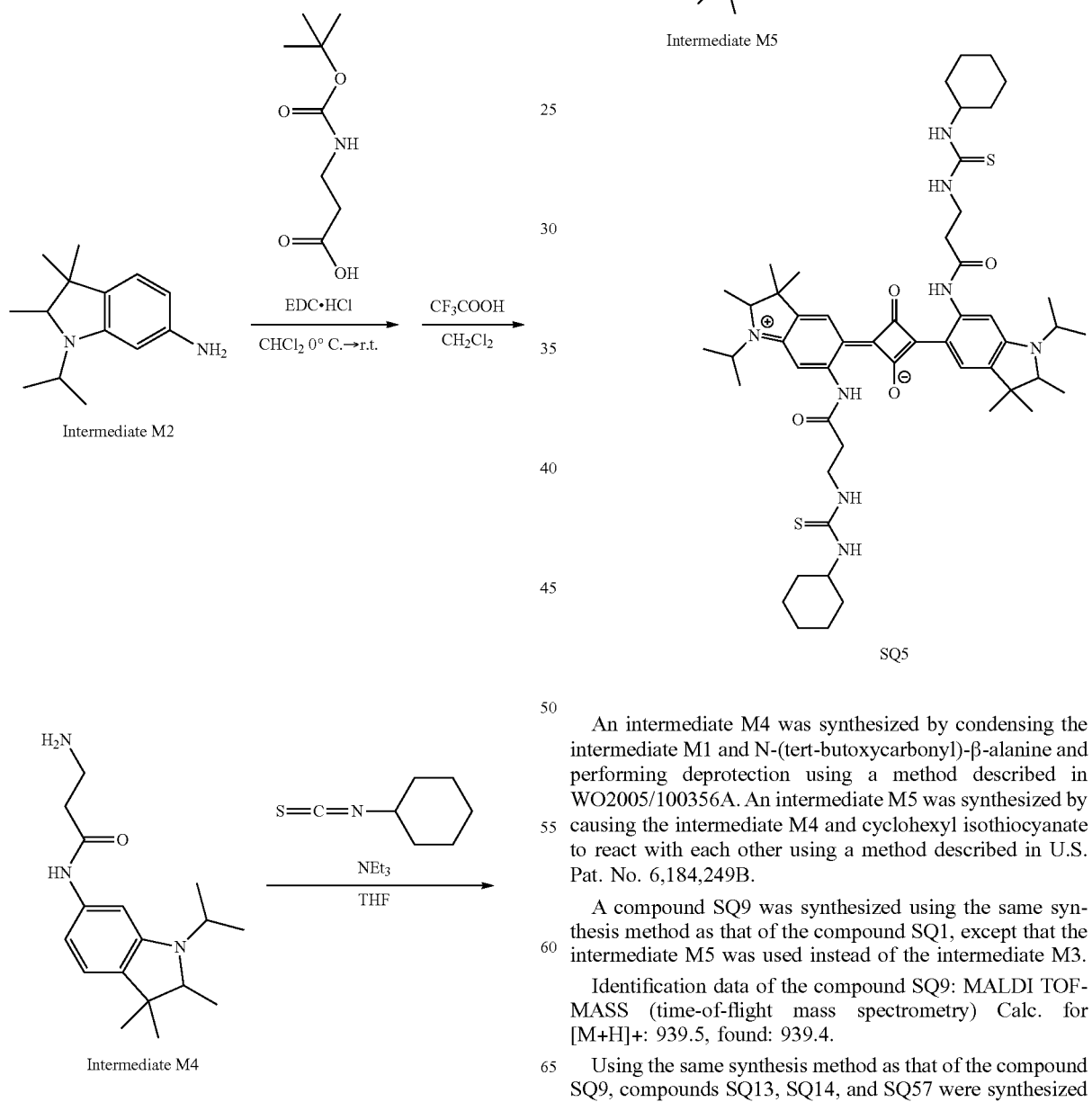

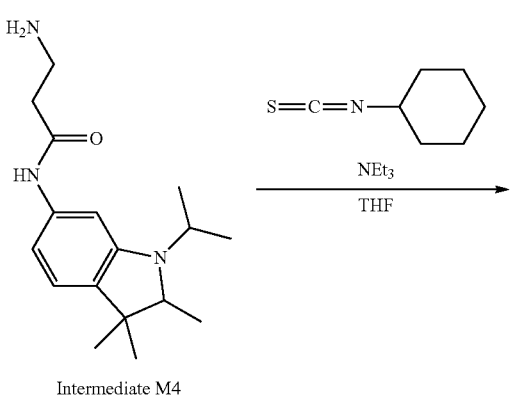

An intermediate M4 was synthesized by condensing the intermediate M1 and N-(tert-butoxycarbonyl)-β-alanine and performing deprotection using a method described in WO2005/100356A. An intermediate M5 was synthesized by causing the intermediate M4 and cyclohexyl isothiocyanate to react with each other using a method described in U.S. Pat. No. 6,184,249B.

A compound SQ9 was synthesized using the same synthesis method as that of the compound SQ1, except that the intermediate M5 was used instead of the intermediate M3.

Identification data of the compound SQ9: MALDI TOF-MASS (time-of-flight mass spectrometry) Calc. for [M+H]+: 939.5, found: 939.4.

Using the same synthesis method as that of the compound SQ9, compounds SQ13, SQ14, and SQ57 were synthesized through the intermediate M4.

Synthesis Example 3

A compound SQ10 was synthesized according to the following synthesis scheme.

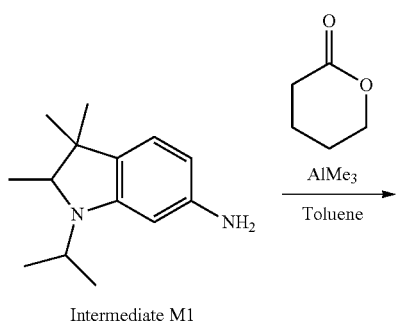
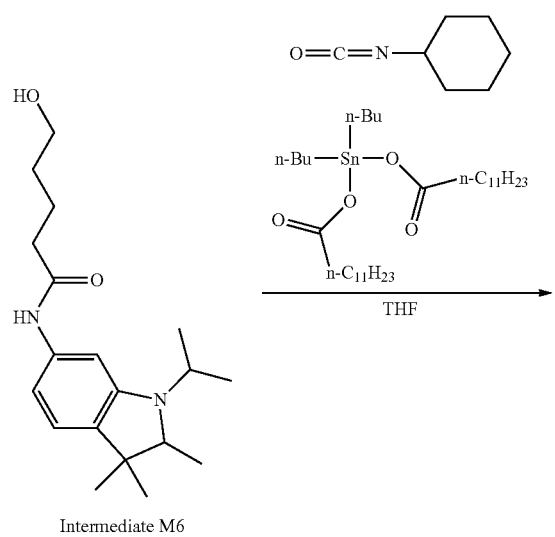
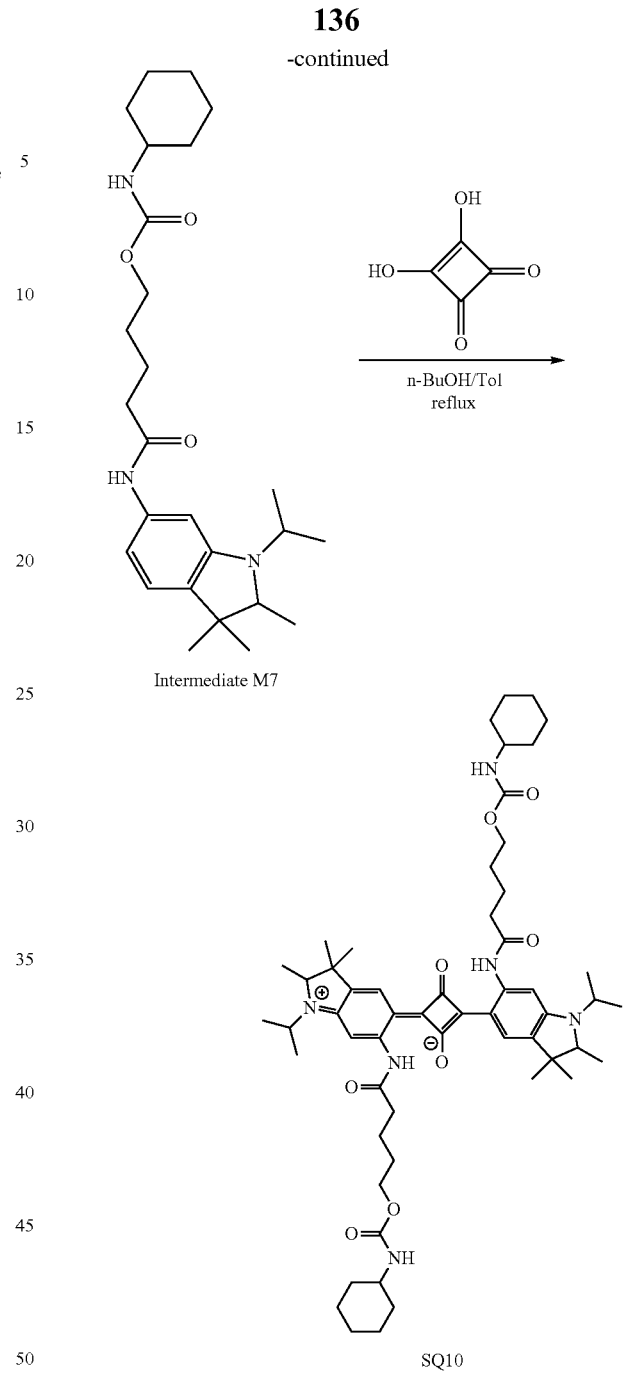

An intermediate M6 was synthesized by causing the intermediate M1 and tetrahydro-2H-pyran-2-one to react with each other using a method described in EP2759533B. An intermediate M7 was synthesized by causing the intermediate M6 and cyclohexyl isothiocyanate to react with each other using a method described in US2015/361036A. A compound SQ10 was synthesized using the same synthesis method as that of the compound SQ1, except that the intermediate M7 was used instead of the intermediate M3.

Identification data of the compound SQ10: MALDI TOF-MASS (time-of-flight mass spectrometry) Calc. for [M+H]+: 939.5, found: 939.4.

Using the same synthesis method as that of the compound SQ10, compounds SQ16 and SQ22 were synthesized through the intermediate M6.

Synthesis Example 4

A compound SQ17 was synthesized according to the following synthesis scheme.

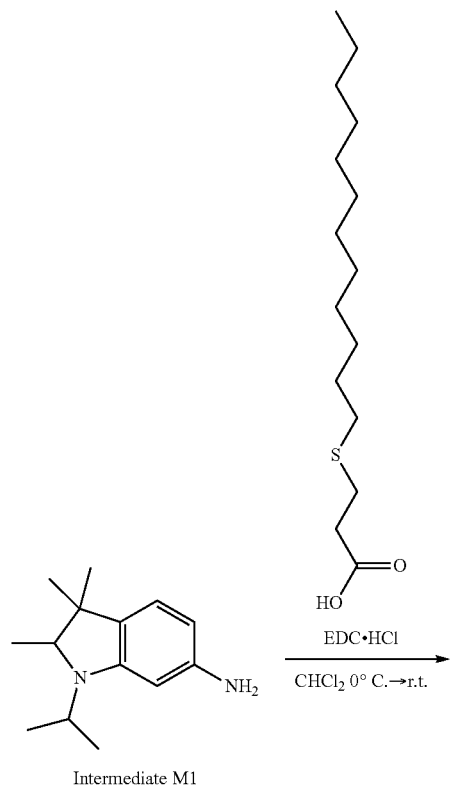

Intermediate M1

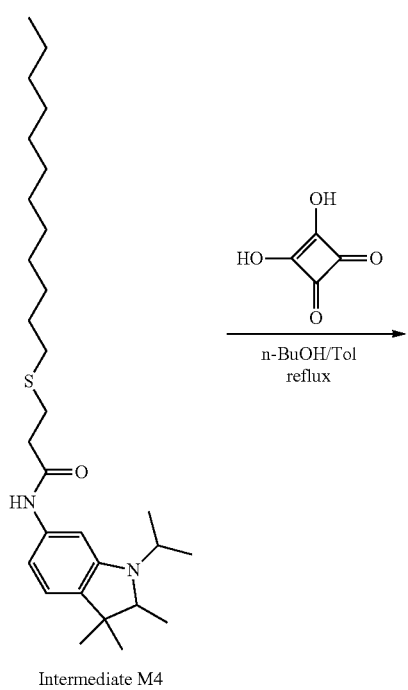

Intermediate M4

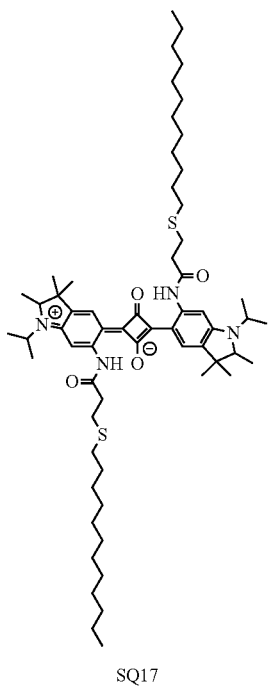 [SMILES: CCCCCCCCCCCCSCCC(=O)Nc1cc2c(cc1C1=C([O-])/C(=c3/cc4c(cc3NC(=O)CCSCCCCCCCCCCCC)=[N+](C(C)C)C(C)C4(C)C)C1=O)C(C)(C)C(C)N2C(C)C]

SQ17

A compound SQ17 was synthesized using the same synthesis method as that of the compound SQ1, except that 3-(dodecylthio)propionic acid was used instead of the intermediate M2.

Identification data of the compound SQ17: MALDI TOF-MASS (time-of-flight mass spectrometry) Calc. for [M+H]+: 1027.7, found: 1027.7.

Using the same synthesis method as that of the compound SQ17, compounds SQ20 and SQ47 were synthesized.

Synthesis Example 5

A compound SQ25 was synthesized according to the following synthesis scheme.

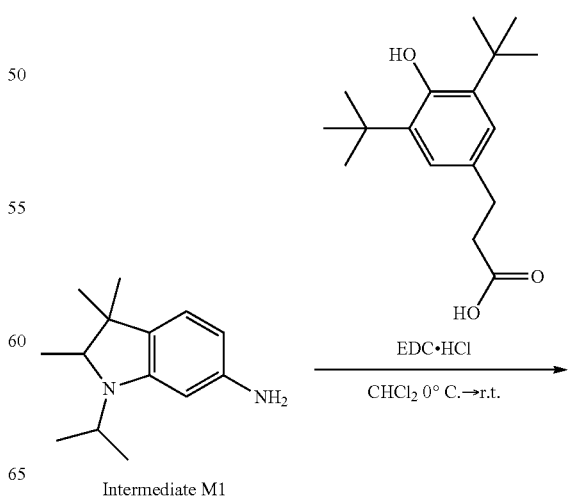

Intermediate M1

-continued

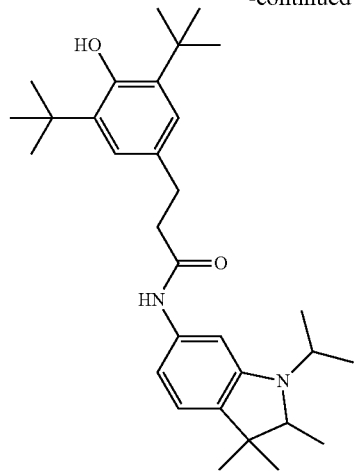 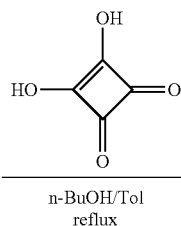 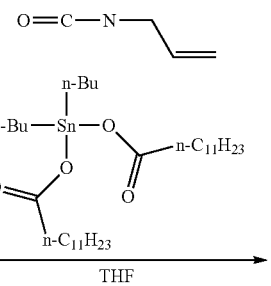

Intermediate M1

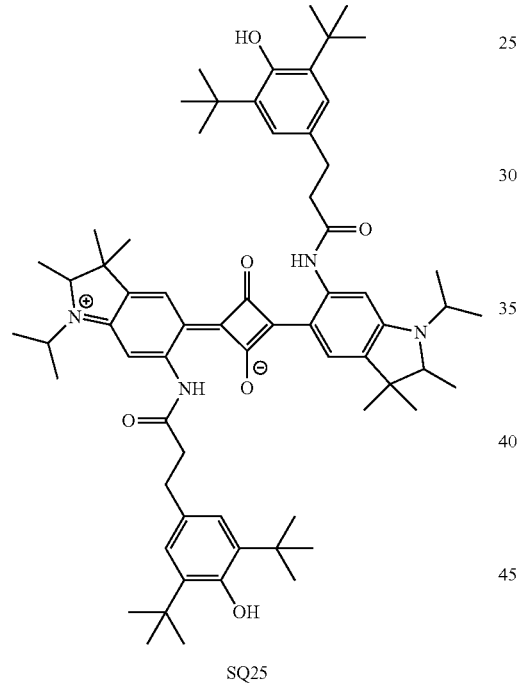

SQ25

A compound SQ25 was synthesized using the same synthesis method as that of the compound SQ1, except that stearyl 3-(3,5-di-tert-butyl-4-hydroxyphenyl)propionate was used instead of the intermediate M2.

Identification data of the compound SQ25: MALDI TOF-MASS (time-of-flight mass spectrometry) Calc. for [M+H]+: 1035.7, found: 1035.8.

Using the same synthesis method as that of the compound SQ25, compounds SQ30, SQ33, SQ36, SQ45, and SQ115 were synthesized.

Synthesis Example 6

A compound SQ52 was synthesized according to the following synthesis scheme.

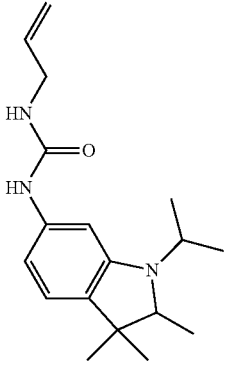 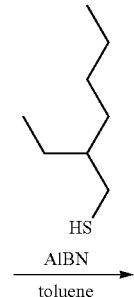

Intermediate M8

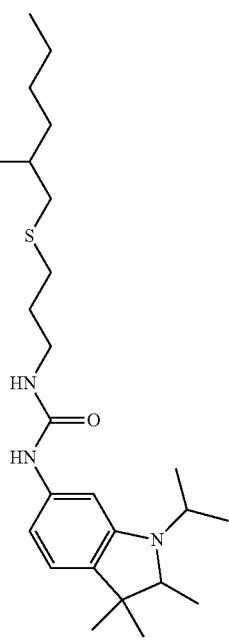 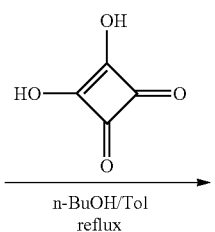

Intermediate M9

-continued

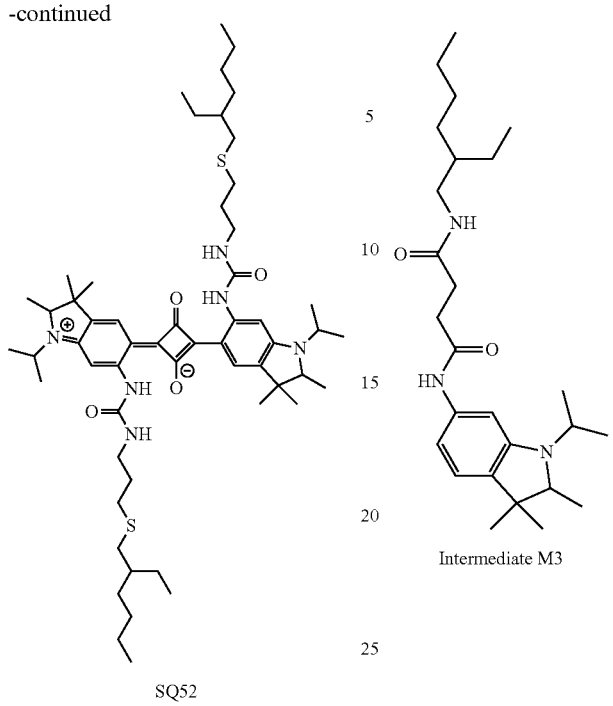

SQ52

An intermediate M8 was synthesized by causing the intermediate M and allyl isothiocyanate to react with each other using a method described in US2015/361036A. An intermediate M9 was synthesized by causing the intermediate M8 and 2-ethyl-1-hexanediol to react with each other using a method described in Russian Journal of Organic Chemistry, 2013, vol. 49, No. 1, pp. 138-144.

A compound SQ52 was synthesized using the same synthesis method as that of the compound SQ1, except that the intermediate M9 was used instead of the intermediate M3.

Identification data of the compound SQ52: MALDI TOF-MASS (time-of-flight mass spectrometry) Calc. for [M+H]+: 973.6, found: 973.6.

Using the same synthesis method as that of the compound SQ52, compounds SQ53 and SQ56 were synthesized.

Synthesis Example 7

A compound SQ126 was synthesized according to the following synthesis scheme using a method described in Journal of Materials Chemistry A, 2016, vol. 4, #48, p. 18910-18921.

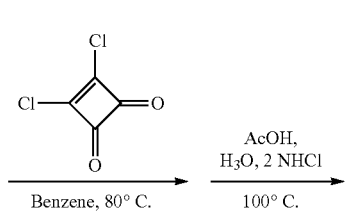

Intermediate M3

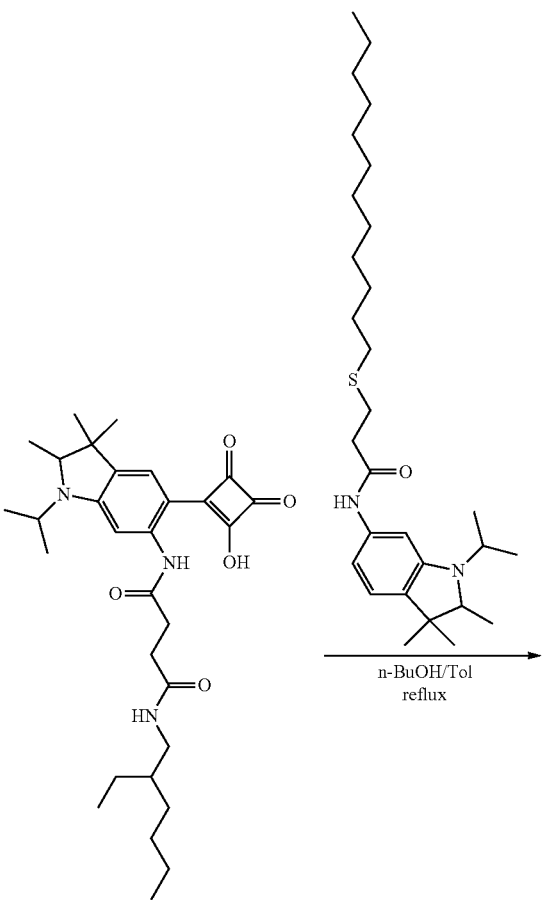

-continued

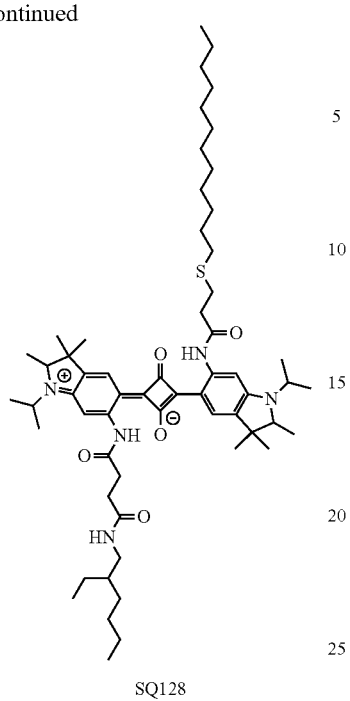

SQ128

Identification data of the compound SQ126: MALDI TOF-MASS (time-of-flight mass spectrometry) Calc. for [M+H]+: 982.7, found: 982.7.

Using the same synthesis method as that of the compound SQ126, compounds SQ127, SQ128, SQ129, and SQ130 were synthesized.

Preparation of Resin Composition

Examples 1 to 47 and Comparative Examples 1 and 2

Raw materials having the following composition were mixed with each other to prepare a resin composition.

<Composition 1>
Compound shown in the following table: 2.3 parts
Resin 1: 12.8 parts
Ultraviolet absorber 1: 0.5 parts
Surfactant 1: 0.04 parts
Cyclohexanone: 84.36 parts <Composition 2>
Compound shown in the following table: 2.3 parts
Resin 2: 12.8 parts
Ultraviolet absorber 1: 0.5 parts
Surfactant 1: 0.04 parts
Cyclohexanone: 64.36 parts
N-methylpyrrolidone: 20 parts <Composition 3>
Compound shown in the following table: 2.3 parts
Resin 3: 12.9 parts
Crosslinking compound 1: 12.9 parts
Photopolymerization initiator 1: 2.5 parts
Ultraviolet absorber 1: 0.5 parts
Surfactant 1: 0.04 parts
Polymerization inhibitor (p-methoxyphenol): 0.006 parts
Cyclohexanone: 49.6 parts
Propylene glycol monomethyl ether acetate: 19.3 parts <Composition 4>
Compound shown in the following table: 2.3 parts
Resin 4: 12.9 parts
Crosslinking compound 1: 12.9 parts
Photopolymerization initiator 1: 2.5 parts
Ultraviolet absorber 1: 0.5 parts
Surfactant 1: 0.04 parts
Polymerization inhibitor (p-methoxyphenol): 0.006 parts
Cyclohexanone: 49.6 parts
Propylene glycol monomethyl ether acetate: 19.3 parts <Composition 5>
Compound shown in the following table: 2.3 parts
Resin 5: 12.9 parts
Crosslinking compound 2: 12.9 parts
Acid generator 1: 2.5 parts
Ultraviolet absorber 1: 0.5 parts
Surfactant 1: 0.04 parts
Cyclohexanone: 49.6 parts
Propylene glycol monomethyl ether acetate: 19.3 parts <Composition 6>
Compound shown in the following table: 2.3 parts
Resin 6: 12.9 parts
Acid catalyst (phosphoric acid): 2.5 parts
Ultraviolet absorber 1: 0.5 parts
Surfactant 1: 0.04 parts
Cyclohexanone: 58.9 parts
Propylene glycol monomethyl ether acetate: 22.9 parts <Composition 7>
Each of compounds shown in the following table: 1.2 parts
Resin 1: 12.8 parts
Ultraviolet absorber 1: 0.5 parts
Surfactant 1: 0.04 parts
Cyclohexanone: 84.26 parts <Composition 8>
Each of compounds shown in the following table: 1.2 parts
Resin 4: 12.9 parts
Crosslinking compound 1: 12.9 parts
Photopolymerization initiator 1: 2.5 parts
Ultraviolet absorber 1: 0.5 parts
Surfactant 1: 0.04 parts
Polymerization inhibitor (p-methoxyphenol): 0.006 parts
Cyclohexanone: 49.6 parts
Propylene glycol monomethyl ether acetate: 19.3 parts (Resin)
Resin 1: ARTON F4520 (manufactured by JSR Corporation)
Resin 2: NEOPULIM (registered trade name) C3450 (manufactured by Mitsubishi Gas Chemical Company Inc.)
Resin 3: a copolymer including benzyl methacrylate (BzMA) and methacrylic acid (MAA) (compositional ratio (mass ratio): (BzMA/MAA)=(80/20), Mw=15,000)
Resin 4: a copolymer including allyl methacrylate (AMA) and methacrylic acid (MAA) (compositional ratio (mass ratio): (AMA/MAA)=(80/20), Mw=15,000)
Resin 5: a copolymer including glycidyl methacrylate (GlyMA) and methacrylic acid (MAA) (compositional ratio (mass ratio): (GlyMA/MAA)=(80/20), Mw=15,000)
Resin 6: a compound having the following structure (numerical values added to the repeating unit represent a molar ratio, Mw=18,000)

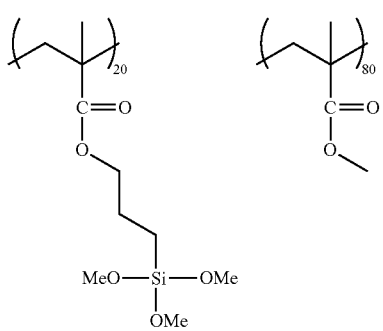

(Crosslinking Compound)

Crosslinking compound 1: dipentaerythritol hexaacrylate (trade name: KAYARAD DPHA, manufactured by Nippon Kayaku Co., Ltd.)

Crosslinking compound 2: OXT-221 (manufactured by Toagosei Co., Ltd.)

(Photopolymerization Initiator)

Photopolymerization initiator 1: IRGACURE-OXE01 (manufactured by BASF SE, [2-(O-benzoyloxime)-1-[4-(phenylthio)phenyl]-1,2-octanedione] (Acid Generator)

(Acid generator)

Acid generator 1: CPI-100P (manufactured by San-Apro Ltd.)

(Ultraviolet Absorber)

Ultraviolet absorber 1: UV-503 (manufactured by Daito Chemical Co., Ltd.)

(Surfactant)

Surfactant 1: the following compound (Mw=14,000, "%" representing the proportion of a repeating unit is mol %)

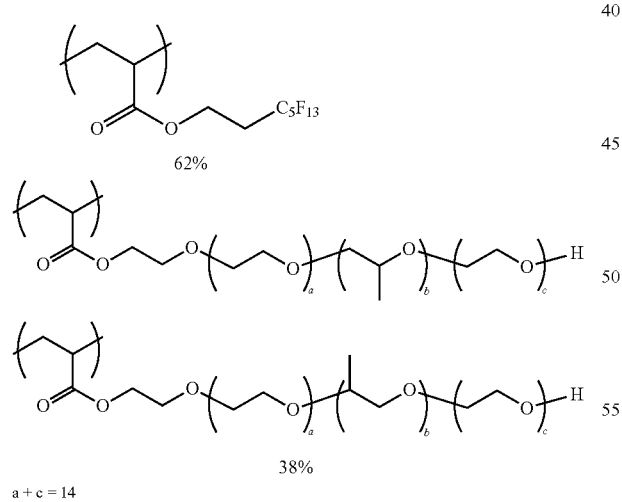

a + c = 14
b = 17

SQ1, SQ4, SQ9, SQ10, SQ13, SQ14, SQ16, SQ17, SQ20, SQ22, SQ25, SQ30, SQ33, SQ36, SQ40, SQ45, SQ47, SQ52, SQ53, SQ56, SQ57, SQ58, SQ73, SQ88, SQ102, SQ115, SQ125, SQ126, SQ127, SQ128, SQ129, SQ130: the compounds having the structures described above as the specific examples of the squarylium compound (1)

Compounds A to G: compounds having the following structures

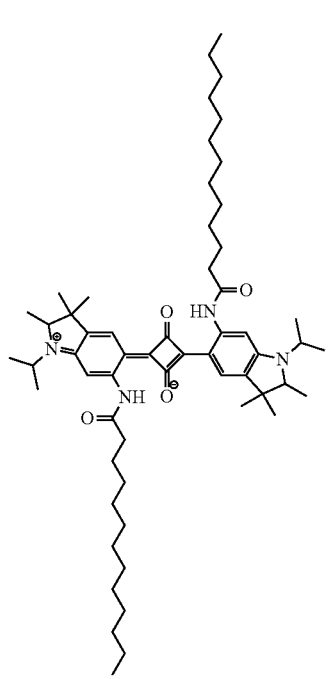

Compound A

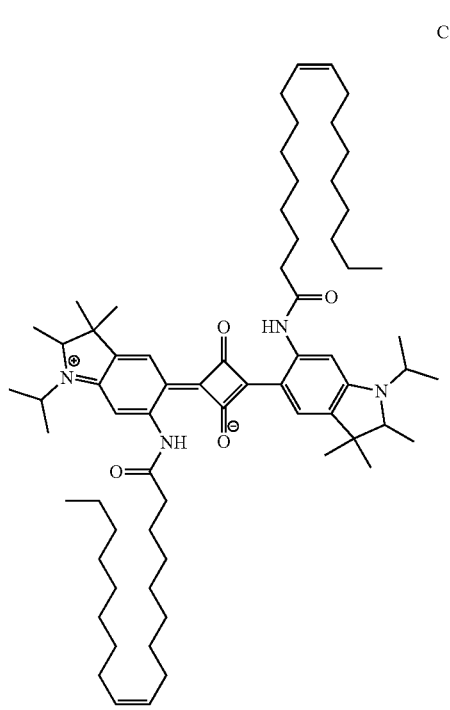

Compound B

Compound C
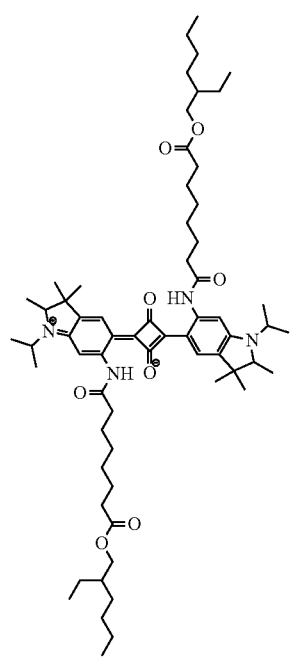
Compound E
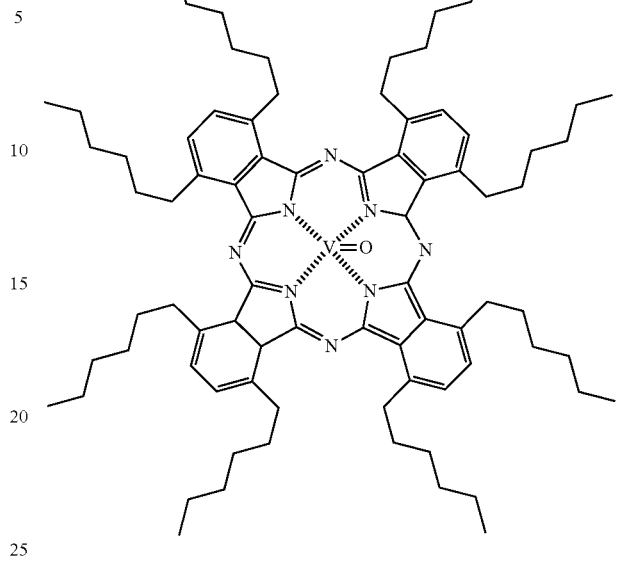
Compound F
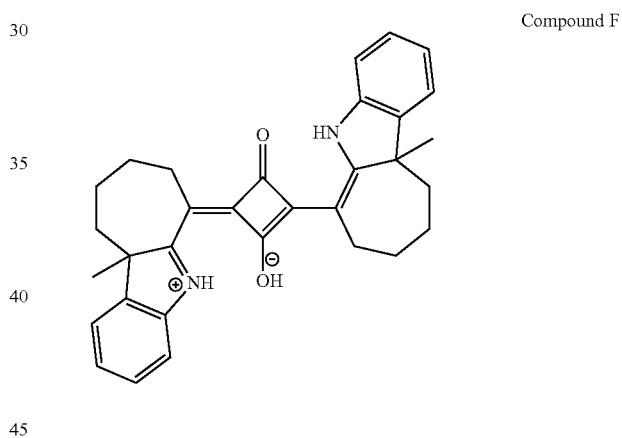
Compound D
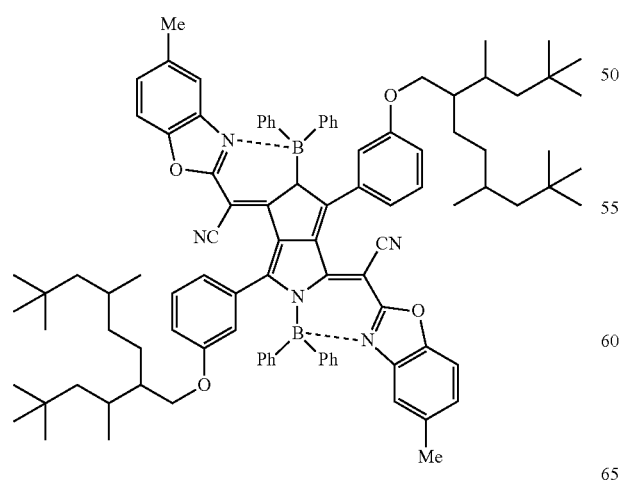
Compound G
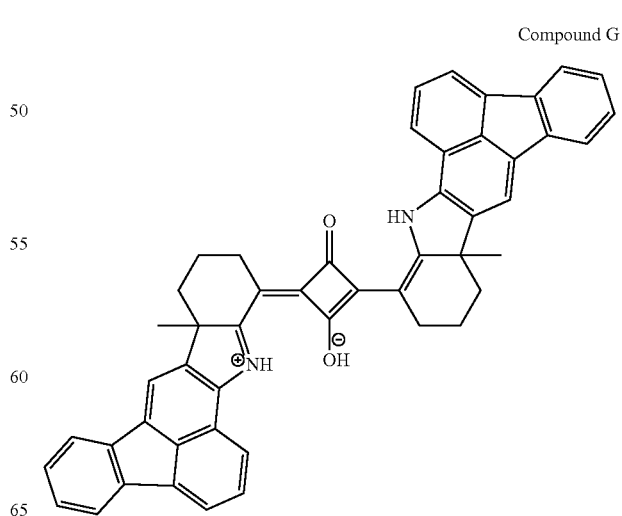

Comparative Compound A and Comparative Compound B: compounds having the following structures

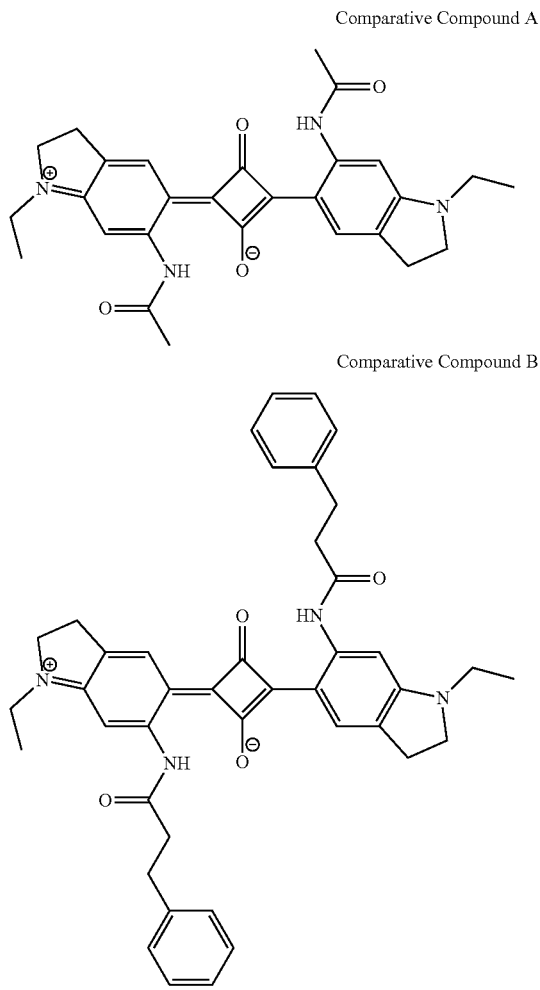 [SMILES: CCN1CCc2cc(C3=C([O-])/C(=c4/cc5c(cc4NC(C)=O)=[N+](CC)CC5)C3=O)c(NC(C)=O)cc21 ; CCN1CCc2cc(C3=C([O-])/C(=c4/cc5c(cc4NC(=O)CCc4ccccc4)=[N+](CC)CC5)C3=O)c(NC(=O)CCc3ccccc3)cc21]

Preparation of Film

Preparation Example 1

(Method of Preparing Film using Each of Resin compositions having Compositions 1, 2, and 7)

Each of the resin compositions was applied to a glass substrate (1737, manufactured by Corning Inc.) using a spin coater such that the thickness of a dried film was 1.0 µm, and was heated (pre-baked) using a hot plate at 100° C. for 120 seconds. Next, the coating film was further heated (post-baked) using a hot plate at 200° C. for 300 seconds to form a film.

Preparation Example 2

(Method of Preparing Film using Each of Resin compositions having Compositions 3, 4, 5, and 8)

Each of the resin compositions was applied to a glass substrate (1737, manufactured by Corning Inc.) using a spin coater such that the thickness of a dried film was 1.0 µm, and was heated (pre-baked) using a hot plate at 100° C. for 120 seconds.

Next, the entire surface of the coating film was exposed using an i-ray stepper exposure device FPA-3000 i5+ (manufactured by Canon Corporation) at 500 mJ/cm². Next, puddle development was performed at 23° C. for 60 seconds using a developer (CD-2060, manufactured by Fujifilm Electronic Materials Co., Ltd.). Next, the coating film was rinsed with pure water, and was spin-dried. Further, the coating film was further heated (post-baked) using a hot plate at 200° C. for 300 seconds to form a film.

Preparation Example 3

(Method of Preparing Film Using Resin Compositions Having Composition 6)

The resin compositions was applied to a glass substrate (1737, manufactured by Corning Inc.) using a spin coater such that the thickness of a dried film was 1.0 µm, and was heated (pre-baked) using a hot plate at 100° C. for 120 seconds. Next, the coating film was further heated (post-baked) using a hot plate at 180° C. for 300 seconds to form a film.

<Evaluation of Near Infrared Shielding Properties>

The average transmittance of each of the films in a wavelength range of 700 to 720 nm was measured using a spectrophotometer U-4100 (manufactured by Hitachi High-Technologies Corporation). The near infrared shielding properties were evaluated based on the following standards. The results are shown in the following table.

A: the average transmittance in a wavelength range of 700 nm to 720 nm≤5%

B: 5%<the average transmittance in a wavelength range of 700 nm to 720 nm≤10%

C: 10%<the average transmittance in a wavelength range of 700 nm to 720 nm

<Adhesiveness>

The prepared film was dipped in water at 50° C. for 10 minutes, and a cross cut adhesion test for 100 squares (10 mm×10 mm) was performed using a tape having an adhesive force of 3.9 N/cm. Among the 100 squares, the number of squares where peeling occurred was counted to evaluate adhesiveness. The results are shown in the following table. The evaluation standards of adhesiveness are as follows.

A: 0 (no peeling)
B: 1 to 10
C: 11 to 30
D: 31 or more

<Light Fastness>

The obtained film was irradiated with light at 20000 lux using a Xe lamp through an ultraviolet cut filter for 20 hours, and a light fastness test was performed. A ΔEab value of a color difference before and after a light fastness test was measured using a colorimeter MCPD-1000 (manufactured by Otsuka Electronics Co., Ltd.).

<<Determination Standards>>

A: ΔEab Value<2.5
B: 2.5≤ΔEab Value<5
C: 5≤ΔEab value<10
D: 10≤ΔEab value

TABLE 1

| | Composition | Compound | Near Infrared Shielding Properties | Adhesiveness | Light Fastness |
|---|---|---|---|---|---|
| Example 1 | Composition 1 | SQ1 | A | A | B |
| Example 2 | Composition 2 | SQ4 | A | A | B |
| Example 3 | Composition 3 | SQ4 | A | A | B |
| Example 4 | Composition 4 | SQ4 | A | A | B |

TABLE 1-continued

| | Composition | Compound | Near Infrared Shielding Properties | Adhesiveness | Light Fastness |
|---|---|---|---|---|---|
| Example 5 | Composition 3 | SQ4 | A | A | B |
| Example 6 | Composition 1 | SQ40 | A | A | C |
| Example 7 | Composition 1 | SQ9 | A | A | B |
| Example 8 | Composition 1 | SQ10 | A | A | C |
| Example 9 | Composition 1 | SQ13 | A | A | B |
| Example 10 | Composition 1 | SQ14 | A | A | B |
| Example 11 | Composition 1 | SQ16 | A | B | C |
| Example 12 | Composition 1 | SQ17 | A | B | A |
| Example 13 | Composition 2 | SQ20 | A | B | A |
| Example 14 | Composition 5 | SQ20 | A | B | A |
| Example 15 | Composition 6 | SQ20 | A | B | A |
| Example 16 | Composition 1 | SQ25 | A | B | A |
| Example 17 | Composition 3 | SQ45 | A | B | B |
| Example 18 | Composition 1 | SQ30 | A | B | A |
| Example 19 | Composition 1 | SQ22 | A | B | B |
| Example 20 | Composition 1 | SQ33 | A | C | A |
| Example 21 | Composition 1 | SQ36 | A | B | B |
| Example 22 | Composition 1 | SQ47 | A | B | A |
| Example 23 | Composition 1 | SQ52 | A | B | A |
| Example 24 | Composition 1 | SQ53 | A | B | A |
| Example 25 | Composition 1 | SQ56 | A | B | B |
| Example 26 | Composition 1 | SQ57 | A | B | A |
| Example 27 | Composition 1 | SQ58 | A | A | B |
| Example 28 | Composition 1 | SQ73 | B | A | C |
| Example 29 | Composition 1 | SQ88 | B | A | C |
| Example 30 | Composition 1 | SQ102 | A | A | B |
| Example 31 | Composition 1 | SQ115 | A | B | A |
| Example 32 | Composition 1 | SQ125 | A | A | B |
| Example 33 | Composition 1 | SQ126 | A | A | A |
| Example 34 | Composition 1 | SQ127 | A | A | B |
| Example 35 | Composition 1 | SQ128 | A | B | A |
| Example 36 | Composition 1 | SQ129 | A | B | B |
| Example 37 | Composition 1 | SQ130 | A | B | B |
| Example 38 | Composition 7 | SQ4, SQ25 | A | A | A |
| Example 39 | Composition 7 | SQ1, SQ4 | A | A | B |
| Example 40 | Composition 7 | SQ17, SQ25 | A | B | A |
| Example 41 | Composition 7 | SQ1, Compound A | A | A | B |
| Example 42 | Composition 7 | SQ30, Compound B | A | B | A |
| Example 43 | Composition 7 | SQ13, Compound C | A | A | B |
| Example 44 | Composition 8 | SQ20, Compound D | A | B | A |
| Example 45 | Composition 8 | SQ1, Compound E | A | B | B |
| Example 46 | Composition 7 | SQ4, Compound F | A | A | B |
| Example 47 | Composition 7 | SQ58, Compound G | B | A | B |
| Comparative Example 1 | Composition 1 | Comparative Compound A | A | D | D |
| Comparative Example 2 | Composition 3 | Comparative Compound B | A | D | D |

As shown in the table, in Examples, a film having excellent near infrared shielding properties, light fastness, and adhesiveness was able to be formed. In addition, in Examples 38 to 40 in which two squarylium compounds (1) were used in combination, crystal precipitation or the like did not occur even after a long-term storage of the resin composition, and the storage stability was particularly excellent. In addition, in Example 38 in which SQ4 as the squarylium compound (1) having the group represented by Formula (Y-1) and SQ25 as the squarylium compound (1) having the group represented by Formula (Y-2) were used in combination, adhesiveness and light fastness were particularly excellent.

On the other hand, in Comparative Examples, light fastness and adhesiveness were lower than those of Examples.

EXPLANATION OF REFERENCES

110: solid image pickup element
111: near infrared cut filter
112: color filter
114: infrared transmitting filter
115: microlens
116: planarizing layer

What is claimed is:
1. A resin composition comprising:
a compound represented by Formula (1); and
a resin,

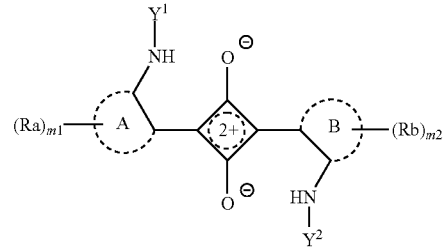

(1)

in Formula (1), A and B each independently represent an aromatic hydrocarbon ring or an aromatic heterocycle,
Ra and Rb each independently represent a substituent, m1 represents an integer of 0 to mA, mA represents an integer representing a maximum number of Ra's which may be substituted in A, m2 represents an integer of 0 to mB, and mB represents an integer representing a maximum number of Rb's which may be substituted in B,
Ra and A are bonded to each other to form a ring, or Rb and B are bonded to each other to form a ring, in a case where m1 represents 2 or more, two Ra's among m1 Ra's may be bonded to each other to form a ring, and in a case where m2 represents 2 or more, two Rb's among m2 Rb's may be bonded to each other to form a ring,
$Y^1$ and $Y^2$ each independently represent an alkyl group, an aryl group, a group represented by Formula (Y-1), or a group represented by Formula (Y-2), and at least one of $Y^1$ or $Y^2$ represents a group represented by Formula (Y-1) or a group represented by Formula (Y-2),

  Formula (Y-1), in Formula (Y-1), $X^1$ represents —CO—, —CS—, —SO$_2$—, —CONH—, —CSNH—, or —COO—,
$L^1$ represents an alkylene group or an arylene group,
$Z^1$ represents —CONR$^{Z1}$—, —CSNR$^{Z1}$—, —OCONR$^{Z1}$—, —NR$^{Z1}$CONR$^{Z2}$—, —NR$^{Z1}$CSNR$^{Z2}$—, —OCOO—, or, —NR$^{Z1}$SO$_2$—,
$R^{Z1}$ and $R^{Z2}$ each independently represent a hydrogen atom, an alkyl group, or an aryl group,
$R^1$ represents an alkyl group or an aryl group,

  Formula (Y-2), in Formula (Y-2), $X^{11}$ represents —CO—, —CS—, —SO$_2$—, —CONH—, —CSNH—, or —COO—,
$L^{11}$ represents a single bond, an alkylene group, or an arylene group,
$X^{12}$ represents a single bond, —CONR$^{X1}$—, —CSNR$^{X1}$—, —OCONR$^{X1}$—, —NR$^{X1}$CONR$^{X2}$—, —NR$^{X1}$CSNR$^{X2}$—, —OCOO—, —O—, —CO—, —COO—, —SO$_2$—, or —SO—, R$^{X1}$ and R$^{X2}$ each independently represent a hydrogen atom, an alkyl group, or an aryl group, L$^{12}$ represents a single bond, an alkylene group, or an arylene group, Z$^{11}$ represents a group represented by any one of Formulae (Z-1) to (Z-6), and in a case where Z$^{11}$ represents a group represented by Formula (Z-1) or a group represented by Formula (Z-4), L$^{11}$ represents an alkylene group or an arylene group,

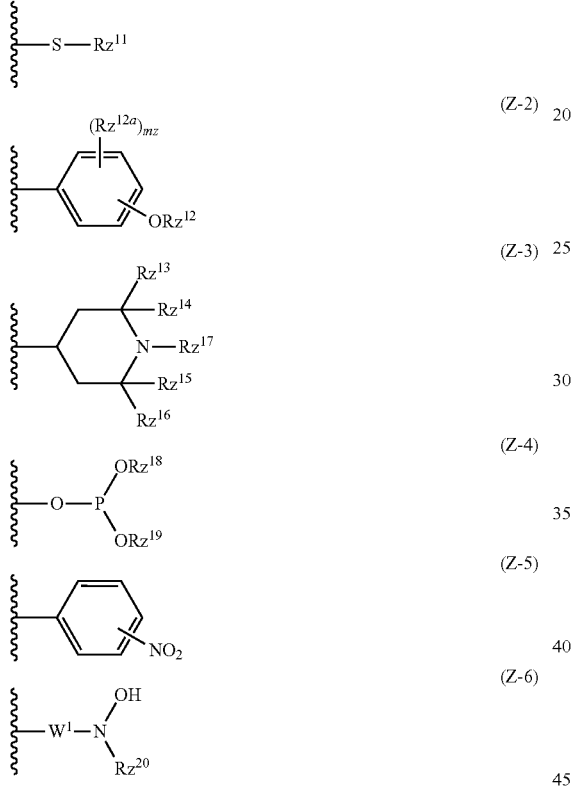

(Z-1)
(Z-2)
(Z-3)
(Z-4)
(Z-5)
(Z-6)

in Formulae (Z-1) to (Z-6), a wave line represents a binding site in Formula (Y-2), in Formula (Z-1), Rz$^{11}$ represents an alkyl group or an aryl group, in Formula (Z-2), Rz$^{12}$ represents a hydrogen atom, —COR$^{100}$ or —COOR$^{100}$, R$^{100}$ represents a hydrogen atom, an alkyl group, or an aryl group, Rz$^{12a}$ represents an alkyl group, and mz represents an integer of 0 to 4, in Formula (Z-3), Rz$^{13}$ to Rz$^{16}$ each independently represent an alkyl group and Rz$^{17}$ represents a hydrogen atom, an alkyl group, or an oxygen radical, in Formula (Z-4), Rz$^{18}$ and Rz$^{19}$ each independently represent an alkyl group or an aryl group, and in Formula (Z-6), W$^1$ represents a single bond or —CO—, Rz$^{20}$ represents a hydrogen atom, an alkyl group, an aryl group, or —COR$^{101}$, and R$^{101}$ represents an alkyl group or an aryl group.

2. The resin composition according to claim 1, wherein in Formula (1), at least one of A or B represents a benzene ring, a thiophene ring, a furan ring, a pyrrole ring, a pyridine ring, an azulene ring, or a fused ring including a benzene ring, a thiophene ring, a furan ring, a pyrrole ring, a pyridine ring, or an azulene ring.

3. The resin composition according to claim 1, wherein in Formula (1), at least one of A or B represents a benzene ring or a naphthalene ring.

4. The resin composition according to claim 1, wherein the compound represented by Formula (1) has a structure represented by the following Formula (2-1) or Formula (2-2),

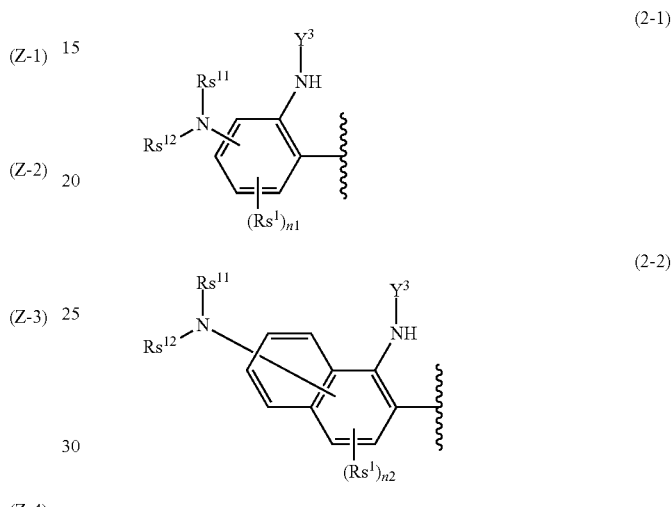

(2-1)
(2-2)

in Formula (2-1) and Formula (2-2), a wave line represents a binding site to a squaric acid site in Formula (1), Y$^3$ represents the group represented by Formula (Y-1) or the group represented by Formula (Y-2), Rs$^1$ represents a substituent, n1 represents an integer of 1 to 3 and n2 represents an integer of 1 to 5, Rs$^{11}$ and Rs$^{12}$ each independently represent an alkyl group, an aryl group, or a heteroaryl group, Rs$^{11}$ and Rs$^{12}$ may be bonded to each other to form a ring, and Rs$^{11}$ and Rs$^1$, or Rs$^{12}$ and Rs$^1$ are bonded to each other to form a ring.

5. The resin composition according to claim 1, wherein the compound represented by Formula (1) has a structure represented by the following (2-1c) or Formula (2-1d),

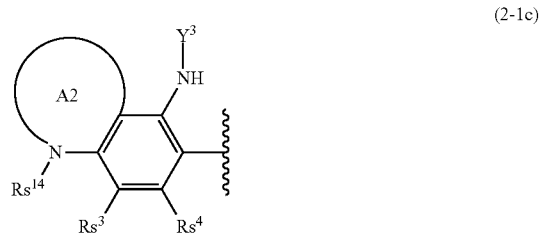

(2-1c)

-continued

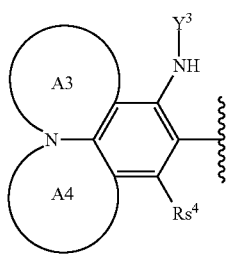
(2-1d)

in Formula (2-1c) and Formula (2-1d), a wave line represents a binding site to a squaric acid site in Formula (1), $Y^3$ represents the group represented by Formula (Y-1) or the group represented by Formula (Y-2), $Rs^3$ and $Rs^4$ each independently represent a hydrogen atom or a substituent, $Rs^{14}$ represents an alkyl group, an aryl group, or a heteroaryl group, and A2 to A4 each independently represent a ring including a nitrogen atom.

6. The resin composition according to claim 1, wherein the compound represented by Formula (1) is a compound represented by the following Formula (1a),

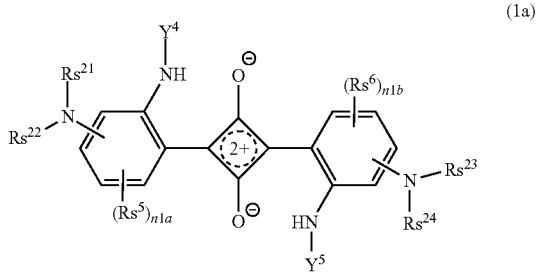
(1a)

in Formula (1a), $Y^4$ and $Y^5$ each independently represent an alkyl group, an aryl group, the group represented by Formula (Y-1), or the group represented by Formula (Y-2), and at least one of $Y^4$ or $Y^5$ represents the group represented by Formula (Y-1) or the group represented by Formula (Y-2), $Rs^5$ and $Rs^6$ each independently represent a substituent, n1a and n1b each independently represent an integer of 1 to 3, $Rs^{21}$ to $Rs^{24}$ each independently represent an alkyl group, an aryl group, or a heteroaryl group, $Rs^{21}$ and $Rs^{22}$, or $Rs^{23}$ and $Rs^{24}$ may be bonded to each other to form a ring, and at least one of $Rs^{21}$ and $Rs^5$, $Rs^{22}$ and $Rs^5$, $Rs^{23}$ and $Rs^6$, or $Rs^{24}$ and $Rs^6$ are bonded to each other to form a ring.

7. The resin composition according to claim 1, further comprising:
a crosslinking compound.

8. The resin composition according to claim 7, further comprising:
a photopolymerization initiator,
wherein the crosslinking compound is a polymerizable compound.

9. The resin composition according to claim 1, wherein the resin includes a resin having an acid group.

10. The resin composition according to claim 1, further comprising:
a near infrared absorbing colorant other than the compound represented by Formula (1).

11. A film which is formed of the resin composition according to claim 1.

12. A near infrared cut filter comprising:
the film according to claim 11.

13. A camera module comprising:
a solid image pickup element; and
the near infrared cut filter according to claim 12.

14. An infrared transmitting filter comprising:
the film according to claim 11.

15. A solid image pickup element comprising:
the film according to claim 11.

16. An image display device comprising:
the film according to claim 11.

17. An infrared sensor comprising:
the film according to claim 11.

18. A resin composition comprising:
a compound represented by Formula (1); and
a resin,

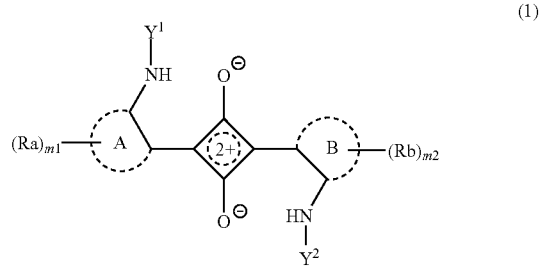
(1)

in Formula (1), A and B each independently represent an aromatic hydrocarbon ring or an aromatic heterocycle, Ra and Rb each independently represent a substituent, m1 represents an integer of 0 to mA, mA represents an integer representing a maximum number of Ra's which may be substituted in A, m2 represents an integer of 0 to mB, and mB represents an integer representing a maximum number of Rb's which may be substituted in B, Ra and A may be bonded to each other to form a ring, Rb and B may be bonded to each other to form a ring, in a case where m1 represents 2 or more, two Ra's among m1 Ra's may be bonded to each other to form a ring, and in a case where m2 represents 2 or more, two Rb's among m2 Rb's may be bonded to each other to form a ring, $Y^1$ and $Y^2$ each independently represent an alkyl group, an aryl group, a group represented by Formula (Y-1), or a group represented by Formula (Y-2), and at least one of $Y^1$ or $Y^2$ represents a group represented by Formula (Y-1) or a group represented by Formula (Y-2), —$X^1$-$L^1$-$Z^1$—$R^1$    Formula (Y-1), in Formula (Y-1), $X^1$ represents —CO—, —CS—, —SO$_2$—, —CONH—, —CSNH—, or —COO—, $L^1$ represents an alkylene group or an arylene group, $Z^1$ represents —CONR$^{Z1}$—, —CSNR$^{Z1}$—, —OCONR$^{Z1}$—, —NR$^{Z1}$CONR$^{Z2}$—, —NR$^{Z1}$CSNR$^{Z2}$—, —OCOO—, or, —NR$^{Z1}$SO$_2$—, $R^{Z1}$ and $R^{Z2}$ each independently represent a hydrogen atom, an alkyl group, or an aryl group, $R^1$ represents an alkyl group or an aryl group, —$X^{11}$-$L^{11}$-$X^{12}$-$L^{12}$-$Z^{11}$          Formula (Y-2), in Formula (Y-2), $X^{11}$ represents —CO—, —CS—, —$SO_2$—, —CONH—, —CSNH—, or —COO—, $L^{11}$ represents a single bond, an alkylene group, or an arylene group, $X^{12}$ represents a single bond, —$CONR^{X1}$—, —$CSNR^{X1}$—, —$OCONR^{X1}$—, —$NR^{X1}CONR^{X2}$—, —$NR^{X1}CSNR^{X2}$—, —OCOO—, —O—, —CO—, —COO—, —$SO_2$—, or —SO—, $R^{X1}$ and $R^{X2}$ each independently represent a hydrogen atom, an alkyl group, or an aryl group, $L^{12}$ represents a single bond, an alkylene group, or an arylene group, $Z^{11}$ represents a group represented by any one of Formulae (Z-1) to (Z-6), and in a case where $Z^{11}$ represents a group represented by Formula (Z-1) or a group represented by Formula (Z-4), $L^{11}$ represents an alkylene group or an arylene group,

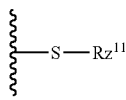          (Z-1)

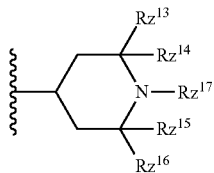          (Z-3)

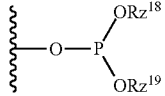          (Z-4)

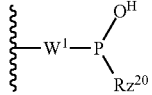          (Z-6)

in Formulae (Z-1), (Z-3), (Z-4), and (Z-6), a wave line represents a binding site in Formula (Y-2), in Formula (Z-1), $Rz^{11}$ represents an alkyl group or an aryl group, in Formula (Z-3), $Rz^{13}$ to $Rz^{16}$ each independently represent an alkyl group and $Rz^{17}$ represents a hydrogen atom, an alkyl group, or an oxygen radical, in Formula (Z-4), $Rz^{18}$ and $Rz^{19}$ each independently represent an alkyl group or an aryl group, and in Formula (Z-6), $W^1$ represents a single bond or —CO—, $Rz^{20}$ represents a hydrogen atom, an alkyl group, an aryl group, or —$COR^{101}$, and $R^{101}$ represents an alkyl group or an aryl group.

19. A resin composition comprising:

a compound represented by Formula (1);

a resin, and a crosslinking compound,

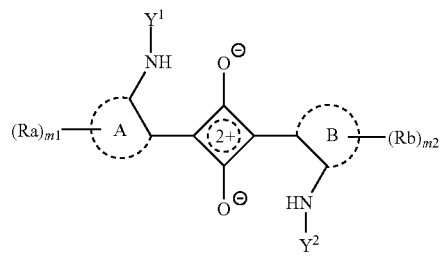          (1)

in Formula (1), A and B each independently represent an aromatic hydrocarbon ring or an aromatic heterocycle, Ra and Rb each independently represent a substituent, m1 represents an integer of 0 to mA, mA represents an integer representing a maximum number of Ra's which may be substituted in A, m2 represents an integer of 0 to mB, and mB represents an integer representing a maximum number of Rb's which may be substituted in B, Ra and A may be bonded to each other to form a ring, Rb and B may be bonded to each other to form a ring, in a case where m1 represents 2 or more, two Ra's among m1 Ra's may be bonded to each other to form a ring, and in a case where m2 represents 2 or more, two Rb's among m2 Rb's may be bonded to each other to form a ring, $Y^1$ and $Y^2$ each independently represent an alkyl group, an aryl group, a group represented by Formula (Y-1), or a group represented by Formula (Y-2), and at least one of $Y^1$ or $Y^2$ represents a group represented by Formula (Y-1) or a group represented by Formula (Y-2), —$X^1$-$L^1$-$Z^1$—$R^1$          Formula (Y-1), in Formula (Y-1), $X^1$ represents —CO—, —CS—, —$SO_2$—, —CONH—, —CSNH—, or —COO—, $L^1$ represents an alkylene group or an arylene group, $Z^1$ represents —$CONR^{Z1}$—, —$CSNR^{Z1}$—, —$OCONR^{Z1}$—, —$NR^{Z1}CONR^{Z2}$—, —$NR^{Z1}CSNR^{Z2}$—, —OCOO—, or, —$NR^{Z1}SO_2$—, $R^{Z1}$ and $R^{Z2}$ each independently represent a hydrogen atom, an alkyl group, or an aryl group, $R^1$ represents an alkyl group or an aryl group, —$X^{11}$-$L^{11}$-$X^{12}$-$L^{12}$-$Z^{11}$          Formula (Y-2), in Formula (Y-2), $X^{11}$ represents —CO—, —CS—, —$SO_2$—, —CONH—, —CSNH—, or —COO—, $L^{11}$ represents a single bond, an alkylene group, or an arylene group, $X^{12}$ represents a single bond, —$CONR^{X1}$—, —$CSNR^{X1}$—, —$OCONR^{X1}$—, —$NR^{X1}CONR^{X2}$—, —$NR^{X1}CSNR^{X2}$—, —OCOO—, —O—, —CO—, —COO—, —$SO_2$—, or —SO—, $R^{X1}$ and $R^{X2}$ each independently represent a hydrogen atom, an alkyl group, or an aryl group, $L^{12}$ represents a single bond, an alkylene group, or an arylene group, $Z^{11}$ represents a group represented by any one of Formulae (Z-1) to (Z-6), and in a case where $Z^{11}$ represents a group represented by Formula (Z-1) or a group represented by Formula (Z-4), $L^{11}$ represents an alkylene group or an arylene group,

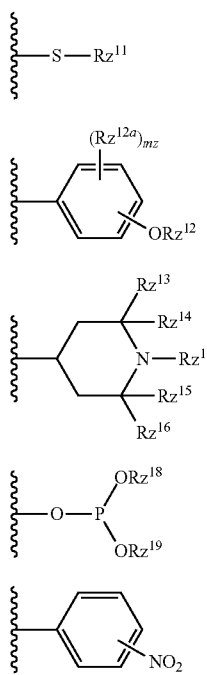

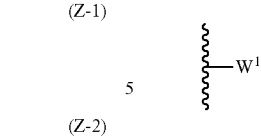

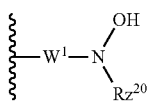

in Formulae (Z-1) to (Z-6), a wave line represents a binding site in Formula (Y-2), in Formula (Z-1), $Rz^{11}$ represents an alkyl group or an aryl group, in Formula (Z-2), $Rz^{12}$ represents a hydrogen atom, —$COR^{100}$ or —$COOR^{100}$, $R^{100}$ represents a hydrogen atom, an alkyl group, or an aryl group, $Rz^{12a}$ represents an alkyl group, and mz represents an integer of 0 to 4, in Formula (Z-3), $Rz^{13}$ to $Rz^{16}$ each independently represent an alkyl group and $Rz^{17}$ represents a hydrogen atom, an alkyl group, or an oxygen radical, in Formula (Z-4), $Rz^{18}$ and $Rz^{19}$ each independently represent an alkyl group or an aryl group, and in Formula (Z-6), $W^1$ represents a single bond or —CO—, $Rz^{20}$ represents a hydrogen atom, an alkyl group, an aryl group, or —$COR^{101}$, and $R^{101}$ represents an alkyl group or an aryl group.

\* \* \* \* \*